(12) United States Patent
Caveney et al.

(10) Patent No.: US 7,874,879 B2
(45) Date of Patent: Jan. 25, 2011

(54) METHODS AND APPARATUS FOR REDUCING CROSSTALK IN ELECTRICAL CONNECTORS

(75) Inventors: Jack E. Caveney, Hinsdale, IL (US); Masud Bolouri-Saransar, Orland Park, IL (US)

(73) Assignee: Panduit Corp., Tinley Park, IL (US)

( * ) Notice: Subject to any disclaimer, the term of this patent is extended or adjusted under 35 U.S.C. 154(b) by 0 days.

(21) Appl. No.: 12/272,127

(22) Filed: Nov. 17, 2008

(65) Prior Publication Data

US 2009/0075523 A1    Mar. 19, 2009

Related U.S. Application Data

(63) Continuation of application No. 11/623,578, filed on Jan. 16, 2007, now Pat. No. 7,452,246, which is a continuation of application No. 11/055,344, filed on Feb. 10, 2005, now Pat. No. 7,179,131.

(60) Provisional application No. 60/559,876, filed on Apr. 6, 2004, provisional application No. 60/558,019, filed on Mar. 31, 2004, provisional application No. 60/544,050, filed on Feb. 12, 2004.

(51) Int. Cl.
*H01R 24/00* (2006.01)
(52) U.S. Cl. .................... 439/676; 439/941
(58) Field of Classification Search .............. 439/676, 439/941, 188, 404; 307/89, 147
See application file for complete search history.

(56) References Cited

U.S. PATENT DOCUMENTS

| 6,346,010 | B1 * | 2/2002 | Emplit | 439/620.17 |
|---|---|---|---|---|
| 6,356,162 | B1 * | 3/2002 | DeFlandre et al. | 333/4 |
| 6,409,547 | B1 * | 6/2002 | Reede | 439/676 |
| 6,464,529 | B1 * | 10/2002 | Jensen et al. | 439/405 |
| 6,464,541 | B1 * | 10/2002 | Hashim et al. | 439/676 |
| 6,533,618 | B1 * | 3/2003 | Aekins | 439/676 |
| 6,729,899 | B2 * | 5/2004 | Aekins et al. | 439/404 |
| 7,052,328 | B2 * | 5/2006 | Ciezak et al. | 439/676 |
| 7,201,618 | B2 * | 4/2007 | Ellis et al. | 439/676 |
| 7,591,686 | B2 * | 9/2009 | Ellis et al. | 439/676 |

OTHER PUBLICATIONS

Kim et al, Reduction of Crosstalk Noise in Modular Jack for High Speed Differential Signal Interconnection, 2001, IEEE, 260-267.*

* cited by examiner

*Primary Examiner*—Michael C Zarroli
(74) *Attorney, Agent, or Firm*—Robert A. McCann; Zachary J. Smolinski; Christopher K. Marlow

(57) ABSTRACT

A communication jack having crosstalk compensation features for overall crosstalk interference reduction is disclosed. In one embodiment, the jack is configured to receive a plug to form a communication connection, and comprises jack contacts disposed in the jack, with each contact having at least a first surface and a second surface. Upon the plug being received by the jack, the plug contacts interface with the first surface of the jack contacts. The jack further includes a first capacitive coupling connected between two pairs of jack contacts to compensate for near end crosstalk, with the first capacitive coupling being connected to the pairs of jack contacts along the second surface adjacent to where the plug contacts interface with the jack contacts. A far end crosstalk compensation scheme is also set forth.

5 Claims, 55 Drawing Sheets

SECTION B-B

SECTION E-E

SECTION D-D

SECTION C-C

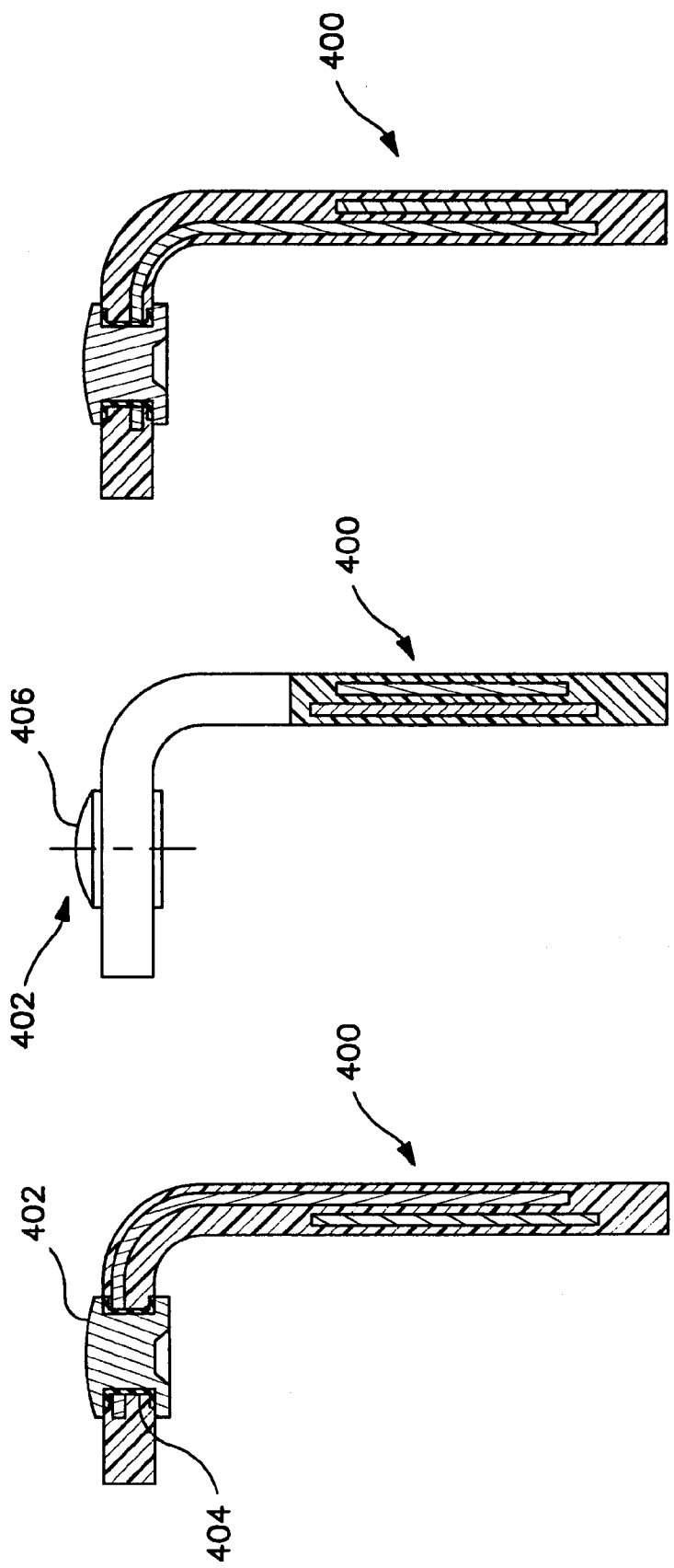

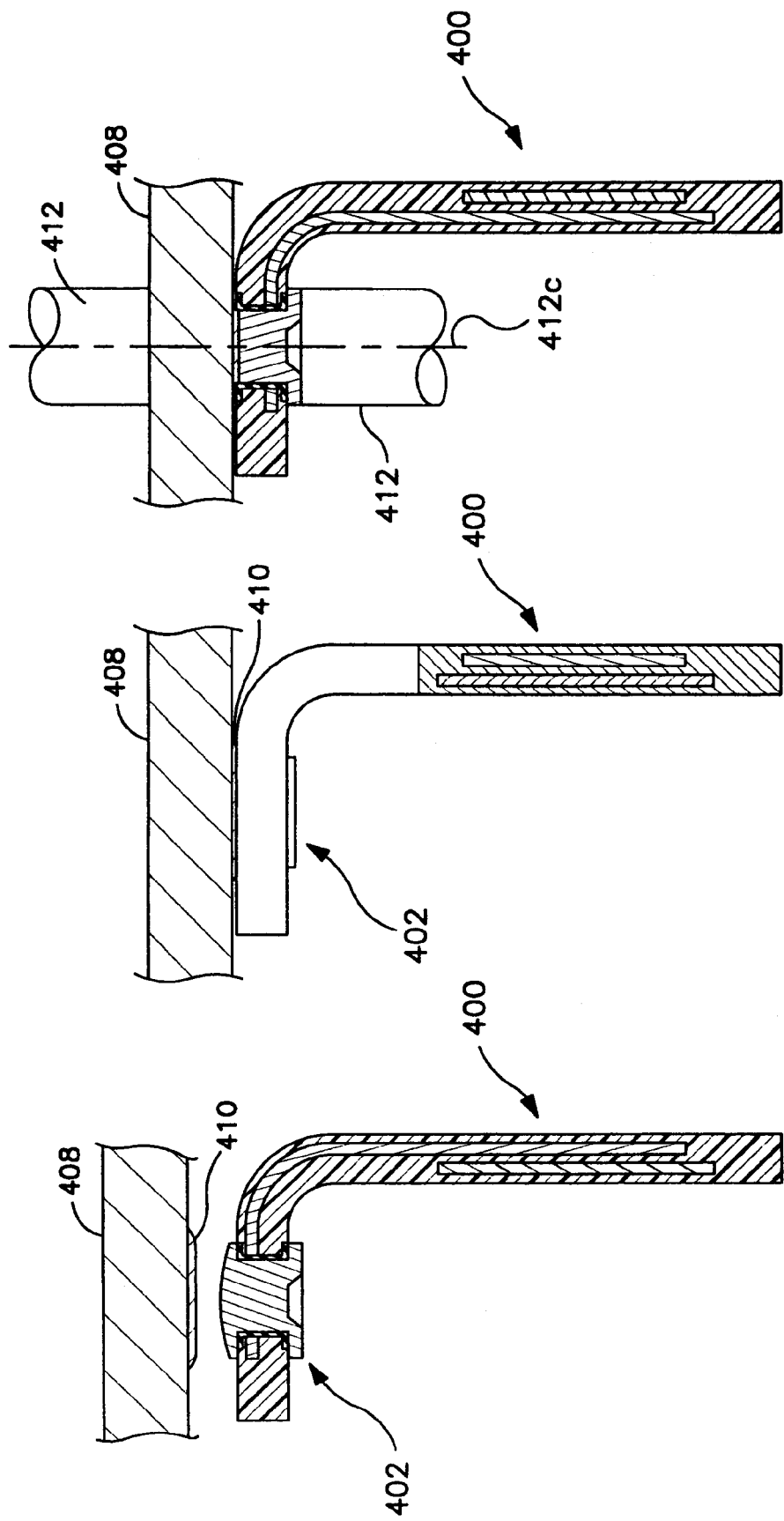

SECTION O-O

SECTION N-N

SECTION M-M

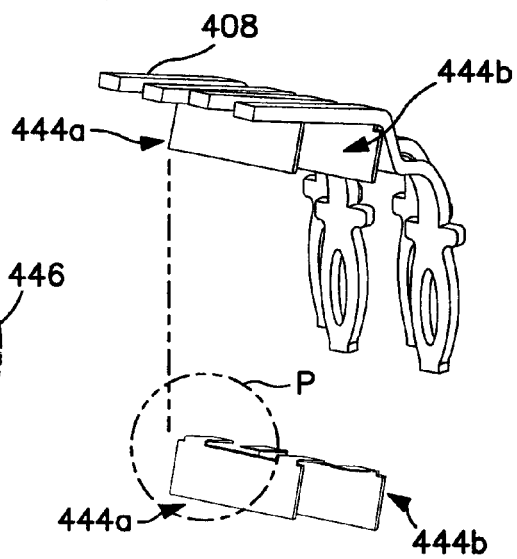
FIG. 53a
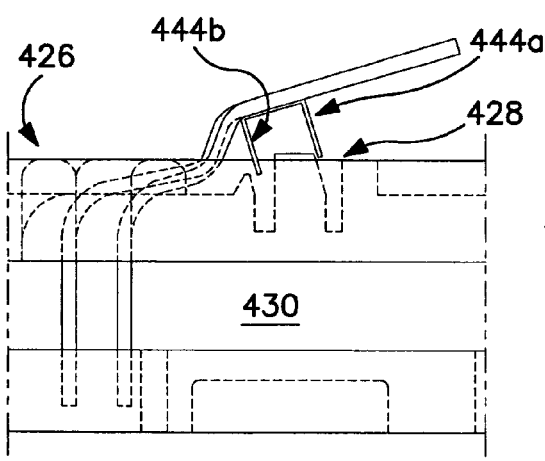
FIG. 54
FIG. 53b
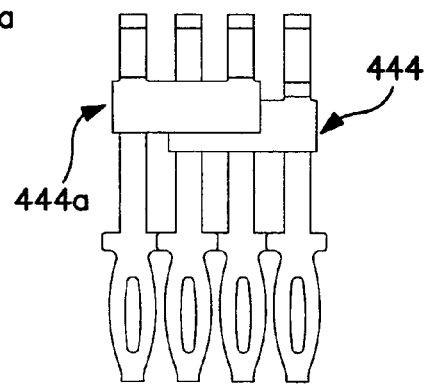
FIG. 55
FIG. 56

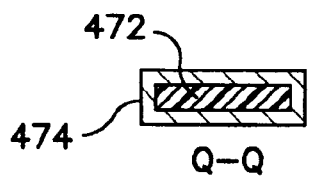
FIG. 62
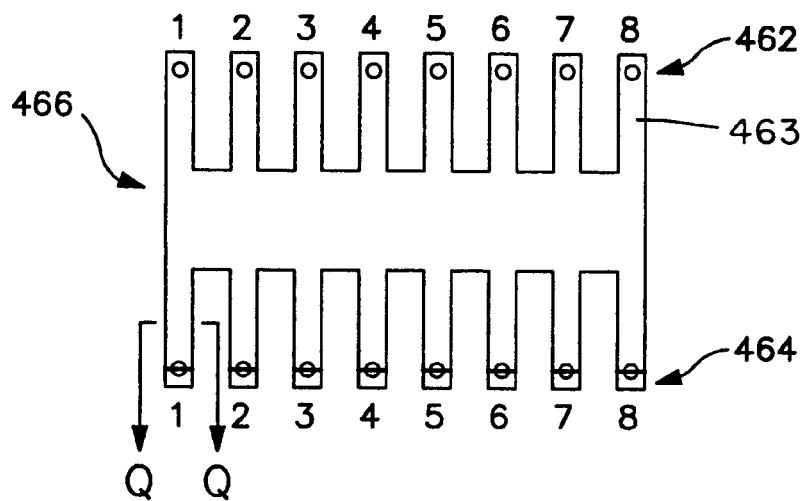 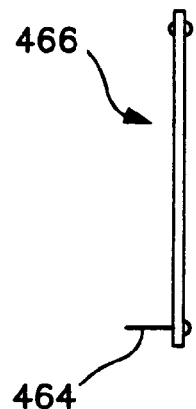
FIG. 59      FIG. 60
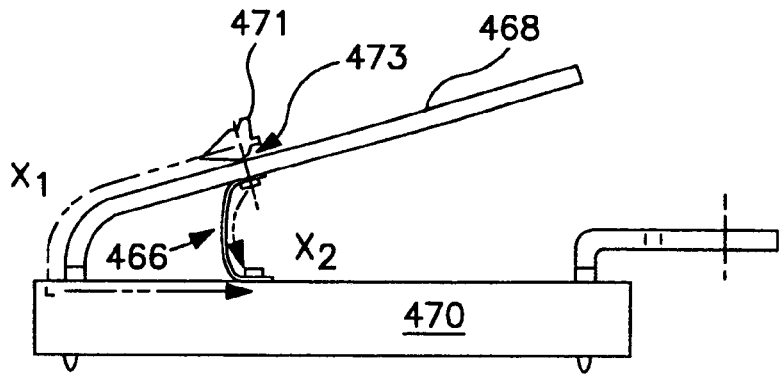
FIG. 61

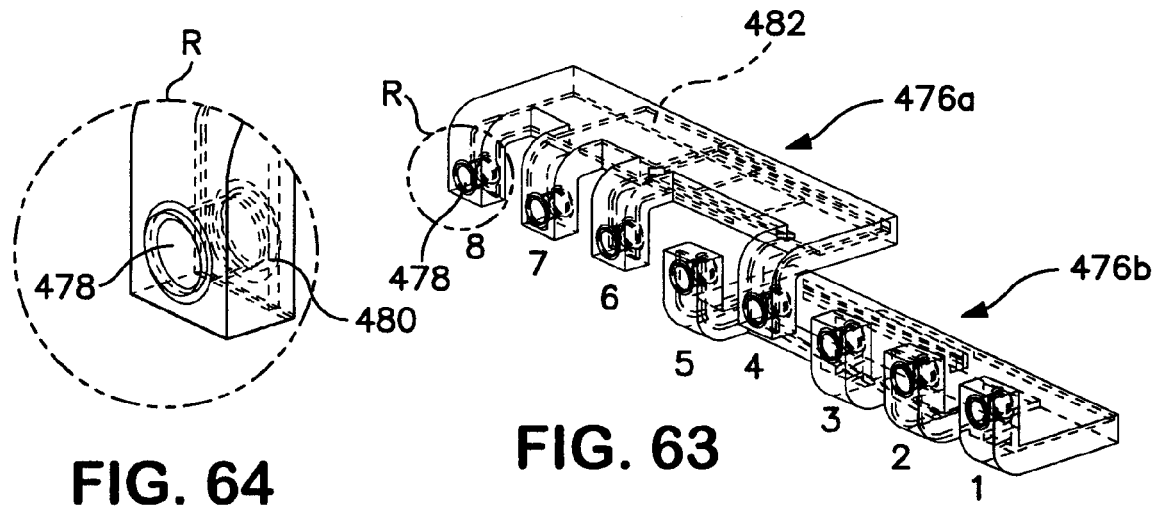
FIG. 64  FIG. 63
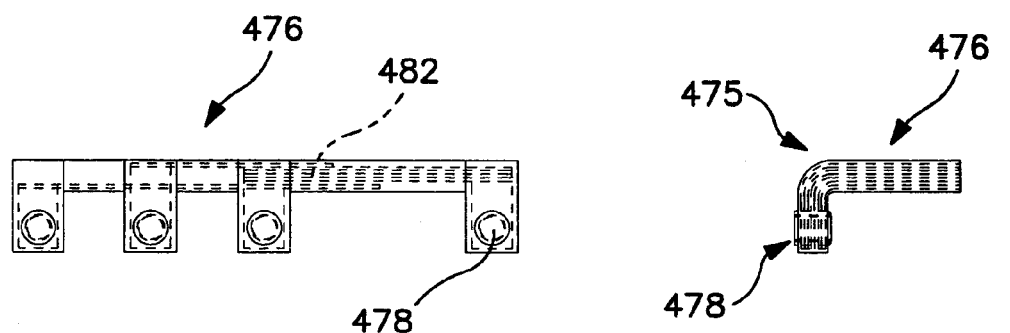
FIG. 65  FIG. 66

SECTION T-T

SECTION S-S

SECTION V-V

SECTION U-U

SECTION Y–Y

SECTION X–X

SECTION W–W

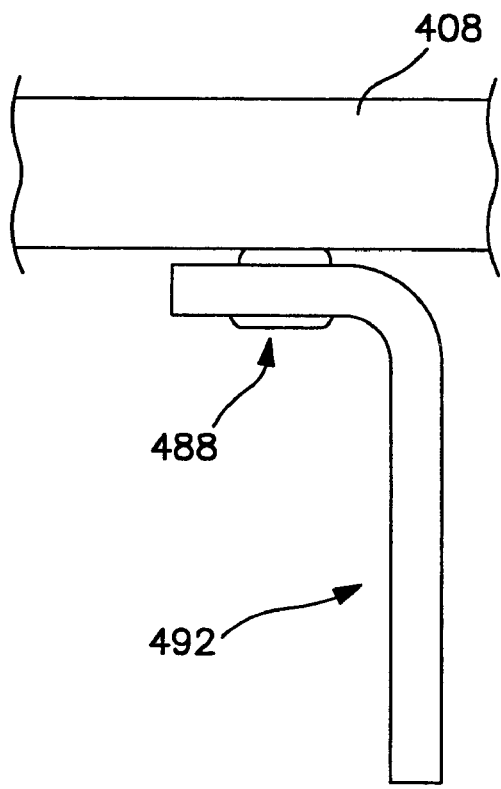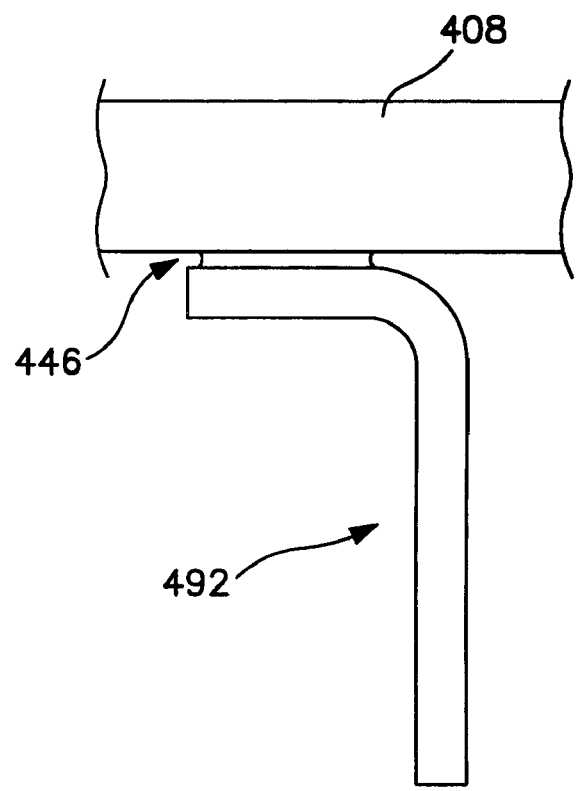
FIG. 94  FIG. 95

SECTION AA-AA

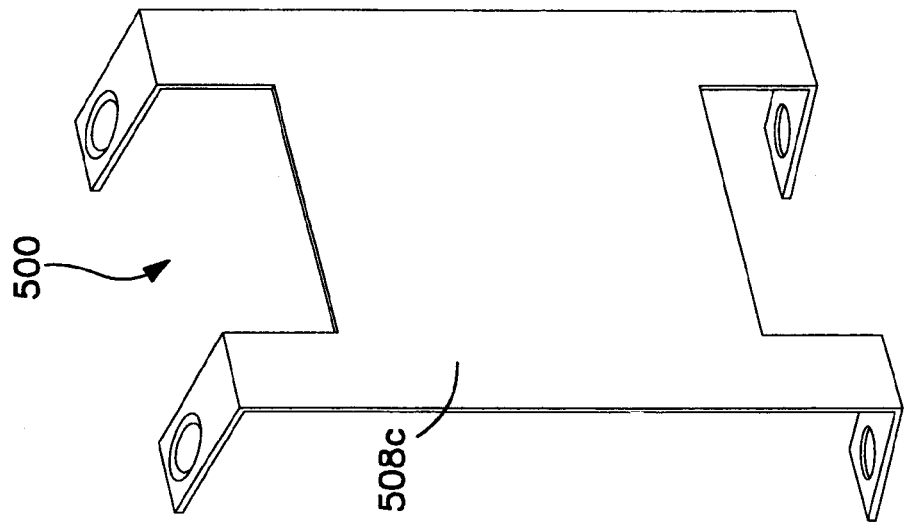
FIG. 109
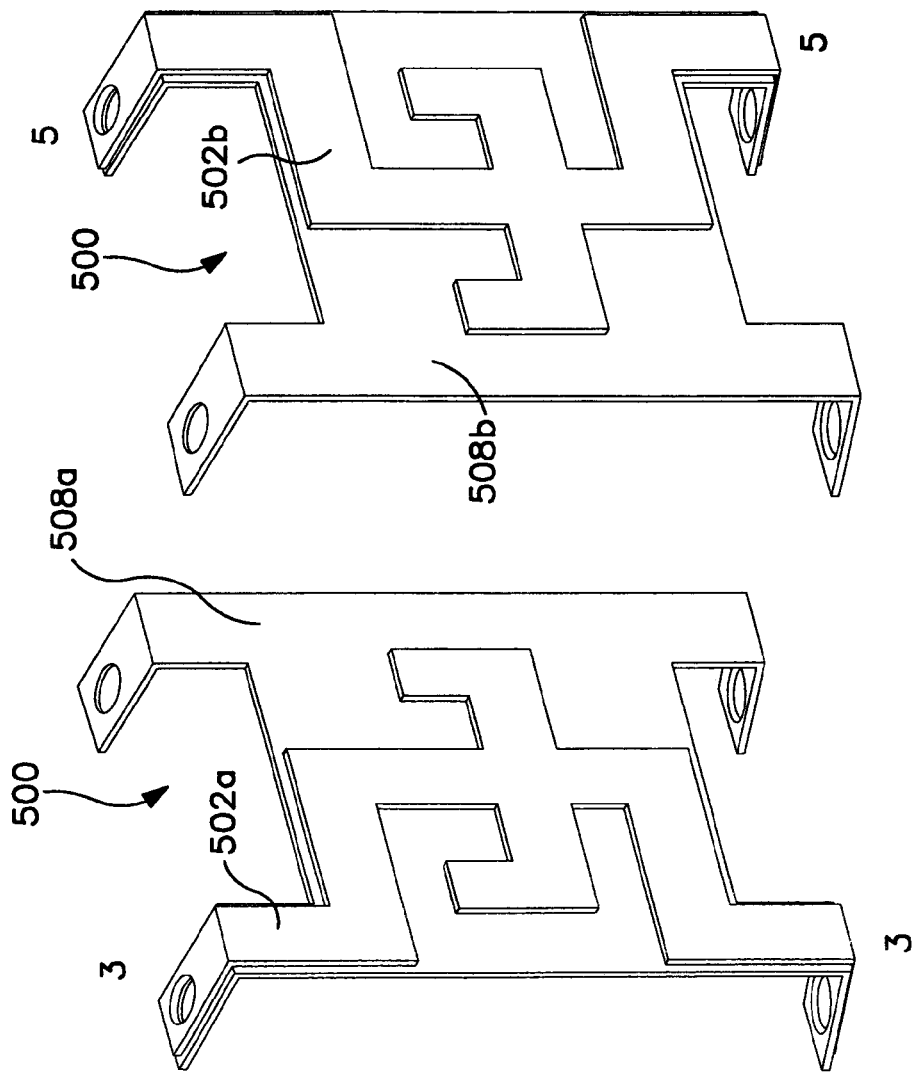
FIG. 108
FIG. 107

METHODS AND APPARATUS FOR REDUCING CROSSTALK IN ELECTRICAL CONNECTORS

CROSS-REFERENCE TO RELATED APPLICATIONS

This application is a continuation of U.S. patent application Ser. No. 11/623,578, filed Jan. 16, 2007, which is a continuation of U.S. patent application Ser. No. 11/055,344, filed Feb. 10, 2005, now U.S. Pat. No. 7,179,131, which claims priority to U.S. Provisional Application Ser. No. 60/544,050, filed on Feb. 12, 2004; U.S. Provisional Application Ser. No. 60/558,019, filed on Mar. 31, 2004; and U.S. Provisional Application Ser. No. 60/559,876, filed on Apr. 6, 2004; the entireties of which are hereby incorporated by reference. In addition, this application is related in subject matter to copending U.S. patent application Ser. No. 11/014,097, filed Dec. 15, 2004; and copending U.S. patent application Ser. No. 11/078,816, filed Mar. 11, 2005.

TECHNICAL FIELD

The present invention relates to electrical connectors, and more particularly, to modular communication connectors that utilize compensation techniques to reduce net crosstalk generated by the combination of a plug and a jack of a connector assembly.

BACKGROUND

Computer networks, including local area networks (LAN) and wide area networks (WAN), are becoming increasingly prevalent as the number of computers and network devices in the workplace grows. These computer networks utilize data communication cables and electrical connectors to transmit information between various components attached to the network. The electrical connectors are typically configured to include a plug that is connectable to a jack mounted in the wall, or integrated into a panel or other telecommunication equipment. The jack typically includes a housing that holds an array of closely spaced parallel contacts for contacting corresponding conductors of the plug. The contacts of a jack are often mounted onto a printed circuit board. An RJ45 plug and jack connector assembly is one well known standard connector assembly having closely spaced contacts.

Over the past several years, advances in computer networking technology have facilitated a corresponding increase in the rate at which data can be transmitted through a network. Conventional connectors have been used to transmit low-frequency data signals without any significant crosstalk problems. However, when such connectors are used to transmit high-frequency data signals, crosstalk generated within the connector increases dramatically. This crosstalk is primarily due to the capacitive and inductive couplings between the closely spaced parallel conductors within the jack and/or the plug.

A wide variety of improvements have been made in the design of electrical connectors to reduce crosstalk occurring within the connector. One example is disclosed in U.S. Pat. No. 6,305,950, which is commonly assigned to Panduit Corporation. This type of connector uses a particular conductor configuration in conjunction with a multi-layered printed circuit board containing capacitors to achieve a reduction in the crosstalk effect. However, due to the high level of crosstalk occurring in the plug for this connector at very high-frequency signal rates, the tuning effect achievable by the capacitors can still be difficult to accomplish. As such, further improvements in the design of connectors are still needed to address such problems and provide improved crosstalk performance.

BRIEF DESCRIPTION OF THE DRAWINGS

FIG. 30 is a sectional view taken along the line I-I of FIG. 29;

FIG. 31 is a sectional view taken along the line J-J of FIG. 29;

FIG. 32 is a sectional view taken along the line K-K of FIG. 29;

FIGS. 33-35 are sectional views of a flexible capacitor showing a solder rivet being attached to a jack contact;

FIG. 53a is a perspective view showing jack contact capacitors of one embodiment of the present invention mounted to jack contacts;

FIG. 53b is a perspective view showing jack contact capacitors according to one embodiment of the present invention;

FIG. 54 is a detail view of the detail "P" of FIG. 53b;

FIG. 55 is a side cutaway view showing jack contact capacitors attached to jack contacts mounted to a sled;

FIG. 56 is a rear view of a jack-and-capacitor assembly according to the embodiment of FIG. 53a;

FIG. 59 is a plan view of a flexible shunt according to one embodiment of the present invention;

FIG. 60 is a side view of the flexible shunt of FIG. 59;

FIG. 61 is a side view of a flexible shunt mounted between jack contacts and a printed circuit board;

FIG. 62 is a sectional view taken along the line Q-Q of FIG. 59;

FIG. 63 is a perspective view of flexible circuit capacitors according to one embodiment of the present invention;

FIG. 64 is a detail view of the detail "R" of FIG. 63;

FIG. 65 is a top view of a flexible circuit capacitor of FIG. 63;

FIG. 66 is a side view of a flexible circuit capacitor of FIG. 63;

FIG. 94 is a side view of the flexible circuit capacitor of FIG. 89 showing a rivet attached to a jack contact;

FIG. 95 is a side view of the flexible circuit capacitor of FIG. 89 showing an adhesive area bonded to a jack contact;

FIGS. 107-109 are perspective views showing successive layers of the flexible printed circuit of FIG. 105;

DETAILED DESCRIPTION OF THE PREFERRED EMBODIMENTS

Before explaining the present embodiments in detail, it should be understood that the invention is not limited in its application or use to the details of construction and arrangement of parts illustrated in the accompanying drawings and description. It will be recognized that the illustrative embodiments of the invention may be implemented or incorporated in other embodiments, variations and modifications, and may be practiced or carried out in various ways. Furthermore, unless otherwise indicated, the terms and expressions employed herein have been chosen for the purpose of describing the illustrative embodiments of the present invention for the convenience of the reader and are not for the purpose of limitation.

Figure 1:
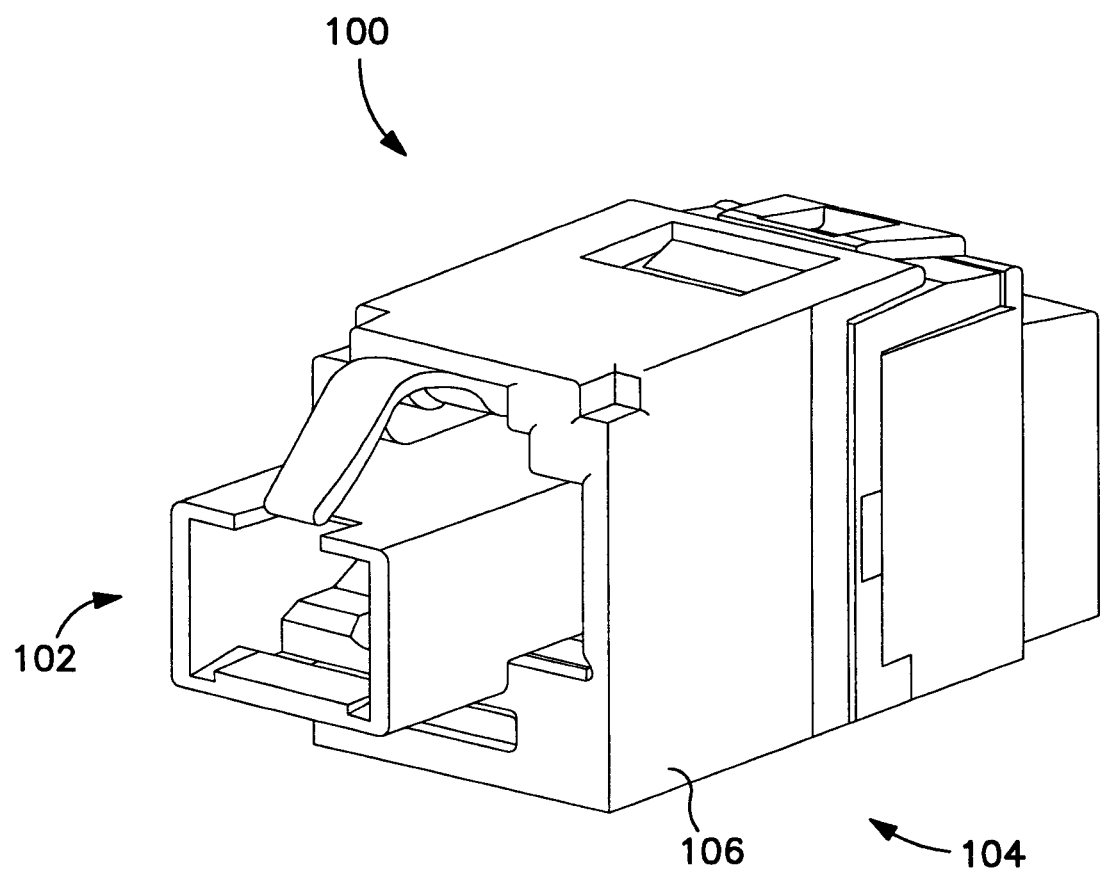
FIG. 1 is a perspective view of a connector assembly embodying the principles of the present invention.

Referring now to the drawings, and more particularly to FIG. 1, a communication connector assembly 100 is illustrated. The communication connector assembly 100 includes a compensation technique that reduces net crosstalk in accordance with the principles of the present invention. As shown in FIG. 1, the communication connector assembly 100 includes a plug 102 that is connectable to a jack 104. The jack 104 includes a housing 106 and a carrier portion to hold a printed circuit board (not shown). The housing 106 of the jack 104 holds an array of closely spaced parallel contacts for contacting corresponding contacts of the plug 102. When electrical signals are transmitted through the communication connector assembly 100, crosstalk occurs within the connector assembly.

Crosstalk is primarily generated in the connector assembly due to the closely spaced parallel conductors within the plug 102 and the jack 104. In general, cross-talk is a measure of undesirable signal coupling from one circuit pair to another. Several different measures of cross-talk have been developed to address concerns arising in communication connector assemblies. Near end crosstalk (NEXT) is a measurement of crosstalk traveling in the opposite direction as a disturbing signal in a different circuit pair. NEXT is calculated according to the following equation: NEXT=Signal Voltage due to (Capacitive Coupling (C)+Inductive Coupling (L)). Far end crosstalk (FEXT) is a measurement of crosstalk traveling in the same direction as a disturbing signal in a different circuit pair. FEXT is calculated according to the following equation: FEXT=Signal Voltage due to (Capacitive Coupling (C)–Inductive Coupling (L)). A further description of the principles of crosstalk within a connector is disclosed in U.S. Pat. No. 5,997,358 (the "358 patent"), which is hereby incorporated by reference.

There is distributed inductive and capacitive coupling between all signal current carrying conductors in a plug/jack combination from the cable connection to the plug to the cable connection to the jack. In addition, there is capacitive coupling between any conductive materials which are remote from the above conductors and which are connected electrically to the above conductors and between the conductive materials and the above conductors.

Figure 2:
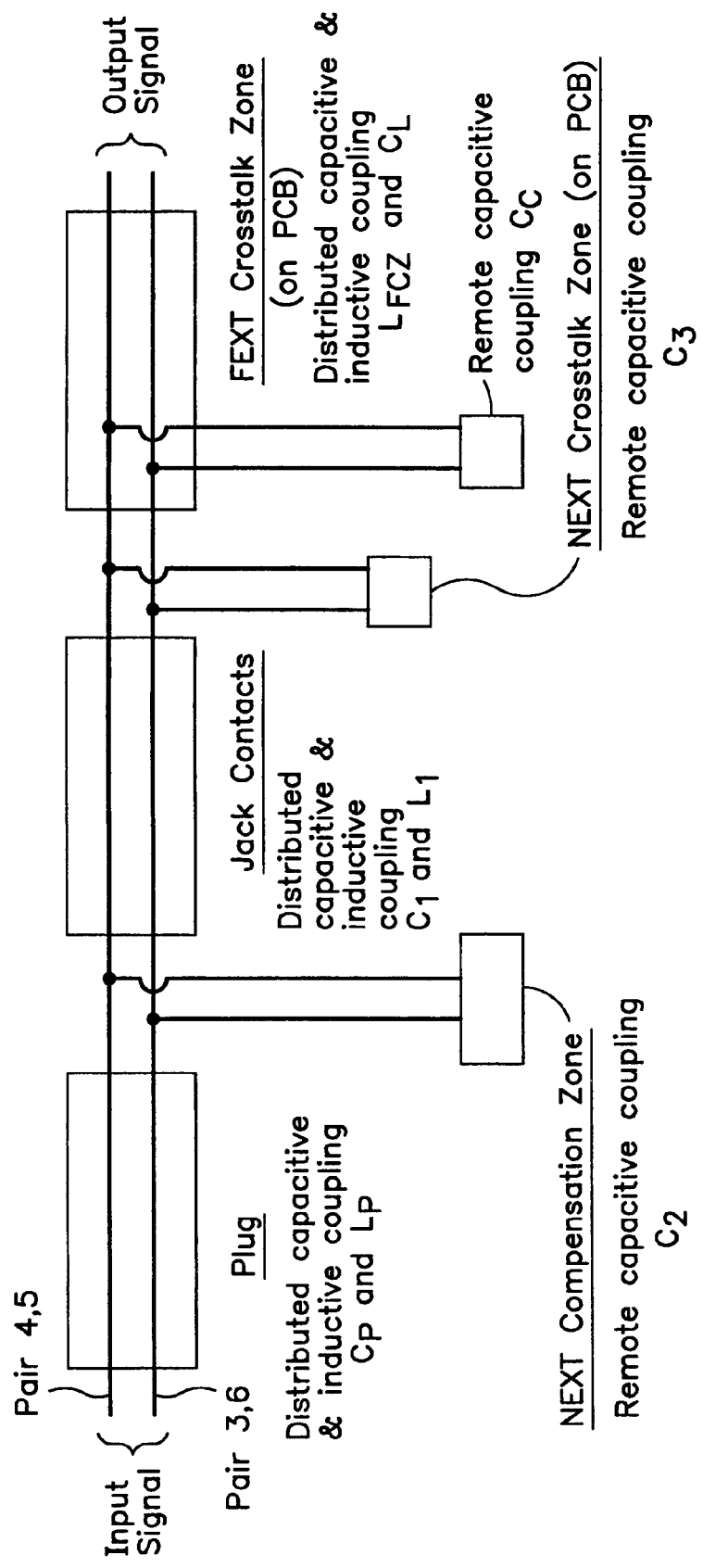
FIG. 2 is a schematic diagram of the compensation technique to reduce crosstalk in the connector assembly of FIG. 1.

The major couplings which illustrate how a preferred embodiment functions are illustrated schematically in FIG. 2:

The plug is primarily distributed inductive and capacitive coupling.

The NEXT compensation zone is remote capacitive coupling.

The jack contacts are primarily distributed inductive and capacitive coupling.

The NEXT crosstalk zone is remote capacitive coupling.

The FEXT crosstalk zone is a combination of distributed inductive and capacitive coupling and a remote capacitive coupling.

The distinction between distributed couplings and remote couplings is important because of their different effects on NEXT and FEXT.

NEXT is the reflected signal from any coupling back to the cable connection to the plug. The phase angle of each element of NEXT is dependent on the distance from said cable connection to and from said element.

FEXT is the signal from any coupling that travels to the cable connection to the jack. Thus, all such signals from distributed couplings are in phase regardless of their location. The phase angle of the signal from each remote coupling is, however, dependent on the distance to and from the remote coupling to the current carrying conductors.

In the illustrated embodiment, conductors 3,6 form one wire pair and conductors 4,5 form another wire pair. It will be recognized that different wire pair combinations and other wire pairs can be utilized without departing from the spirit and scope of the present invention.

Figure 3:
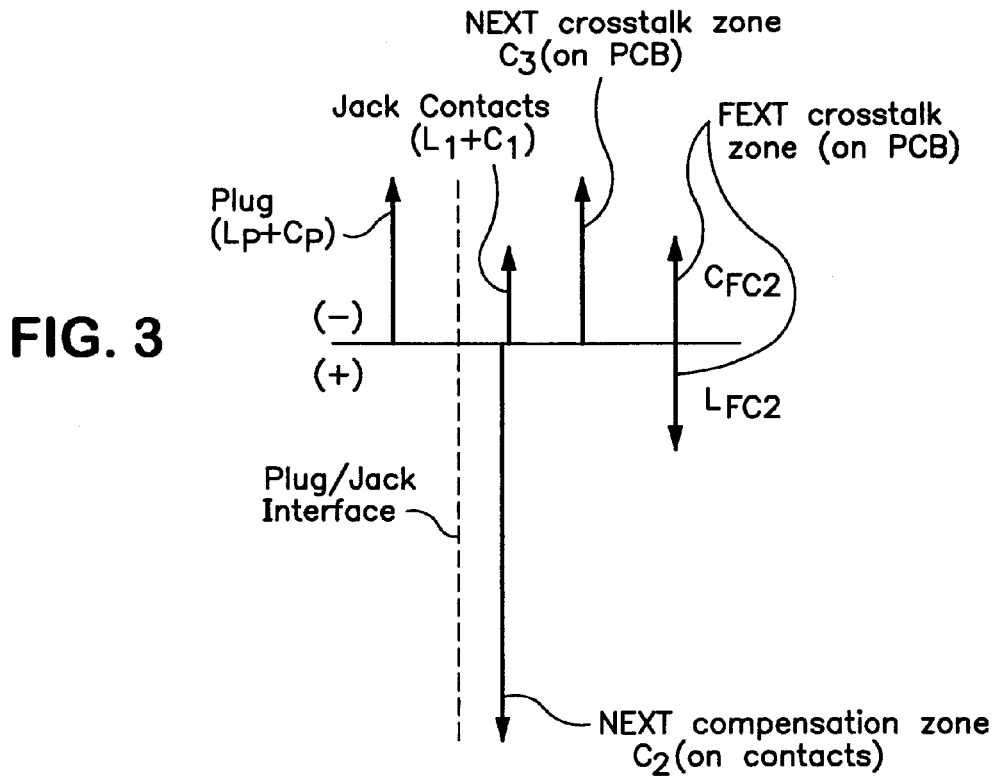
FIG. 3 is a NEXT schematic vector diagram of the connector assembly of FIG. 1.

The compensation scheme of the connector assembly 100 includes a NEXT compensation scheme and a FEXT compensation scheme. The NEXT compensation scheme preferably includes a NEXT compensation zone and a NEXT crosstalk zone. The NEXT compensation scheme reduces the NEXT of the plug and the jack to effectively zero at a selected null frequency. FIG. 3 is a vector representation of the NEXT compensation scheme implemented on the two wire pairs 3,6 and 4,5 according to the present invention.

As shown in FIG. 3, the plug 102 of the connector assembly 100 introduces offending NEXT onto the circuit pairs of the connector assembly 100. The offending NEXT of the plug 102 includes an inductive component from inductive coupling (Lp) and a capacitive component from capacitive coupling (Cp). In order to reduce the offending NEXT of the plug 102, the NEXT compensation zone of the connector assembly 100 introduces a compensation component from capacitive coupling (C2) on the circuit pairs of the connector.

The magnitude of the capacitive coupling (C2) is preferably greater than the magnitude of the couplings of the plug (Cp+Lp), but with opposite polarity. In this embodiment, the magnitude of the capacitive coupling (C2) is approximately twice the magnitude of the offending couplings of the jack 104. The magnitude of the resultant NEXT is dependent on the magnitude of the phase angle between the coupling of the plug and the capacitive coupling (C2). The larger the phase angle, the larger the resultant NEXT. It is therefore desirable to minimize this phase angle. This phase angle is proportional to the distance between the effective center of the crosstalk coupling of the plug and the effective center of the NEXT compensation zone.

As shown in FIG. 3, the NEXT compensation zone introduces a capacitive compensation coupling (C2) on the circuit pairs of the jack to reduce the offending NEXT of the plug. As further described below, the NEXT compensation zone can be implemented in the jack 104 by connecting capacitors between selected jack contacts at or near but on the opposite sides of the electrical interface 110 of the jack 104 contacts and the plug 102 contacts. As a result, the phase angle between the offending NEXT of the plug and the compensation component introduced by the NEXT compensation zone is minimized. The capacitors of the NEXT crosstalk zone are connected between circuit paths 3 and 5, and 4 and 6 at or near the electrical interface 110 of the jack contacts and the plug contacts.

Referring again to FIG. 3, the jack contacts of the connector assembly 100 introduce couplings onto circuit pairs of the connector assembly. The couplings of the jack contacts include an inductive component (L1) and a capacitive component (C1).

The NEXT crosstalk coupling (C3) has the same polarity as the coupling of the plug 102, but has the opposite polarity of the capacitance compensation coupling (C2). The NEXT crosstalk zone is located at a particular phase angle at the null frequency from the NEXT compensation zone. In the preferred embodiment, since the phase angle between the coupling of the plug and the capacitive coupling (C2) of the NEXT compensation zone is relatively small, the phase angle between the capacitive coupling (C2) of the NEXT compensation zone and the capacitive coupling (C3) of the NEXT crosstalk zone is relatively small. In order to attain a relatively small phase angle between these capacitive couplings, the length of that portion of the jack contacts between the NEXT compensation zone and the NEXT crosstalk zone is relatively small. A preferred embodiment disclosed herein minimizes this length, separates them with air as much as feasible, and still provides adequate force between the jack contacts and the contacts of an installed plug.

As shown in FIG. 2, the NEXT crosstalk zone introduces the crosstalk coupling (C3) on the circuit paths of the connector. The NEXT crosstalk zone is preferably located at a particular phase angle at the null frequency from the cable connection to the plug. As further described below, the NEXT crosstalk zone can be implemented in the jack 104, for example, by connecting capacitors between the input terminals of the printed circuit board (PCB) of the connector assembly 100. It will also be recognized that such capacitors could be connected between the contacts of the jack 104 at the same locations that the NEXT compensation zone capacitors are connected. They would, however, be connected between different conductors to reverse the polarity, and the length of the electrical conductors from the connection point to the NEXT crosstalk zone capacitors would be larger than the length of the electrical conductors from the connection point to the NEXT compensation zone capacitors.

The NEXT crosstalk zone capacitors could alternatively be connected to the jack contacts between the plug/jack contact interface and the cable connection to the jack. As shown in FIG. 2, the crosstalk coupling (C3) of the NEXT crosstalk zone is introduced by capacitors whose leads are connected between circuit paths 3, 4 and 5, 6 at the input terminals of the PCB.

As further described below, the FEXT crosstalk zone includes a crosstalk coupling ($C_C$) and compensation couplings ($L_{FCZ}$ and $C_L$). The location of the effective center of the compensation couplings ($L_{FCZ}$ and $C_L$) and the effective center of the crosstalk coupling ($C_C$) of the FEXT crosstalk zone are preferably equidistant and equal in phase angle displacement from the electrical interface of the plug and jack. The NEXT components generated by capacitive coupling in the FEXT crosstalk zone are generated by $C_C$ and $C_L$ and the net of these couplings is $C_{FCZ}$ which is equal to $C_C$-$C_L$. The inductive compensation coupling in the FEXT crosstalk zone ($L_{FCZ}$) is preferably equal in magnitude and of opposite polarity to the crosstalk component ($C_{FCZ}$). As a result, since NEXT coupling is equal to C+L, the two components ($L_{FCZ}$) and ($C_{FCZ}$) will cancel each other out, and therefore, the FEXT crosstalk zone has little or no effect on NEXT.

Figure 4:
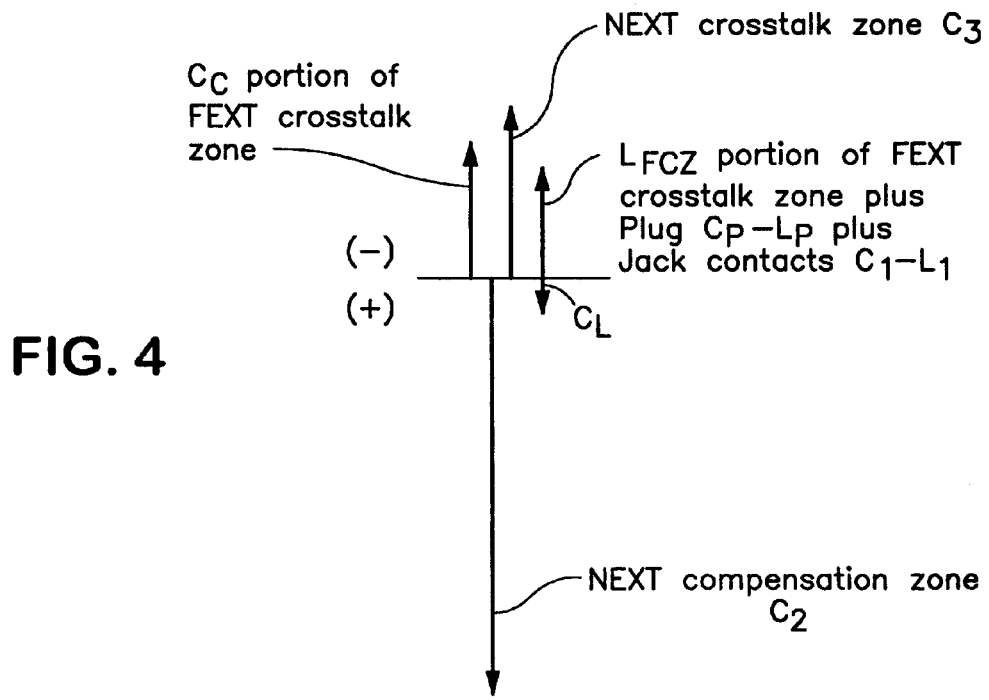
FIG. 4 is a FEXT schematic vector diagram of the connector assembly of FIG. 1.

Referring to FIG. 4, couplings C and L for a specification plug both create crosstalk which is designated as negative (−).

In this jack design, the jack contacts have couplings C and L which both create crosstalk and which are also negative (−).

As previously stated, NEXT is equal to the signal voltage due to couplings C+L and FEXT is equal to the signal voltage due to couplings C−L.

Therefore, the net effect of the couplings due to the plug and the jack contacts is greatly reduced in their effect on FEXT compared to their effect on NEXT. Since the combined effects of the various couplings are extremely successful in minimizing NEXT, the same couplings result in an excessive FEXT.

However, although the net effect of the FEXT crosstalk zone is zero on NEXT, it has a beneficial effect of reducing FEXT.

In the example of the embodiment taught herein, the net capacitive coupling of the FEXT crosstalk zone is $C_{FCZ}$ and it is crosstalk and has a negative (−) sign.

The inductive coupling of the FEXT crosstalk zone is $L_{FCZ}$ and it is compensation and has a positive sign (+).

The couplings that affect NEXT=$C_{FCZ}$+$L_{FCZ}$=−0.944 pF+0.948 pF*=0

The couplings that affect FEXT=$C_{FCZ}$−$L_{FCZ}$=−0.946 pF−0.946 pF*=1.892 pF

*Equivalent pF to nH of $L_{FCZ}$

The magnitude of the net effect of the FEXT crosstalk zone on FEXT has been derived to be approximately equal to the loss of the net effect of the plug and jack contacts on FEXT compared to their effect on NEXT.

In the creation of FEXT, the phase angle displacement between the various elements is equal to two times the distance (in Phase Angle Displacement) from the signal path to the elements. In this embodiment, these phase angles are relatively small, and therefore the FEXT is relatively small.

The inductive coupling portion of the FEXT crosstalk zone, $L_{FCZ}$ is created by adjacent current carrying conductors on the PCB. It is not a design objective, but these conductors produce a minimal amount of capacitive coupling in addition to the inductive coupling. Both of these couplings have a polarity which is opposite to that of the couplings in the plug and which has been designated as positive. The designation of this capacitive coupling is $C_L$.

The main capacitive coupling portion of the FEXT crosstalk zone is created by capacitor plates which are an integral part of the PCB and which are connected by conductors to the current carrying conductors in the above described inductive coupling portion. The connecting conductors are connected at a selected location and are of a selected length to insure the phase angle displacement from the plug/jack contact interface is equal for $L_{FCZ}$ and $C_{FCZ}$. The polarity of this capacitive coupling is negative, the same as the couplings in the plug.

The designation of this capacitive coupling is $C_C$.

The magnitude of $C_C$ is such that $C_C$−$C_L$=$C_{FCZ}$=Equivalent to magnitude of $L_{FCZ}$ in pF.

Referring to FIG. 2, FEXT is the signal from any coupling that travels to the cable connection to the jack. Thus, all such signals from distributed couplings are in phase regardless of their location. The phase angle of the signal from each remote coupling is, however, dependent on the distance to and from the remote coupling to the current carrying conductors.

Again, referring to FIG. 4, as compared to FIG. 3, the net plug vector is reduced in magnitude. The net jack contact vector is reduced in magnitude. The three components of the FEXT crosstalk zone no longer add up to zero. They are now effective.

Referring to FIG. 4, all the distributed couplings are in phase with each other and all the remote couplings have a phase angle which is lagging the distributed couplings.

Figure 8:
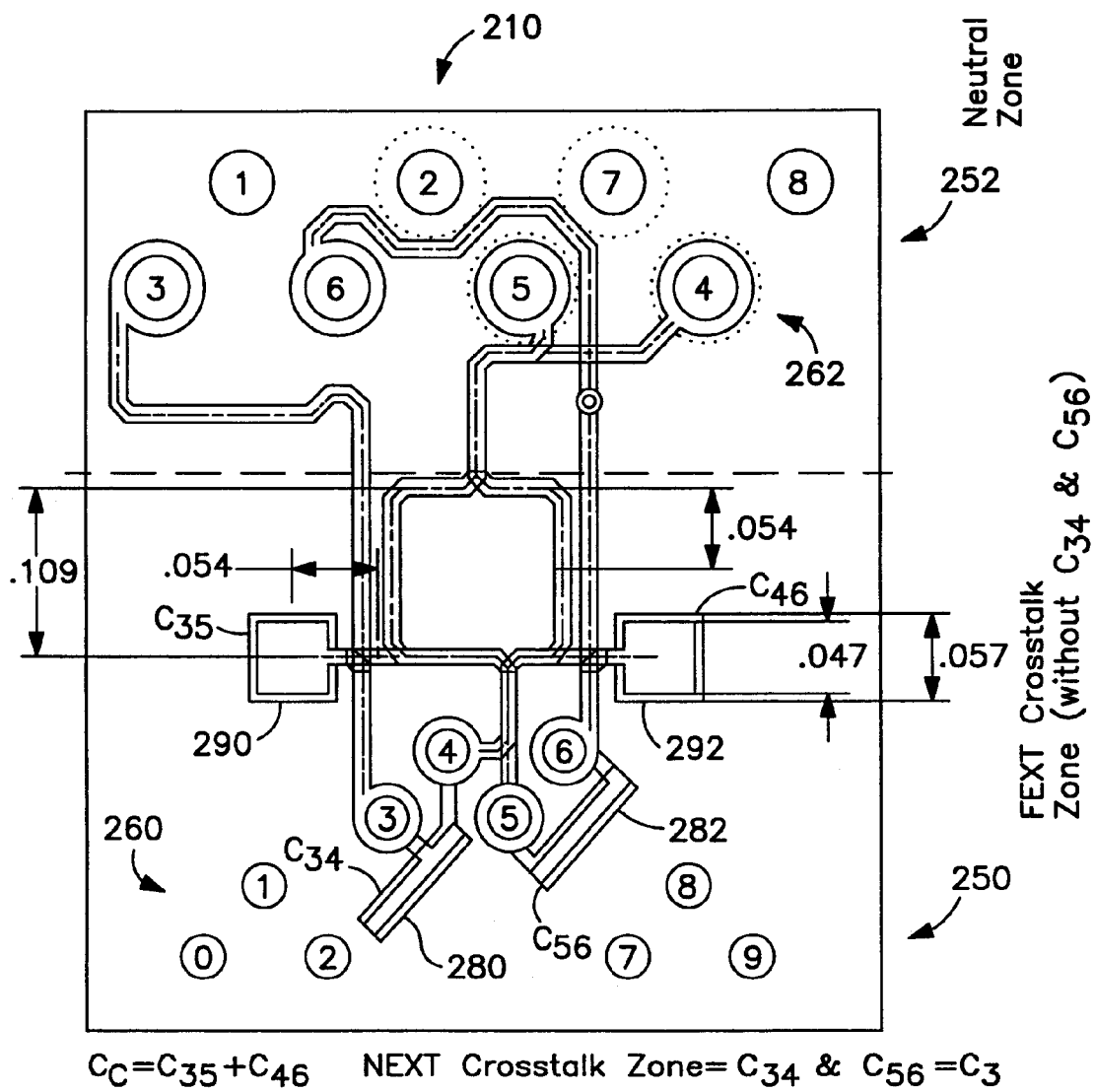
FIG. 8 is a plan view of the printed circuit board of the electrical jack of FIG. 5.

The FEXT crosstalk zone can be implemented in the printed circuit board of the jack by connecting selected magnitudes of capacitance between circuit paths and by creating mutual inductance between adjacent circuit paths. The inductive couplings of the FEXT crosstalk zone are generated in the printed circuit board by positioning circuit paths 3 and 5 in close proximity to each other for a selected distance, and positioning circuit paths 4 and 6 in close proximity to each other for a selected distance. As shown in FIG. 8, capacitors are connected between pairs 3,6 and 4,5 at a selected distance from the input terminals of the printed circuit board.

The NEXT generated by the FEXT crosstalk zone is self-canceling as described above. The effects of couplings on FEXT are determined by distributed couplings and by remote couplings in the same manner regardless of their positioning along signal paths. Therefore, the FEXT crosstalk zone can be positioned at any suitable distance from the NEXT compensation zone, without degrading NEXT or FEXT performance.

The plug is a specification plug which must be used and it contains inductive and capacitive coupling.

The contacts are designed to be short in length and mechanically sound. The result is that they contain inductive and capacitive crosstalk coupling. Longer and more complicated contacts could be designed to have minimal inductive coupling or inductive compensation coupling however such complications would not enhance the superior results of this invention.

The NEXT compensation zone design provides the minimum phase angle change from the interface of the plug/jack contacts to the effective center of the NEXT compensation zone. The NEXT compensation zone coupling is all capacitive because simple alternate designs with inductive coupling would increase the phase angle change. The NEXT compensation zone design allows minimum NEXT to be achieved and it is one of the most important elements of this invention.

The NEXT crosstalk zone provides only capacitive coupling. This is the optimum design because it provides the required balance to minimize NEXT and it has no detrimental affect on FEXT.

The results of the above design are:
It provides minimum NEXT; and
It provides relatively large FEXT.

This combination of results creates a problem, however the addition of the FEXT crosstalk zone solves this problem because it has no effect on NEXT and has a very beneficial effect on FEXT.

The FEXT crosstalk zone is also one of the most important elements of this invention and in combination with the unique compensation zone, the synergy results in a very important technical achievement.

The parameters of the FEXT crosstalk zone design provided herein results in a relatively small FEXT; however, it is contemplated that the FEXT could be reduced further by changing design parameters.

One example is to increase $C_L$ which could be achieved by locating conductor 3 above 5 instead of adjacent to it and by locating conductor 6 above 4 instead of adjacent to it. With $C_L$ increased, $C_C$ would necessarily be increased. Since the phase angle of $C_C$ is more nearly 180° from the NEXT compensation zone C2 than $C_C$, FEXT would be reduced.

Another example is to increase the length of conductors 3,5 and 4,6 in combination with separating them to keep $L_{FCZ}$ the same. Since $C_C$ must be in the center of the FEXT crosstalk zone, the distance from the current paths to the remote $C_C$ would necessarily be increased and this would change its phase angle which could be made optimum.

In one embodiment, the parameters of the components of the compensation scheme implemented by the connector assembly are provided as follows:

Plug:

$Cp+Lp$=Equivalent to −1.472 pF $Cp-Lp$=Equivalent to −0.111 pF where Lp is the inductive coupling of standard plug and Cp is the capacitive coupling of standard plug.

Jack Contacts:

$C1+L1$=Equivalent to −0.791 pF $C1-L1$=Equivalent to −0.071 pF where L1 is the inductive coupling of jack contacts and C1 is the capacitive coupling of jack contacts.

NEXT compensation zone:
If the effect of the jack contacts are ignored at 500 MHz null frequency, then C2=2.782 pF; however, with adjustments for jack contacts:

C2=3.574 pF where C2 is the capacitive coupling of NEXT compensation zone.

NEXT crosstalk zone:

C3=−1.472 pF where C3 is the capacitive coupling of NEXT crosstalk zone.

FEXT crosstalk zone:

$C_{FCZ}$=−0.944 pF $-L_{FCZ}$=+1.741 nH=Equivalent to +0.944 pF $C_C$=−1.138 pF $-C_L$=+0.194 pF where:
$L_{FCZ}$ is the inductive coupling of FEXT crosstalk zone;
$C_{FCZ}$ is the net capacitive coupling of FEXT crosstalk zone capacitors;
$C_{FCZ}=C_C-C_L$;
$C_L$ is the capacitive coupling of FEXT crosstalk zone inductive coupling conductors; and
$C_C$ is the capacitive coupling of FEXT crosstalk zone capacitors.

As will be recognized by those skilled in the art, the values of the components of the compensation scheme may be varied in magnitude about their initially determined values for purposes of fine tuning. Although the embodiment has been applied to pairs 3,6 and 4,5 of a connector assembly, it will be recognized that the principles described herein can be applied to other pair combinations of an electrical connector, such as a jack.

Figure 5:
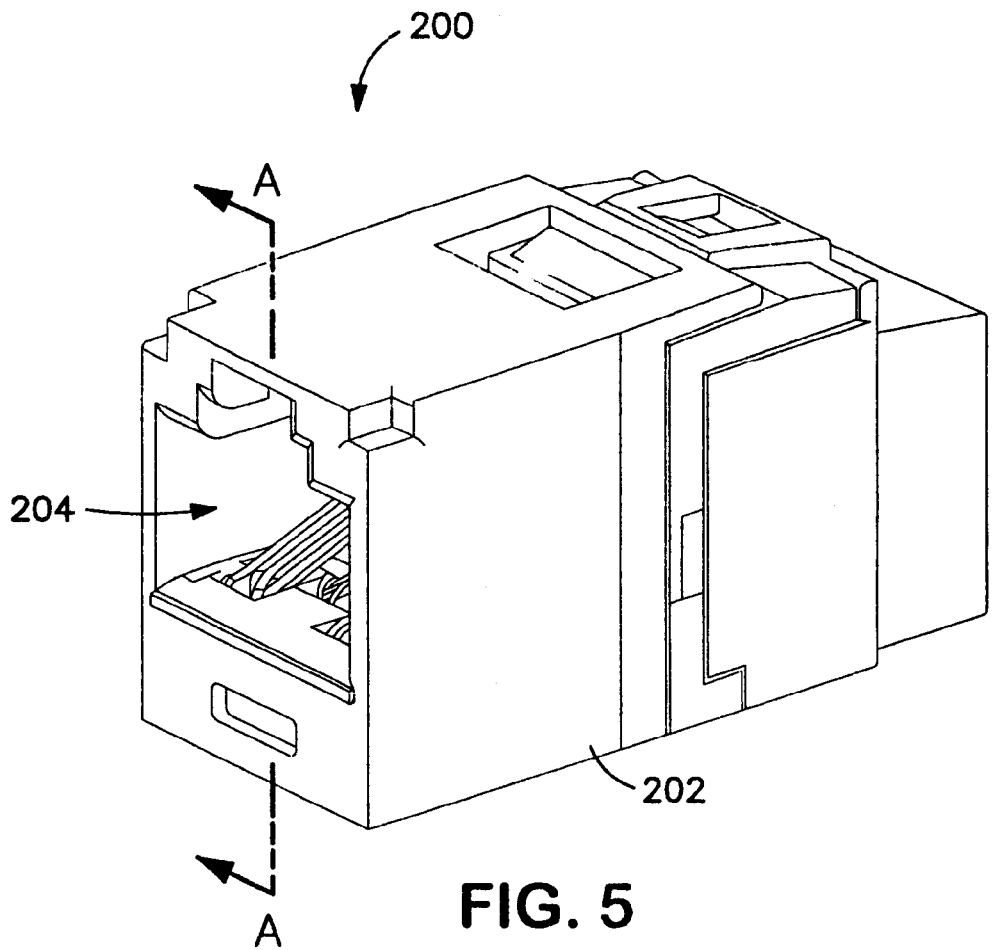
FIG. 5 is a perspective view of an electrical jack embodying the principles of the present invention.
Figure 7:
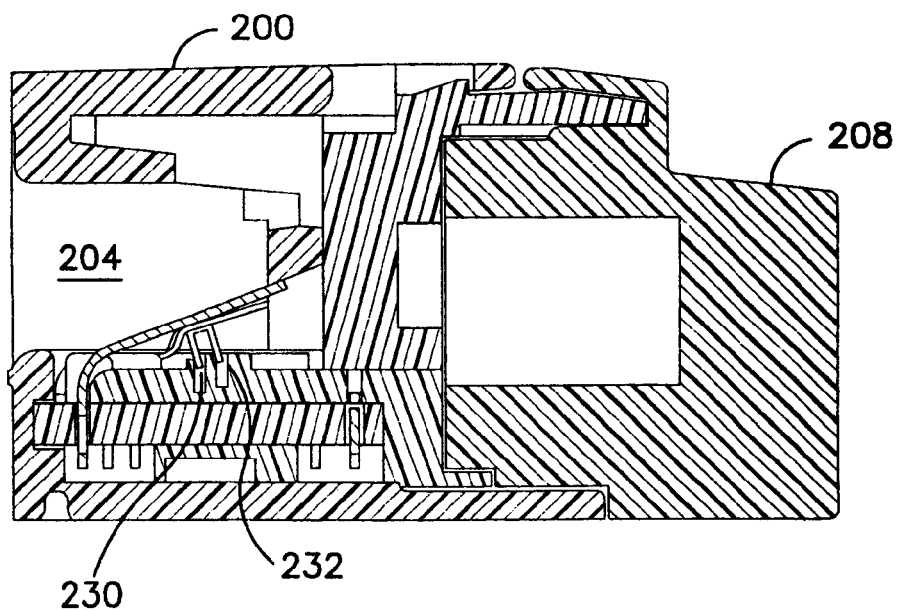
FIG. 7 is a sectional view of the electrical jack of FIG. 5 taken along line A-A of FIG. 5.
Figure 6:
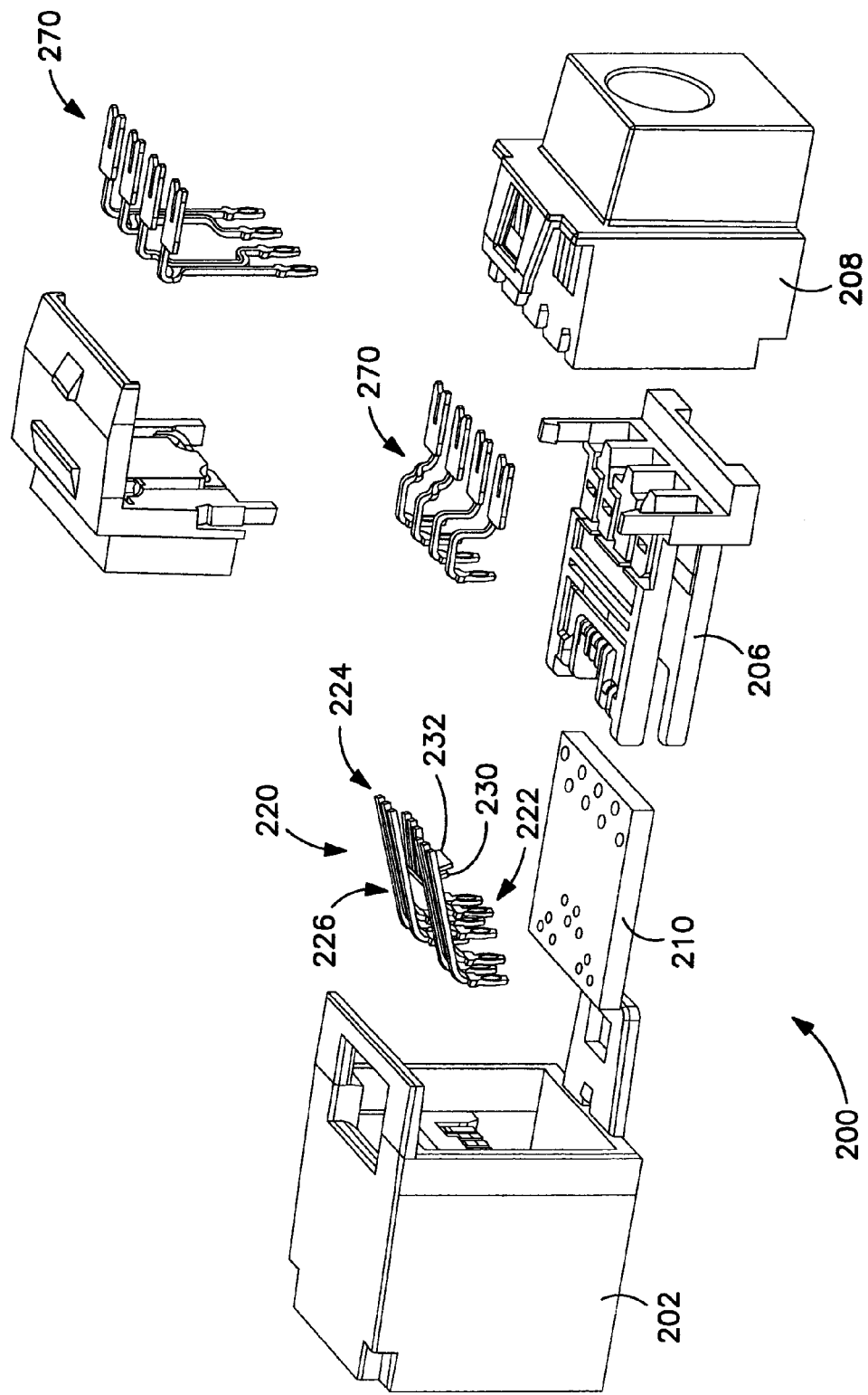
FIG. 6 is an exploded view of the electrical jack of FIG. 5.

Referring now to FIGS. 5-7, an electrical connector implementing a compensation scheme to reduce crosstalk according to the present invention is shown. The electrical connector is preferably a jack 200. The jack 200 minimizes the phase angle delay for introducing crosstalk compensation by introducing it at the plug/jack contact interface where the offending crosstalk is introduced to a jack by a mating plug (not shown).

As shown in FIGS. 5-7, the jack 200 includes a housing 202 defining a plug receiving opening 204, a PCB and conductor carrying sled 206 and a wire containment cap 208. In the illustrated embodiment, the jack 200 is an 8 contact type (i.e., 4 twisted pair) connector arrangement according to a wire pair industry standard (i.e., wires 4 and 5 comprising pair 1, wires 3 and 6 comprising pair 2, wires 1 and 2 comprising pair 3, and wires 7 and 8 comprising pair 4). It is contemplated that the jack can be any other type of suitable jack or connector.

The contact carrier 206 of the jack 200 includes a printed circuit board (PCB) 210 and a plurality of contacts 220. The contacts 220 each have a first end portion 222 fixedly attached to the printed circuit board 210 and a second free end portion 224. Each contact 220 also has a contact portion 226 extending between its first and second end portions 222, 224. When a plug is inserted into the opening 204 of the housing 202, the contact portions 226 of the connector 200 make electrical contact with the contacts of the plug.

As described above, the plug introduces offending NEXT onto the jack conductors at the electrical interface of the contacts 220 and the plug. As part of the compensation for the offending NEXT of the plug, the jack 200 introduces a capacitive compensation coupling (C2) at said electrical interface. As shown in FIGS. 6 and 7, the capacitance compensation coupling (C2) of the NEXT compensation zone is preferably provided by flexible printed circuit capacitors 230 and 232 that are connected with flexible arms to the underside of the contact portions 226 of the contacts 220.

In the illustrated embodiment, the capacitors 230 and 232 are connected across contacts 220 associated with wire pair 1 (wires 3 and 5) and wire pair 2 (wires 4 and 6). The capacitors 230 and 232 are installed by electrically connecting flexible printed circuit capacitive plates to the respective contacts 220. It will be recognized that the capacitors can be implemented by any suitable capacitive element. Since the capacitance compensation component (C2) is connected at said plug/jack contact interface and since the distance from said plug/jack contact interface to the effective center of the capacitors is minimized, the phase angle between the offending NEXT of the plug and the NEXT compensation coupling (C2) is minimized.

Referring now to FIG. 8, a preferred layout of the circuit conductors or traces in the printed circuit board 210 of the jack 200 is shown. The printed circuit board 210 has a front portion 250 and a rear portion 252. The front portion 250 includes a plurality of front terminals 260 labeled 1-8 and the rear portion 252 of the printed circuit board 210 includes a plurality of rear terminals 262 labeled 1-8. For explanation purposes, only the circuit pathways formed between front terminals 260 (labeled 3-6) and the rear terminals 262 (labeled 3-6) at the rear portion 252 are shown. Insulation displacement contacts (IDCs) 270 are mounted to each of the rear terminals 262 as shown in FIG. 6. The IDCs 270 are electrically connected through the circuit paths on the printed circuit board 210 to the front terminals 260.

Following the teachings of the '358 patent, the jack 200 introduces a crosstalk or reverse compensation coupling (C3) at specific locations on the circuit paths of the connector 200 at the NEXT crosstalk zone. The capacitance compensation component C3 of the NEXT crosstalk zone of the jack 200 is introduced by capacitors 280 and 282 as shown in FIG. 8.

The capacitors 280 and 282 are connected across front terminals 3, 4 and terminals 5, 6, respectively, of the printed circuit board 210 of the jack 200 and are preferably formed by parallel conductive plates. It will be recognized that the capacitors 280 and 282 can be discrete components, such as a capacitor, or any other suitable capacitive element. For example, the capacitors can be formed on the same or different layers of the circuit board and the shape or type of the capacitors can be varied.

The printed circuit board 210 of the jack 200 implements a FEXT crosstalk scheme or zone to reduce or cancel the FEXT of the plug/jack combination.

The FEXT compensation scheme introduces a crosstalk capacitive coupling ($C_C$) and inductive and capacitive compensation couplings ($L_{FCZ}$ and $C_L$) onto the circuit paths of the printed circuit board 210. The capacitance compensation coupling $C_C$ of the FEXT crosstalk zone is introduced by capacitors 290 and 292, and the compensation couplings ($L_{FCZ}$ and $C_L$) are created by positioning the current carrying circuit paths in close proximity to each other. It is to be noted that the thickness or the cross-sectional dimension of the traces as well as the distance or spacing between the conductors or traces can also be adjusted to achieve the required couplings.

As shown in FIG. 8, the capacitors 290 and 292 are connected across terminals 3, 5 and 4, 6, respectively, near the front terminals of the printed circuit board 210 of the jack 200. Each of capacitors 290 and 292 are preferably formed by parallel conductive plates, but can be implemented by any suitable capacitor element.

The locations of the effective center of the compensation couplings ($L_{FCZ}$ and $C_L$) and the effective center of the capacitance crosstalk coupling ($C_C$) of the crosstalk zone are preferably equidistant and equal in phase angle displacement from the electrical interface of the plug and jack.

It should be noted that the generation of the inductive compensation coupling ($L_{FCZ}$) introduces a capacitive coupling ($C_L$) having the same polarity as the inductive coupling ($L_{FCZ}$). However, the magnitude of the compensation coupling ($C_C$) is designed to cancel the $C_L$ coupling out as well as the inductive coupling ($L_{FCZ}$) in the generation of NEXT. $C_{FCZ}=C_C-C_L$. As a result, the compensation couplings ($L_{FCZ}$ and $C_L$) are preferably equal in magnitude and of opposite polarity to the crosstalk component ($C_C$). Therefore, the two components ($L_{FCZ}$) and ($C_{FCZ}$) will cancel each out in the generation of NEXT.

The IDCs have been designed so their effect on NEXT and FEXT is minimal. Their effect has been ignored.

The layout illustrated in FIG. 8 is effective in compensating for forward FEXT without adversely affecting forward NEXT (i.e. NEXT observed when the driven signal is received from the cable connection to the plug). Because the effective center of the compensation couplings ($L_{FCZ}$ and $C_L$) and the effective center of the capacitance crosstalk coupling ($C_C$) of the crosstalk zone are designed to be equidistant from the electrical interface of the plug and jack, the resultant inductive and capacitive coupling vectors of the FEXT crosstalk zone are at the same phase angle location with regard to their effect on forward NEXT.

For reverse NEXT (i.e. NEXT observed when the driven signal is received through the IDCs from a cable connection to the end of the jack opposite the plug), the effective center of the compensation couplings ($L_{FCZ}$ and $C_L$) and the effective center of the capacitance crosstalk coupling ($C_C$) of the crosstalk zone will not be equidistant from the electrical interface of the plug and jack. This is due to the physical asymmetries in the trace layout of FIG. 8, caused by the use of remote capacitive couplings 290 and 292. As a result, the inductive and capacitive coupling vectors of the FEXT crosstalk zone will be at different phase angle locations, adversely affecting reverse NEXT.

Figure 9:
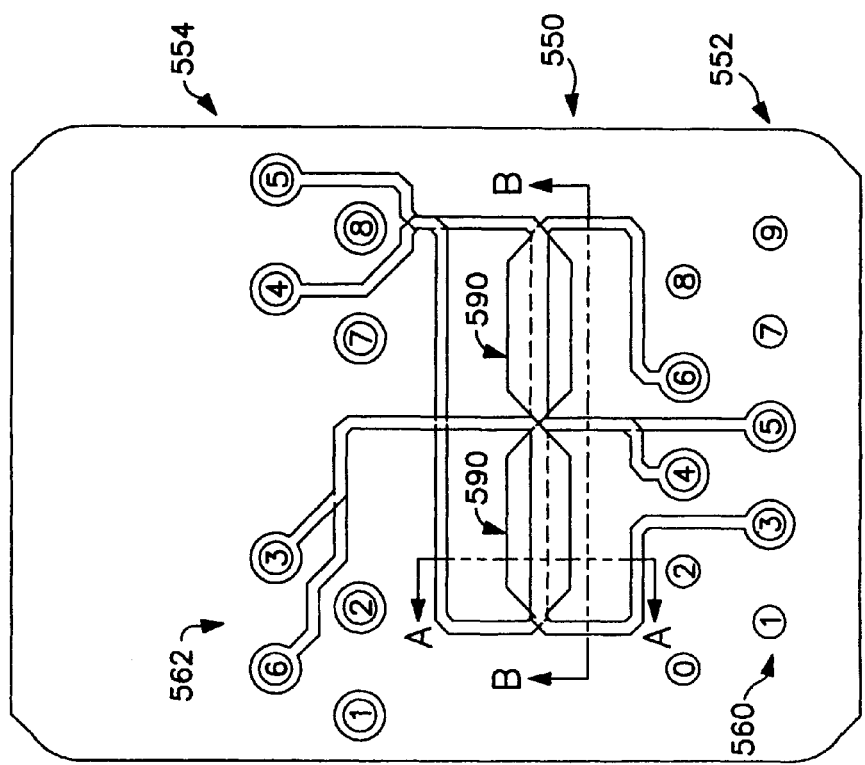
FIG. 9 is a plan view of an alternative printed circuit board of the electrical jack of FIG. 5.

FIG. 9 is a plan view of a layout for an alternative PCB 550 having couplings that are symmetrical from either direction, thereby providing FEXT compensation without adversely affecting forward or reverse NEXT. The PCB 550 includes a front portion 552 and a rear portion 554. The front portion 552 includes a plurality of front terminals 560 labeled 1-8 and the rear portion 554 includes a plurality of rear terminals 562 labeled 1-8. As was the case for FIG. 8, only the circuit pathways between front terminals (labeled 3-6) and rear terminals (labeled 3-6) are shown. In addition, the NEXT crosstalk zone has been omitted from FIG. 9 for clarity.

Like the PCB 210 of FIG. 8, the FEXT crosstalk zone of PCB 550 utilizes distributed inductive couplings (i.e. where traces are placed in close horizontal or vertical proximity to one another). However, unlike the PCB 210, which used remote capacitive couplings (parallel-plate capacitors 290 and 292), the PCB 550 utilizes distributed capacitive couplings 590, which take the form of partially overlapping traces widened to approximate distributed parallel plates. As a result, the coupling vectors are at the same phase angle location with regard to their effect on both forward and reverse NEXT. Thus, the FEXT compensation zone benefits FEXT while being neutral to both forward and reverse NEXT.

Figure 10:
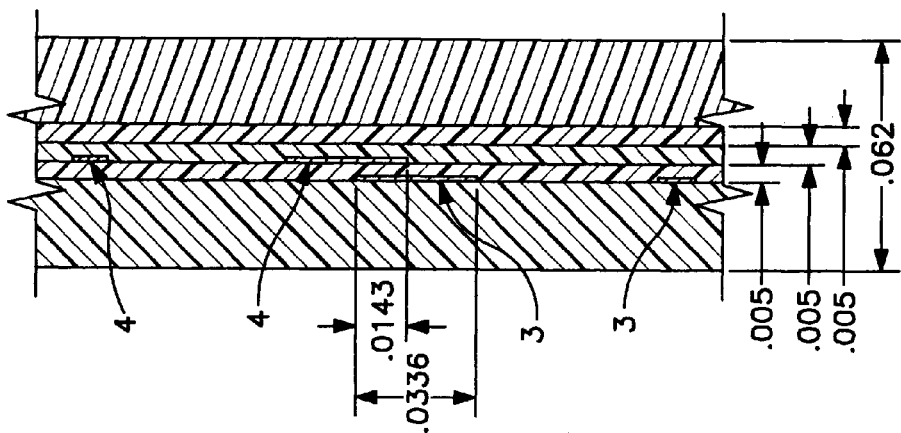
FIG. 10 is a sectional view of the printed circuit board of FIG. 9 taken along line A-A of FIG. 9.
Figure 11:
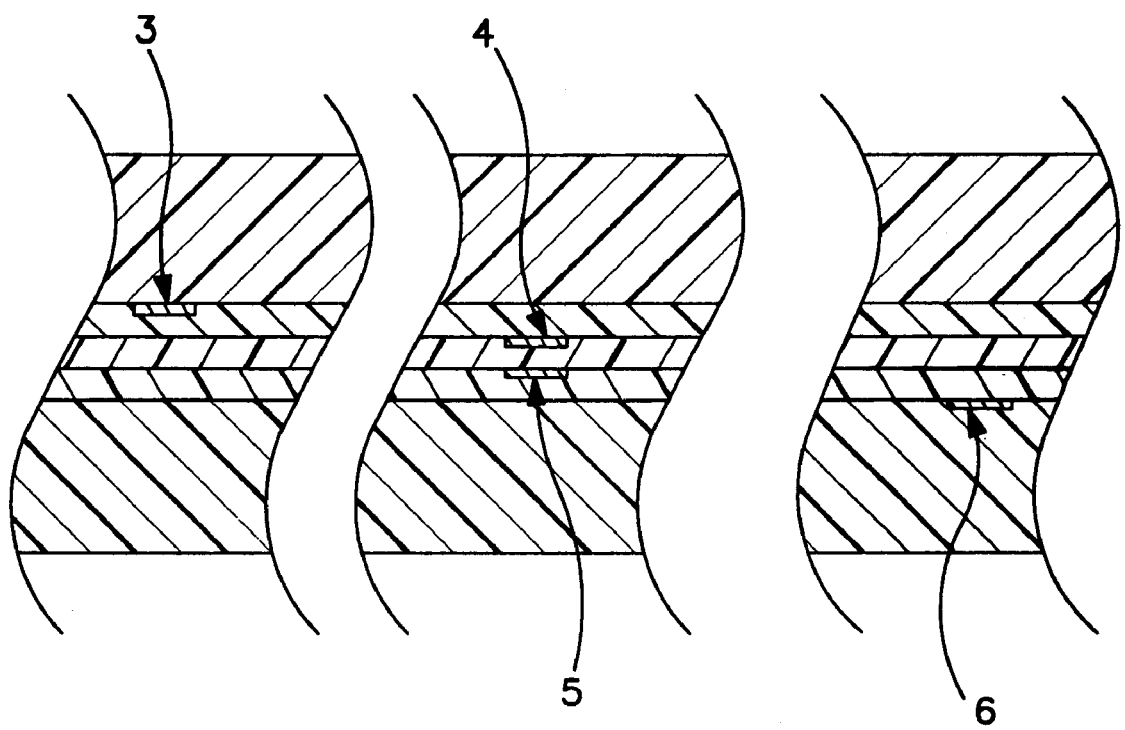
FIG. 11 is a sectional view of the printed circuit board of FIG. 9 taken along line B-B of FIG. 9.

FIGS. 10 and 11 are sectional views of the PCB 550 taken along lines A-A and B-B, respectively, of FIG. 9. The traces corresponding to traces 3, 4, 5, and 6 are shown to each traverse one of four internal layers of the PCB 550. This stratification provides spacing for desired capacitive and inductive coupling effects to appropriate FEXT compensation.

While FIGS. 9-11 illustrate one possible implementation of a symmetrical FEXT compensation zone, other implementations may also be used without departing from the intended scope of the invention. For example, different lengths and arrangements of traces may be used. Similarly, different shapes and configurations for distributed capacitances may be adopted.

Figure 12:
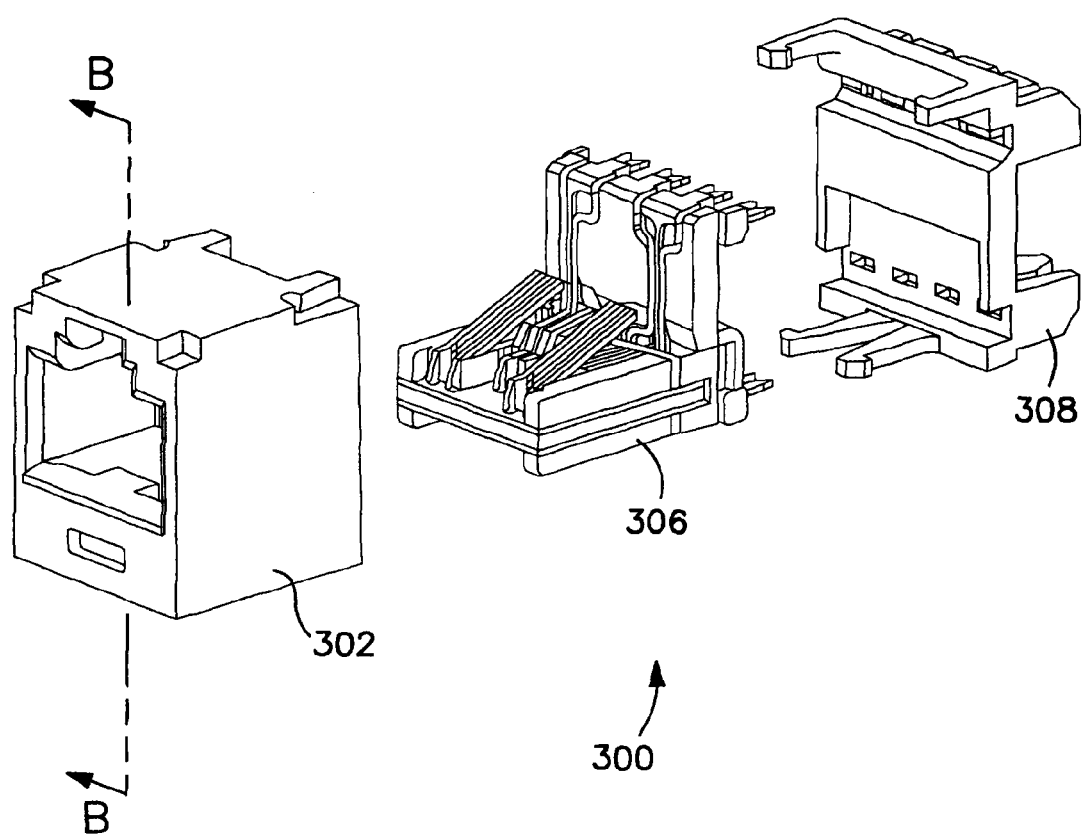
FIG. 12 is a perspective exploded view of another electrical jack embodying the principles of the present invention.
Figure 13:
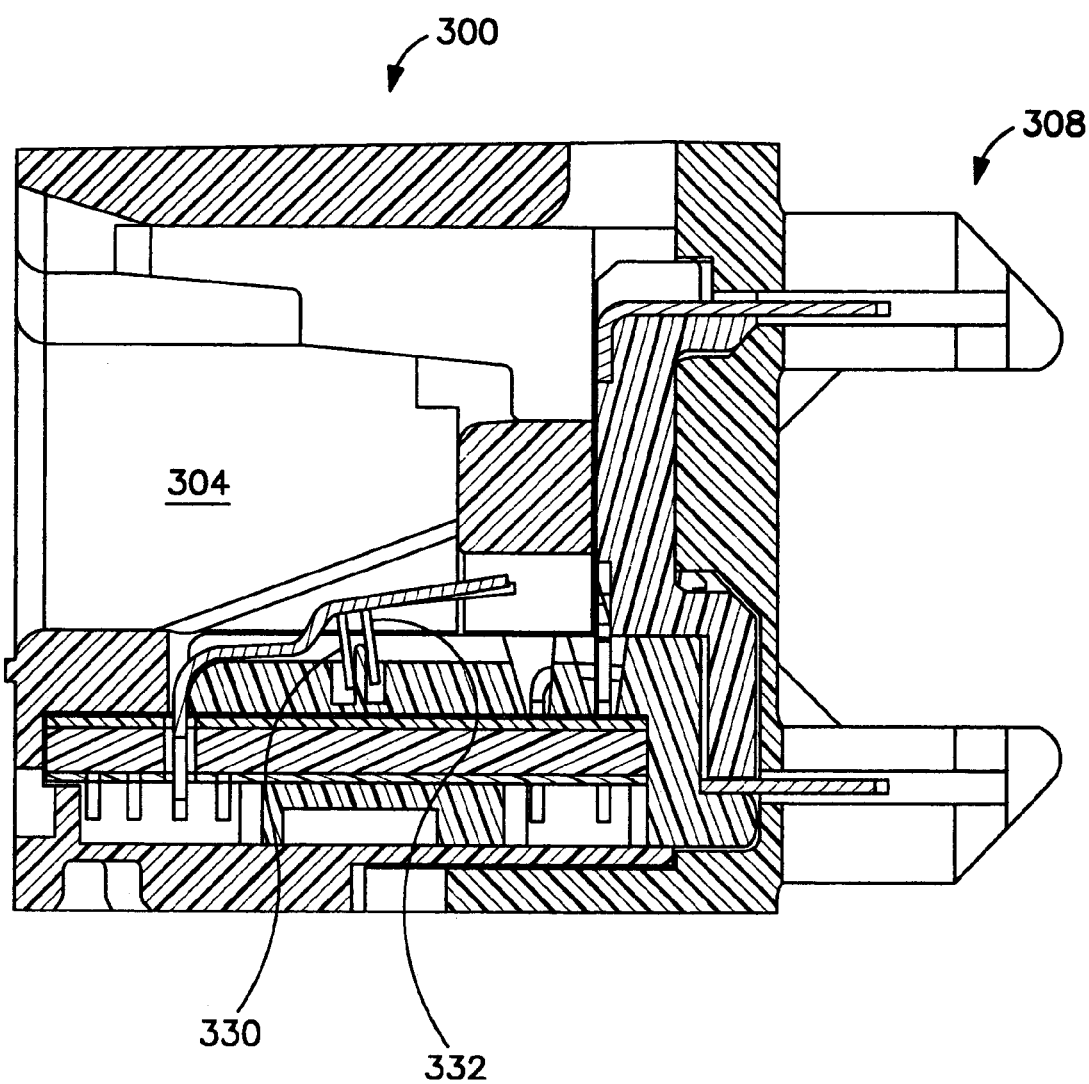
FIG. 13 is a sectional view of the electrical jack of FIG. 12 taken along line B-B of FIG. 12.
Figure 14:
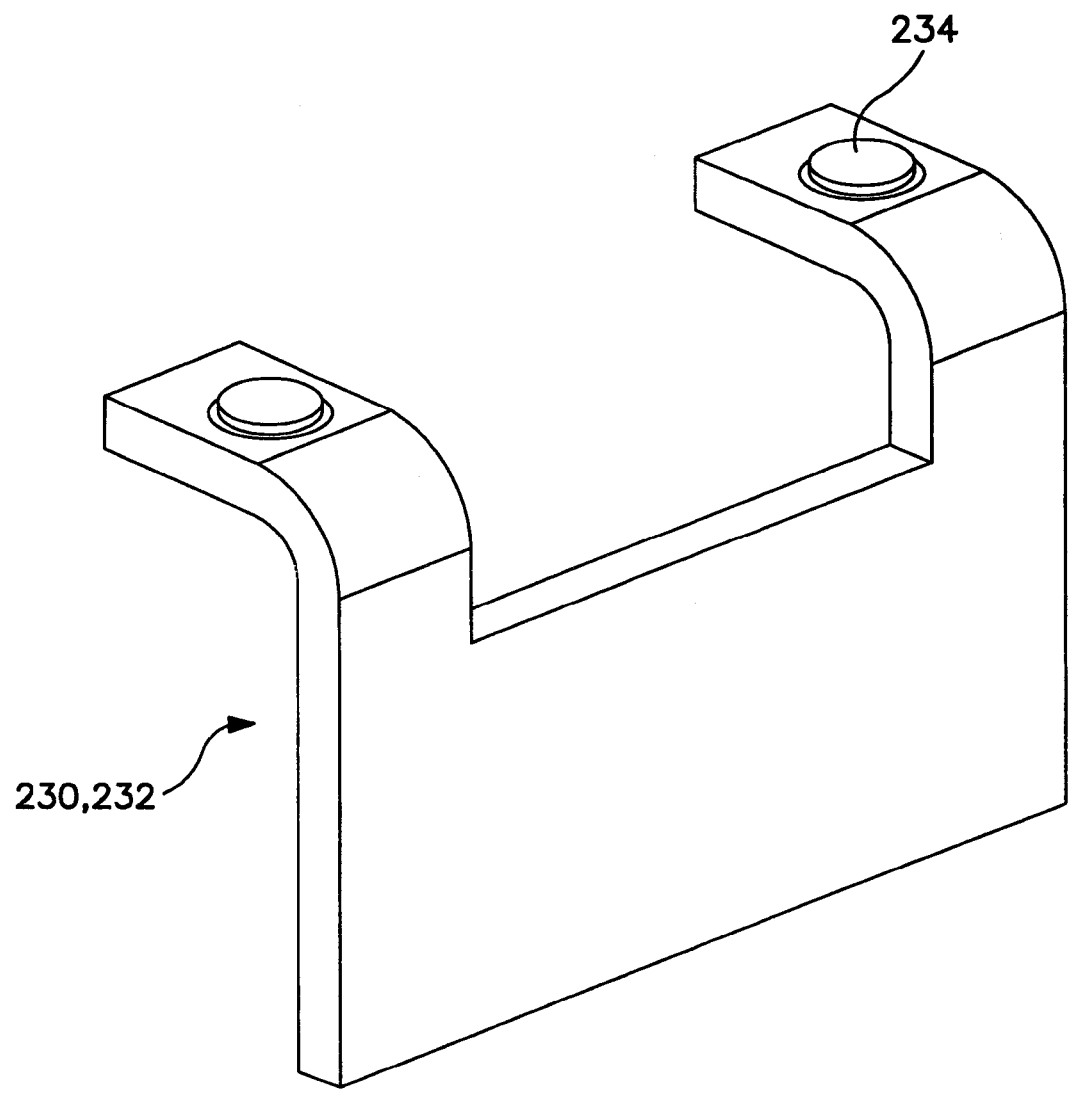
FIG. 14 is a perspective view of one embodiment of a flexible circuit capacitor.
Figure 15:
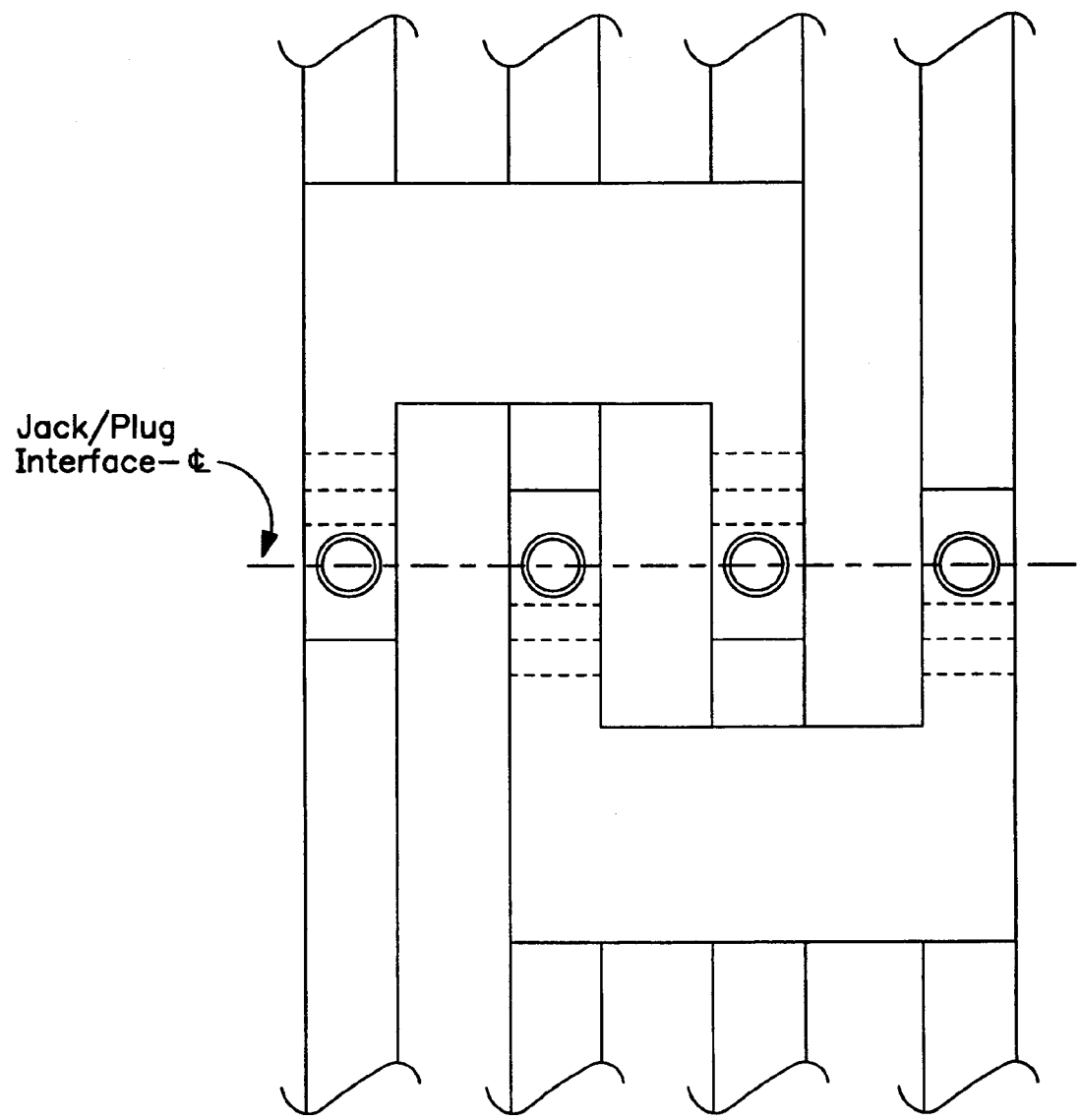
FIG. 15 is a bottom view of the flexible circuit capacitors attached to jack contacts, shown in the unformed state.
Figure 16:
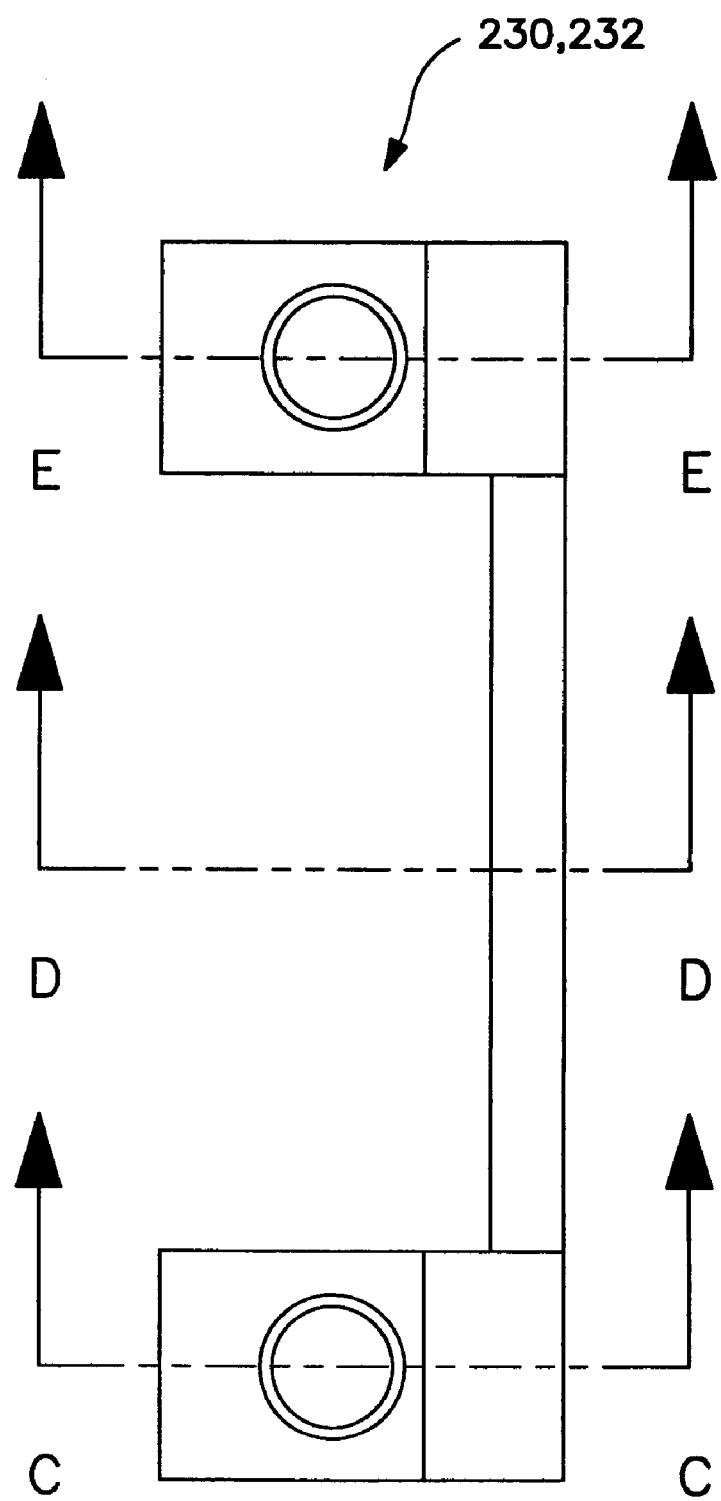
FIG. 16 is a top view of the flexible circuit capacitor of FIG. 14.
Figure 19:
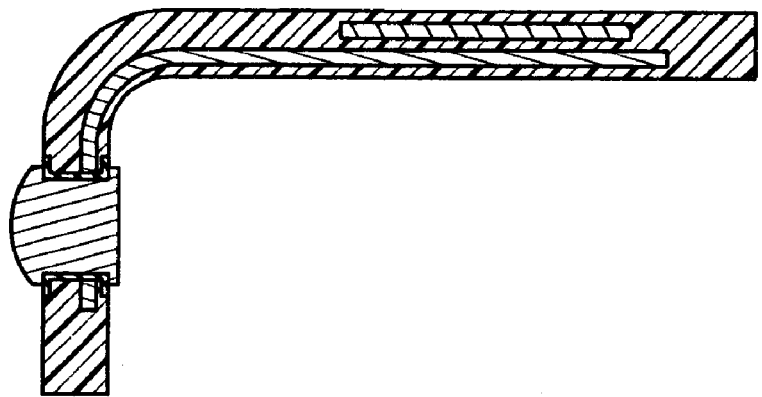
FIG. 19 is a sectional view taken along line E-E of FIG. 16.
Figure 18:
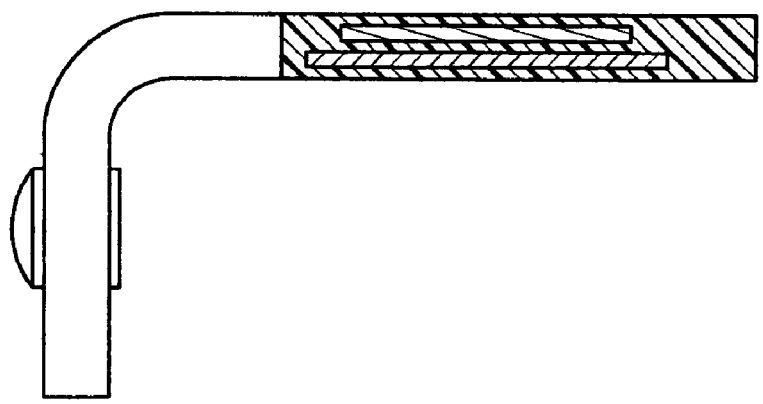
FIG. 18 is a sectional view taken along line D-D of FIG. 16.
Figure 17:
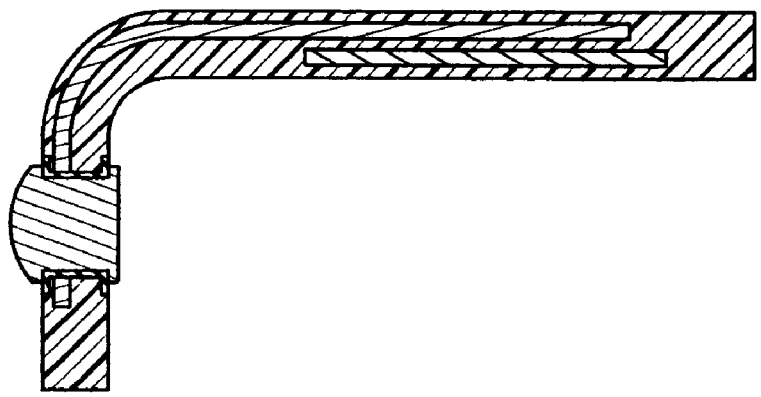
FIG. 17 is a sectional view taken along line C-C of FIG. 16.
Figure 20:
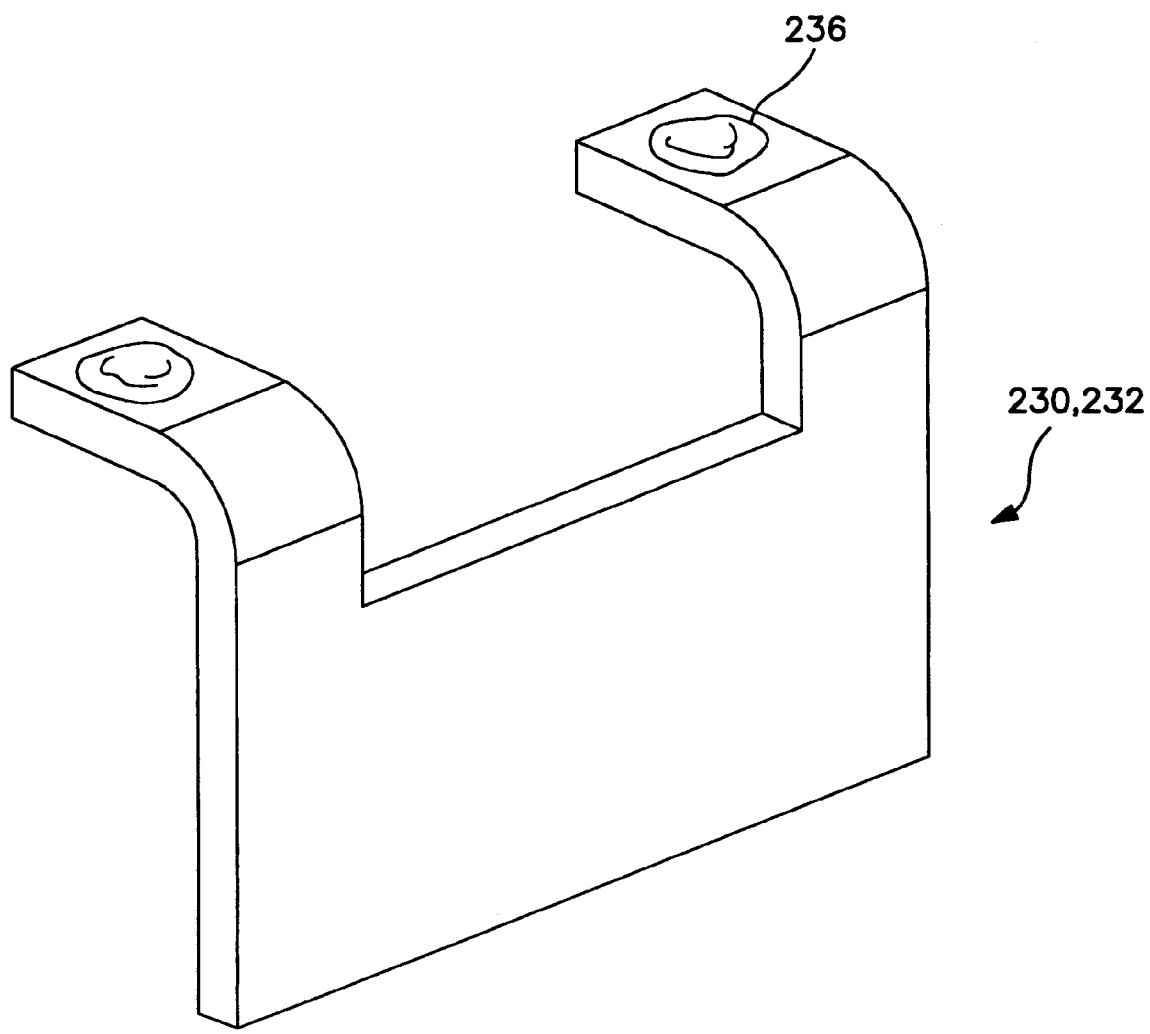
FIG. 20 is a perspective view of another embodiment of a flexible circuit capacitor.
Figure 21:
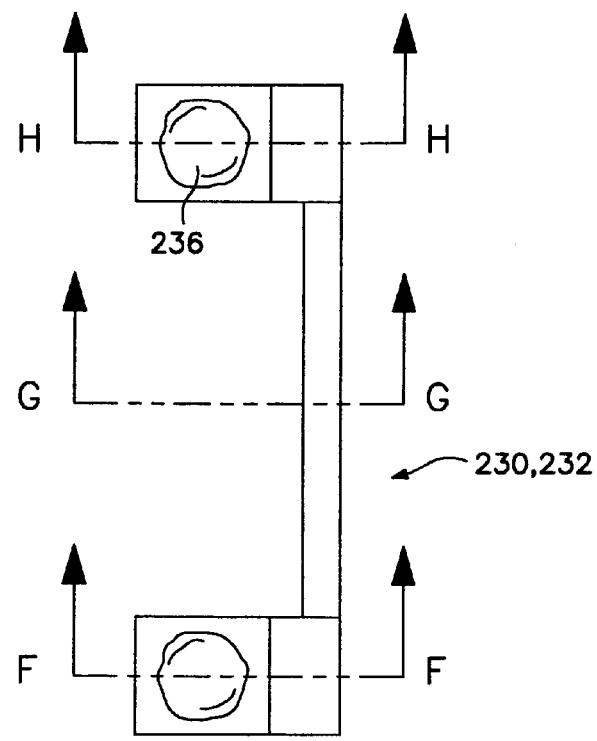
FIG. 21 is a top view of the flexible circuit capacitor of FIG. 20.
Figure 22:
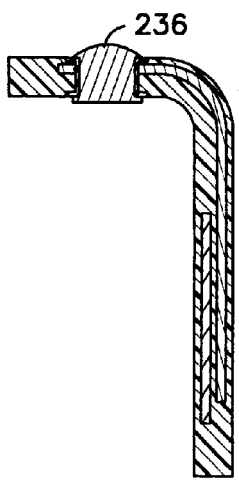
FIG. 22 is a sectional view taken along line F-F of FIG. 21.
Figure 23:
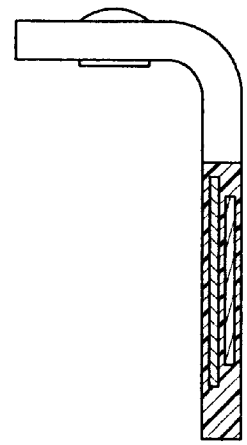
FIG. 23 is a sectional view taken along line G-G of FIG. 21.
Figure 24:
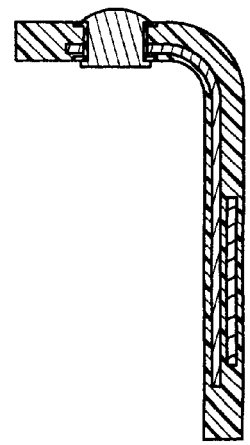
FIG. 24 is a sectional view taken along line H-H of FIG. 21
Figure 25:
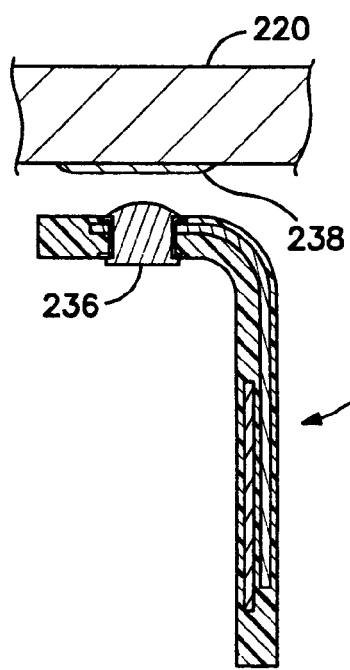
FIGS. 25-27 are sectional views taken along lines F-F, G-G and H-H, respectively, of FIG. 21, showing the flexible circuit capacitor being connected to a contact.
Figure 26:
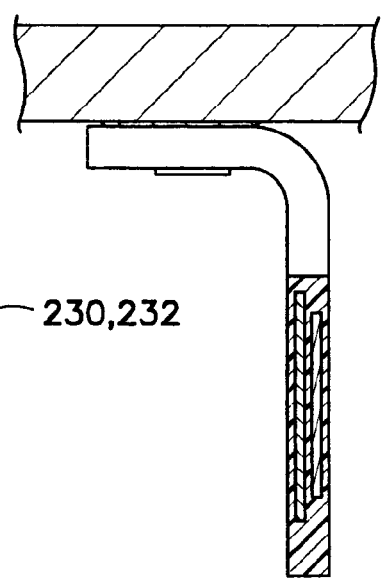
Figure 27:
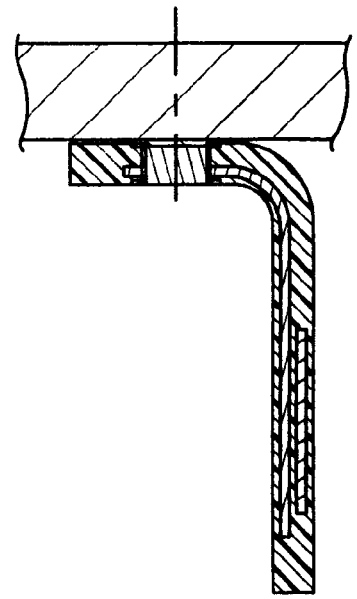

Referring now to FIGS. 12 and 13, another electrical connector 300 implementing the same compensation scheme to reduce NEXT and FEXT according to the present invention is shown. The electrical connector 300 is substantially similar to the previously described electrical connector 200, except that the connection arrangement between the jack and the cable to which it is connected is a "punch down" design. Components of the electrical connector 300 which generally correspond to those components of the electrical connector 200 of FIG. 5 are designated in the three-hundred series. As such, further description of the electrical connector 300 is unnecessary for a complete understanding of the present invention.

The method and apparatus of the present invention provide a compensation technique to cancel or reduce the NEXT and FEXT produced by the electrical connector. In particular, the compensation scheme introduces compensation and crosstalk couplings into the electrical paths of the electrical connector to reduce or cancel the net crosstalk generated by the plug/jack combination.

In the illustrated embodiment, the capacitors 230 and 232 are connected across contacts 220 associated with wire pair 1 (wires 3 and 5) and wire pair 2 (wires 4 and 6). The capacitors 230 and 232 are installed by electrically connecting flexible printed circuit capacitive plates to the respective contacts 220. It will be recognized that the capacitors can be implemented by any suitable capacitive element. Since the capacitance compensation component ($C_2$) is connected at said interface and since the distance from said interface to the effective center of the capacitors is minimized, the phase angle between the offending NEXT of the plug and the NEXT compensation coupling ($C_2$) is minimized.

FIGS. 14-19 illustrate one embodiment of the flexible printed circuit capacitors. These flexible circuit capacitors are made, for example, from a plated film of KAPTON® polyimide film manufactured by DuPont. The capacitors 230 and 232 include a pair of dome-shaped rivets and are attached opposite the plug/jack contact interface via electrical resistance or spot welding.

FIGS. 20-27 illustrate a second embodiment of the flexible printed circuit capacitors 230 and 232. These capacitors include a solder "plug" 236 and are attached to the contacts 220 that may include a pre-tinned area 238.

Figure 28:
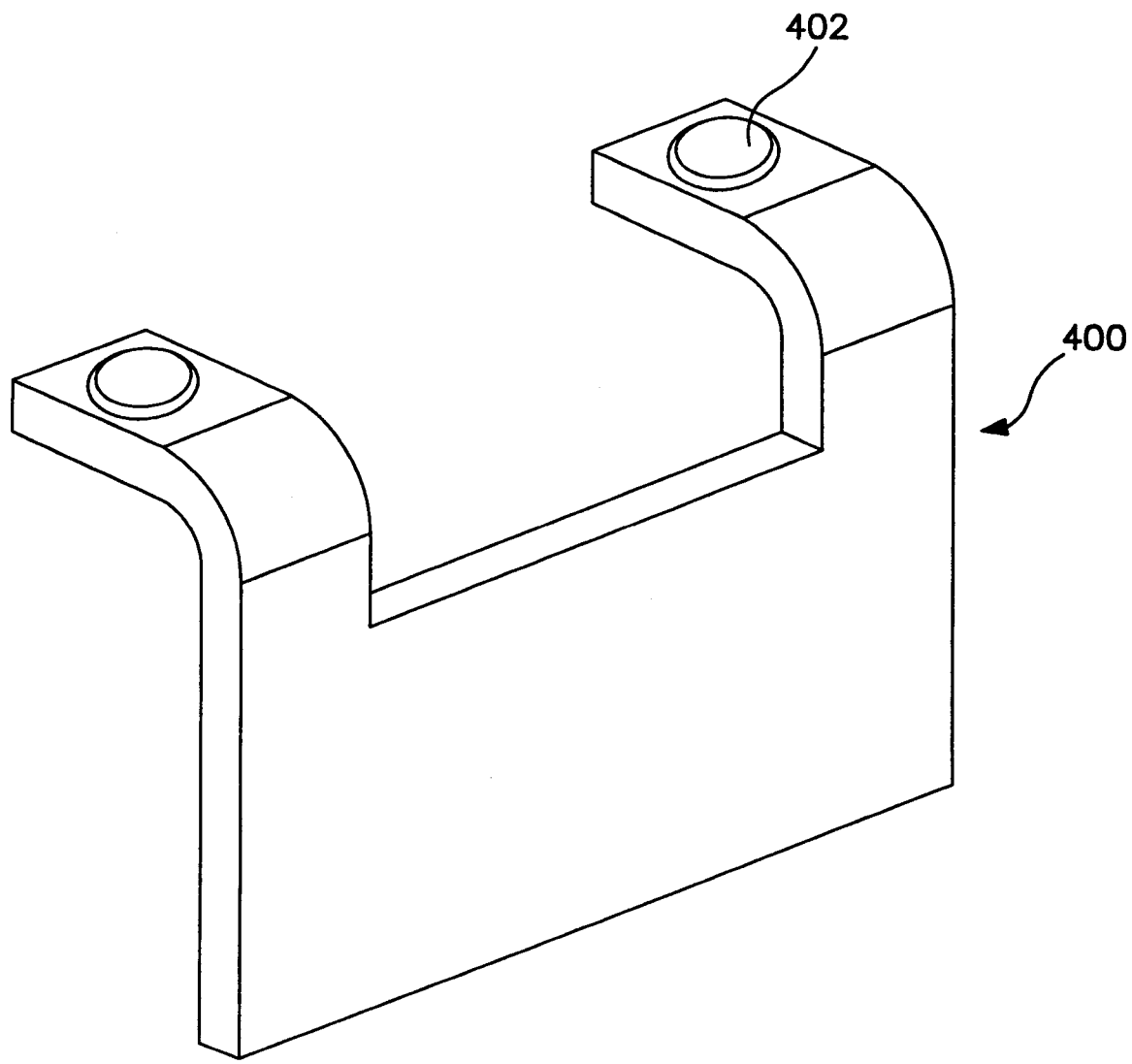
FIG. 28 is a perspective view of a flexible circuit capacitor according to one embodiment of the present invention.
Figure 29:
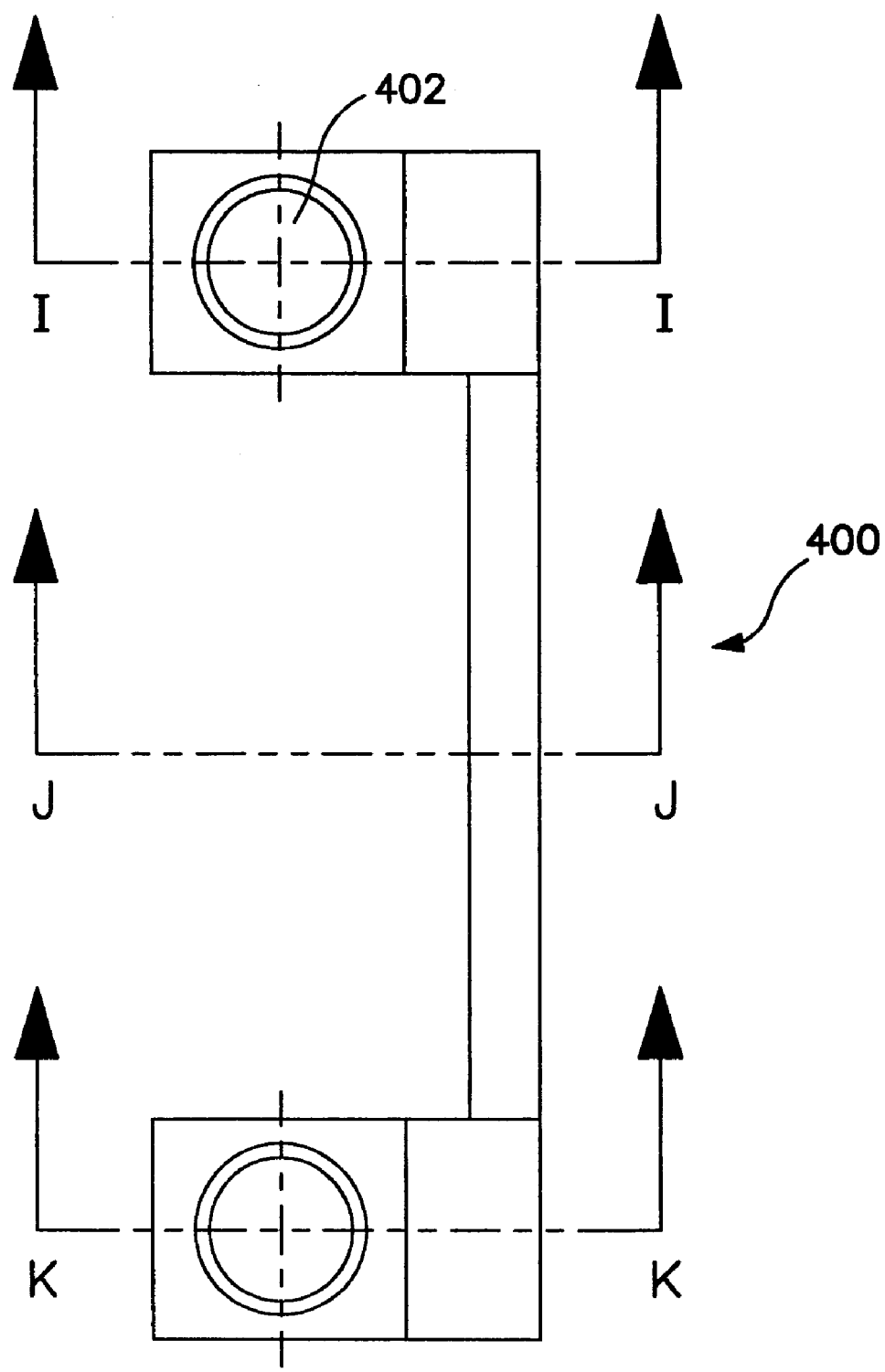
FIG. 29 is a top view of the flexible circuit capacitor of FIG. 28.
Figure 121:
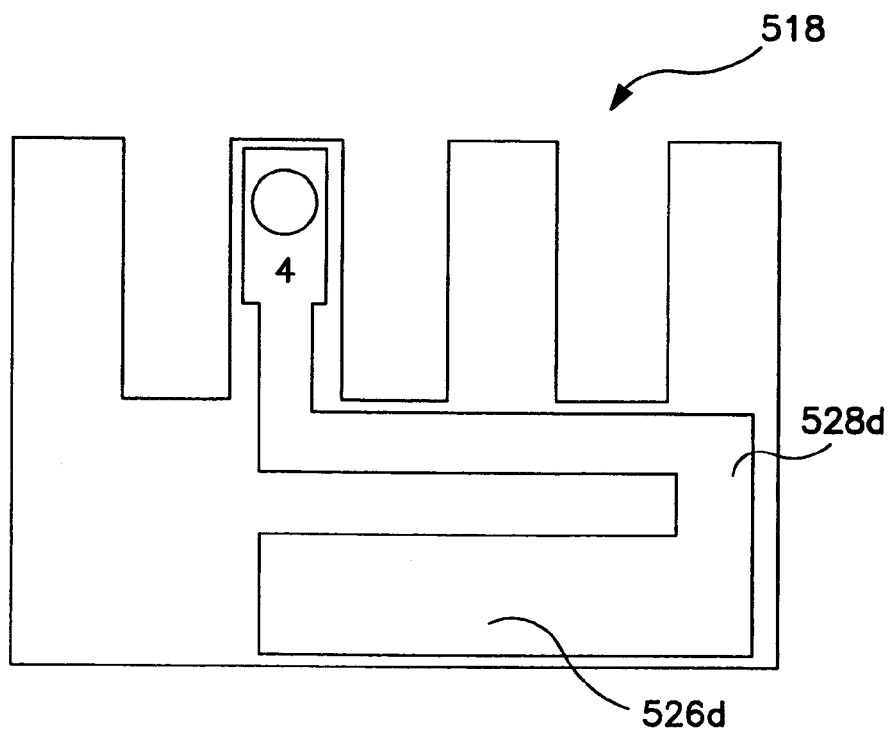

FIGS. 28-121 illustrate additional embodiments of capacitors according to the present invention. FIG. 28 shows a flexible circuit capacitor 400 having solder rivets 402. The solder rivets 402 are pre-formed and mechanically deformed into holes provided at the ends of the capacitor 400. The flexible circuit capacitor 400 attaches to jack contacts by a resistance weld process. FIG. 29 is a top view of the flexible circuit capacitor 400, and FIGS. 30, 31, and 32 are, respectively, cross-sectional views taken along the lines I-I, J-J, and K-K of FIG. 29. As shown in FIG. 30, the solder rivet 402 is inserted in a plated through hole 404. The plated through hole 404 is provided with pads. The rivet 402 has a dome head 406 (shown in FIG. 31), and the rivet 402 is mechanically deformed on the underside as shown in FIGS. 30 and 32.

FIGS. 33, 34, and 35 are cross-sectional views of a flexible circuit capacitor 400 with a solder rivet 402 being attached to a jack contact 408. As shown in FIG. 33, the jack contact 408 may be provided with a pre-tinned region 410 tinned with solder. The flexible circuit capacitor 400 is brought together with the jack contact 408 as shown in FIG. 34 so that the solder rivet 402 makes physical contact with the pre-tinned region 410. Then, as shown in FIG. 35, a welding tool 412 welds the rivet 402 to the contact 408, for example by resistance welding. The welding may be performed simultaneously on several rivet-contact interfaces. The centerline 412c shown in FIG. 35 is preferably located at the plug/jack contact interface.

Figure 36:
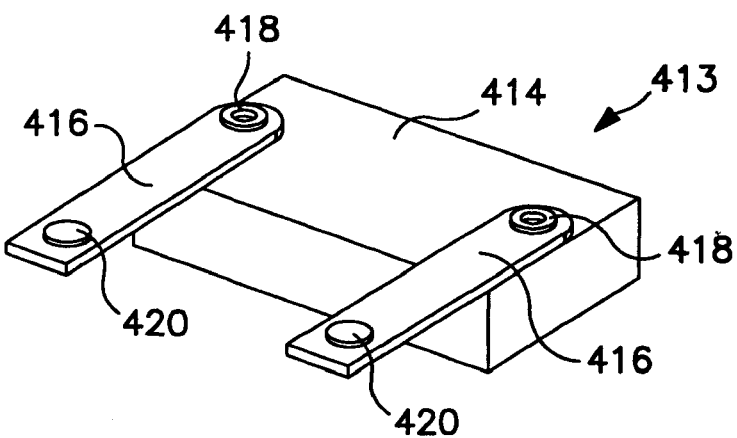
FIG. 36 is a perspective view of a jack contact capacitor according to one embodiment of the present invention.
Figure 37:
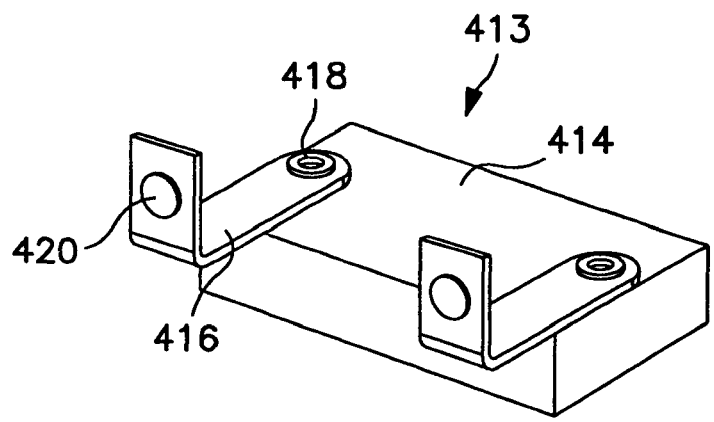
FIG. 37 is a perspective view of a jack contact capacitor with bent contact strips.
Figure 38:
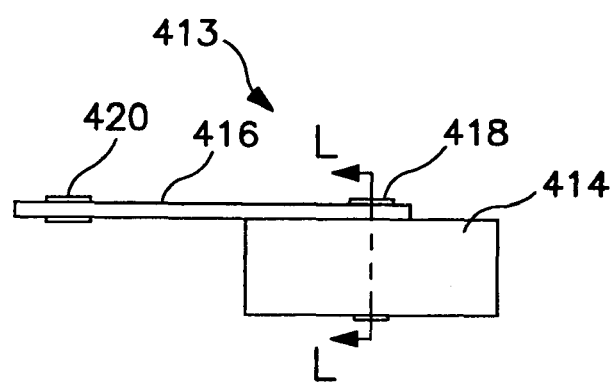
FIG. 38 is a side view of the jack contact capacitor of FIG. 36.

FIG. 36 shows an alternative PCB-type jack contact capacitor 413. The jack contact capacitor 413 can serve as a NEXT compensation zone. In this embodiment, a printed circuit board 414 has contact strips 416 attached to it at eyelets 418. Contact mating areas 420 are also provided on the contact strips 416 for attachment, for example via welding, to contacts of a jack. A similar construction is shown in FIG. 37, with the contact strips 416 bent for alternative mounting of the contact capacitor to a contact. FIG. 38 is a side view of the jack contact capacitor 413 of FIG. 36, and FIG. 39 is a cross-sectional view taken along the line L-L of FIG. 38.

Figure 39:
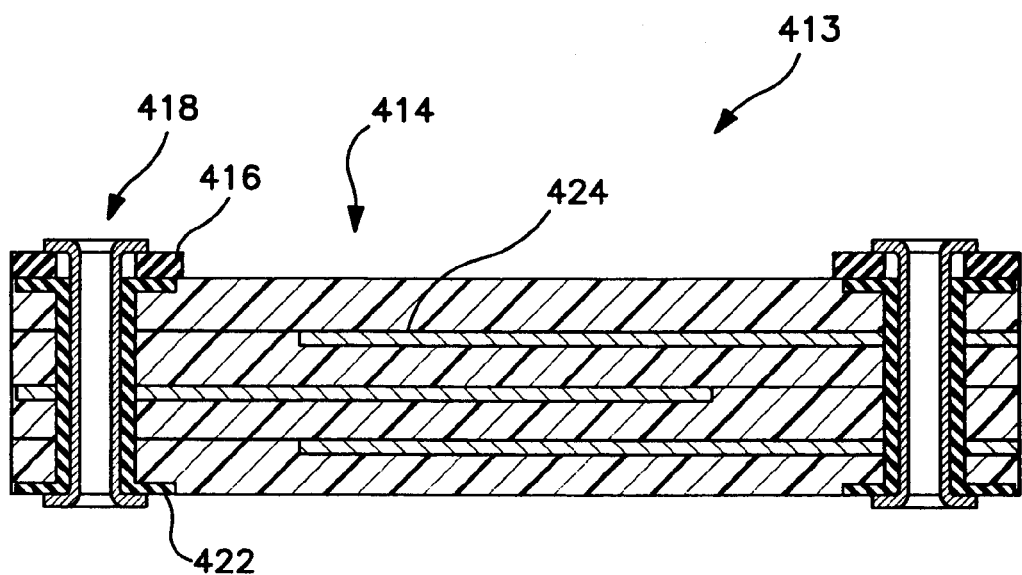
FIG. 39 is a sectional view taken along the line L-L of FIG. 38.
Figure 40:
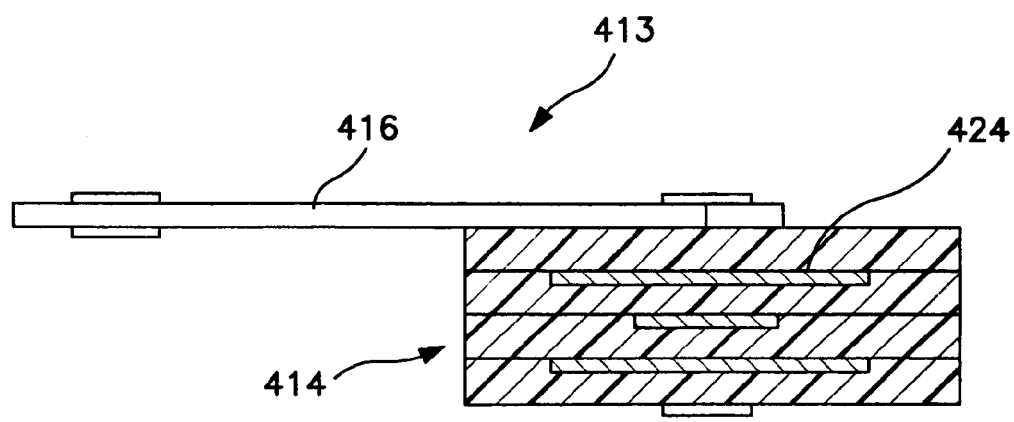
FIG. 40 is a side cutaway view of the jack contact capacitor of FIG. 36.

The cross-sectional view of FIG. 39 shows the contact strip 416 held in place by the eyelet 418 and in electrical contact with a plated through hole 422. Conductors 424 are also in contact with the plated through hole 422 and allow capacitive coupling between contact strips 416 within a printed circuit board 414. FIG. 40 shows a side cutaway view illustrating varying widths of the conductors 424 within the printed circuit board 414.

Figure 41:
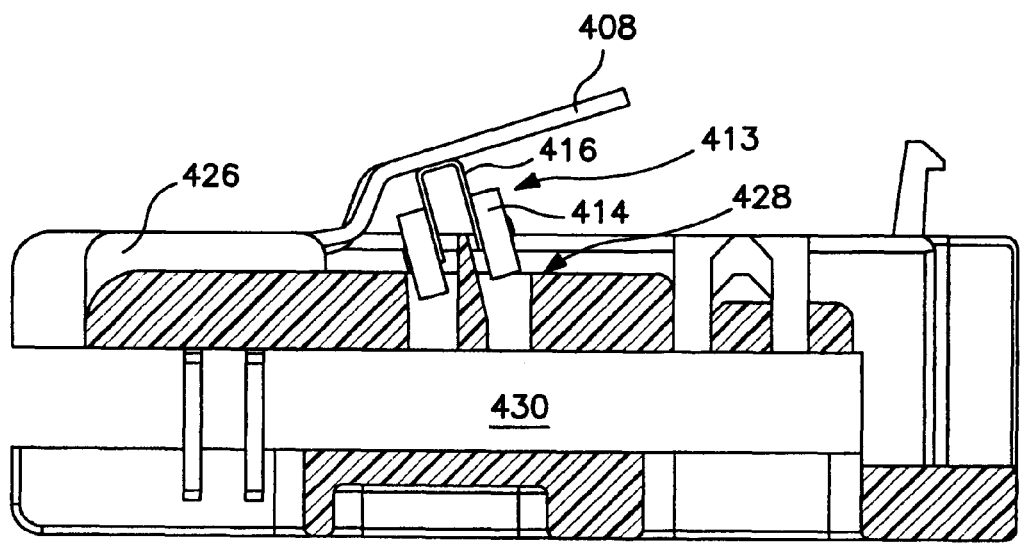
FIG. 41 is a side cutaway view showing contact capacitors mounted to jack contacts in a sled in an unmated position.
Figure 42:
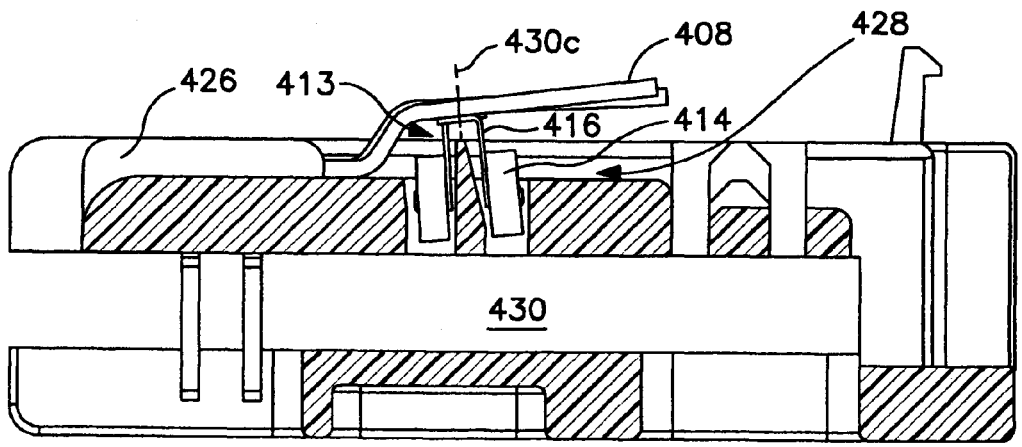
FIG. 42 is a side cutaway view of the contact capacitors mounted to jack contacts in a sled of FIG. 41 showing the jack contacts in a mated position.

FIGS. 41 and 42 are side views of contact capacitors mounted to jack contacts 408 provided in a sled 426. The printed circuit boards 414 of the jack contact capacitors fit within capacitor guides 428 of the sled 426. A sled-mounted printed circuit board 430 may be provided within the sled 426. FIG. 41 shows the jack contacts 408 not mated to a plug and FIG. 42 shows the jack contacts 408 bent downwardly as they would be bent when mated to a plug. A centerline 430c shows the plug/jack contact interface. The contact strips 416 are welded to the contacts 408 directly beneath the plug/jack contact interface, along the centerline 430c.

Figure 43:
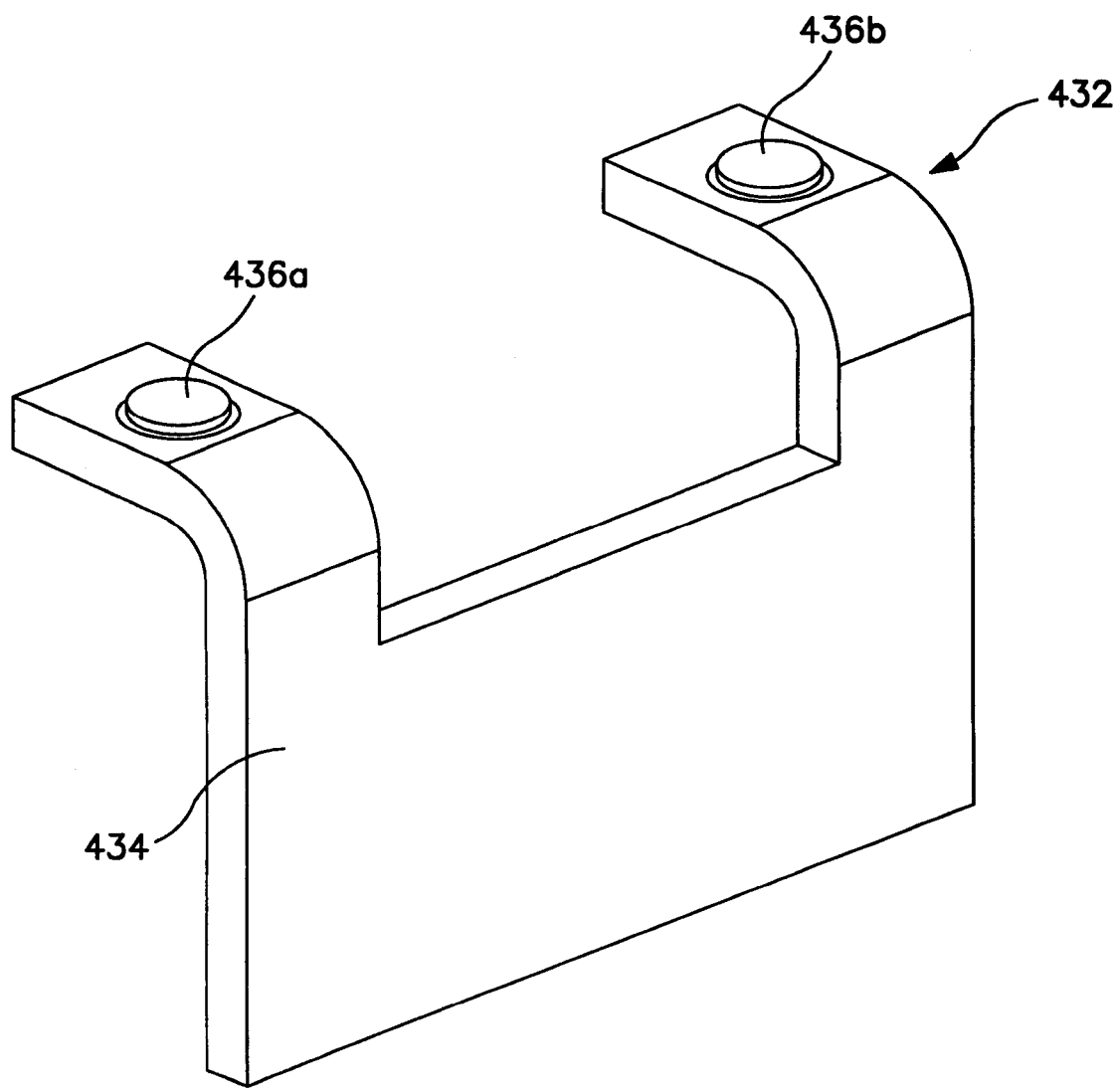
FIG. 43 is a perspective view of a jack contact capacitor according to one embodiment of the present invention.
Figure 44:
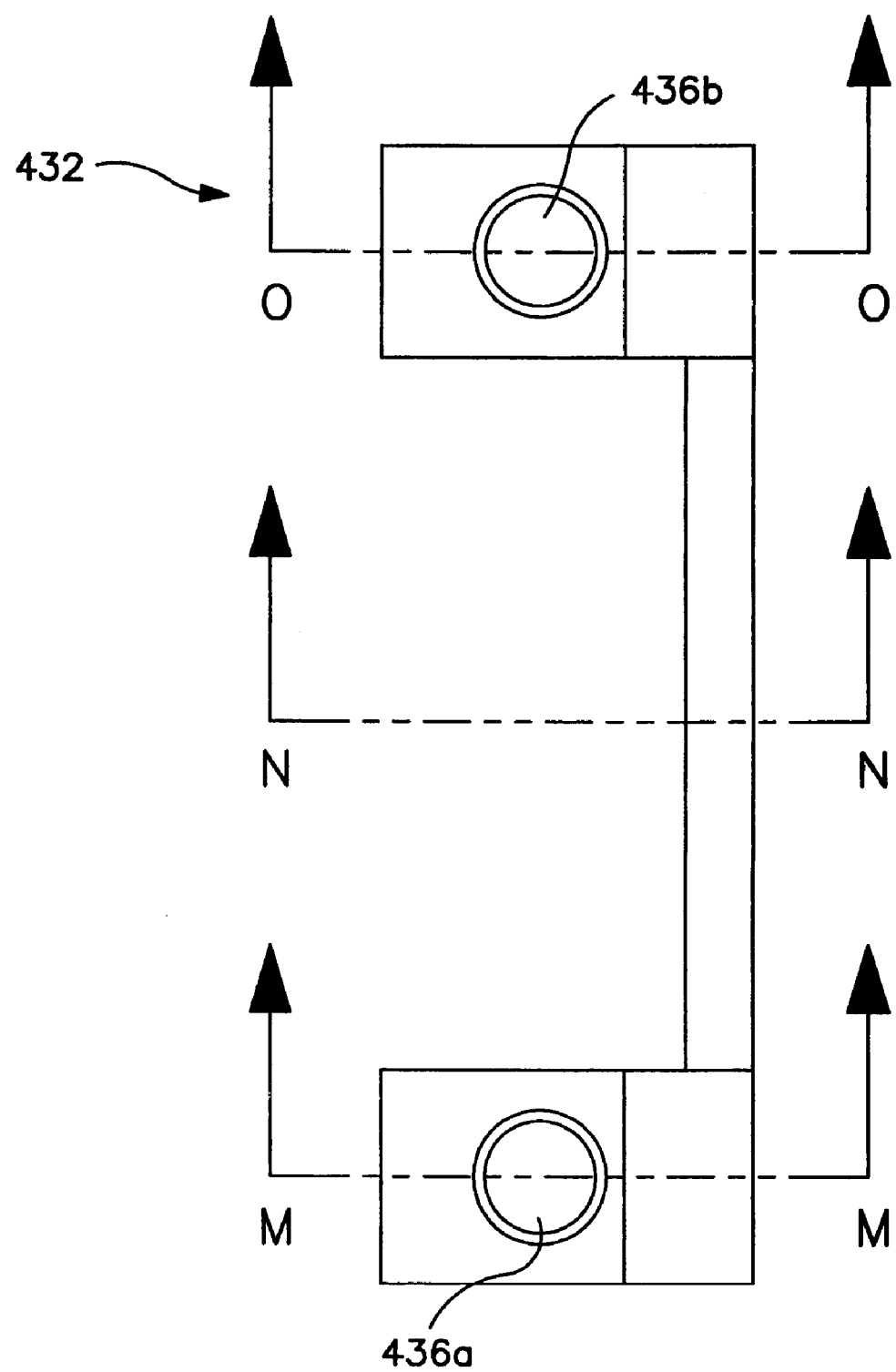
FIG. 44 is a top view of the jack contact capacitor of FIG. 43.
Figure 47:
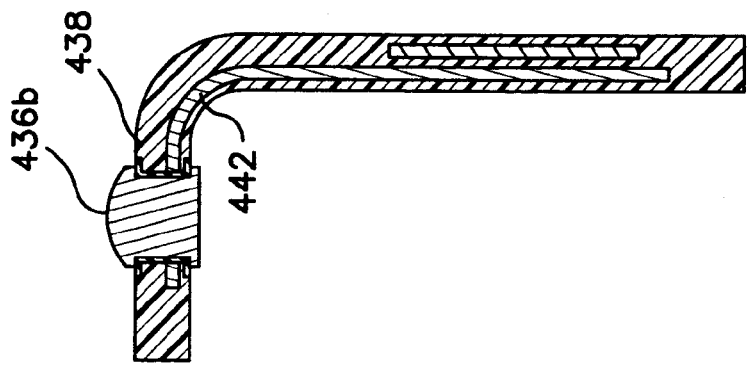
FIG. 47 is a sectional view taken along the line O-O of FIG. 44.
Figure 46:
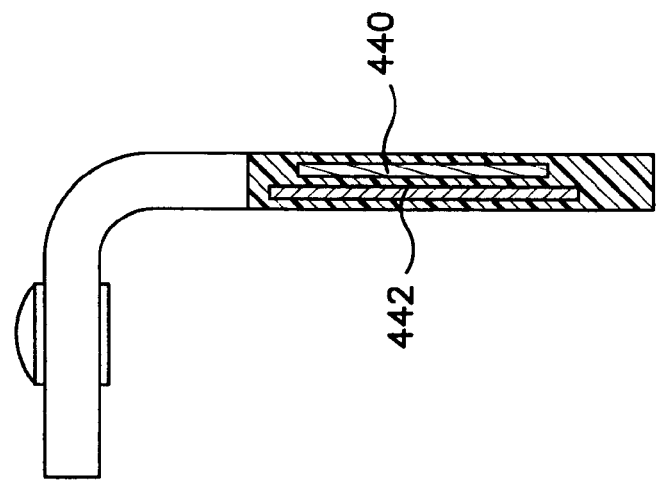
FIG. 46 is a sectional view taken along the line N-N of FIG. 44.
Figure 45:
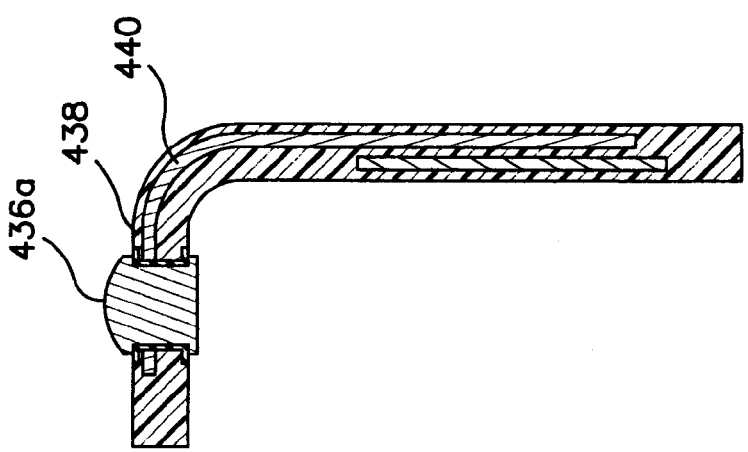
FIG. 45 is a sectional view taken along the line M-M of FIG. 44.

Turning now to FIG. 43, another embodiment of a jack contact capacitor 432 for implementing a NEXT compensation zone is shown. In the embodiment of FIG. 43, a flexible printed circuit 434 is adapted for connection to jack contacts via rivets 436a and 436b. The rivets 436a and 436b are preferably provided with domed heads. FIG. 44 is a top view of the jack contact capacitor 432, and FIGS. 45-47 are, respectively, cross-sectional views taken along the lines M-M, N-N, and O-O of FIG. 44. As shown in FIG. 45, a plated through hole 438 allows for electrical connection between a first rivet 436a and a first conductive plate 440. Further, as shown in FIG. 47, another plated through hole 438 allows for electrical connection between a second rivet 436b and a second conductive plate 442. FIG. 46 shows a cross-sectional view of a region of capacitive coupling between the first conductive plate 440 and the second conductive plate 442.

Figure 48:
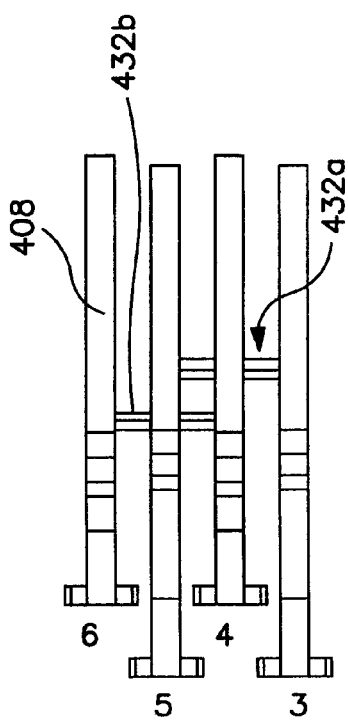
FIG. 48 is a top view of jack contact capacitors attached to jack contacts.
Figure 50:
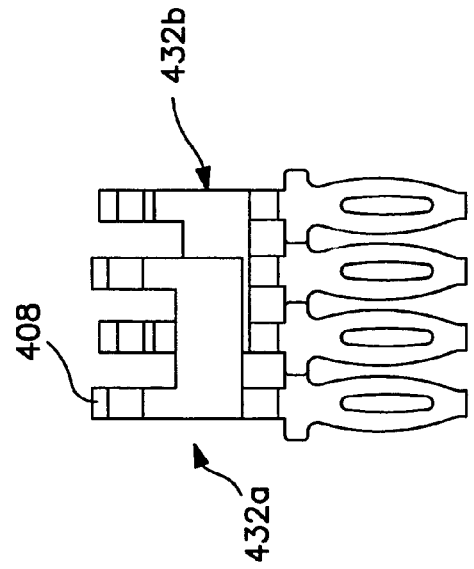
FIG. 50 is a rear view of jack contact capacitors attached to jack contacts.
Figure 49:
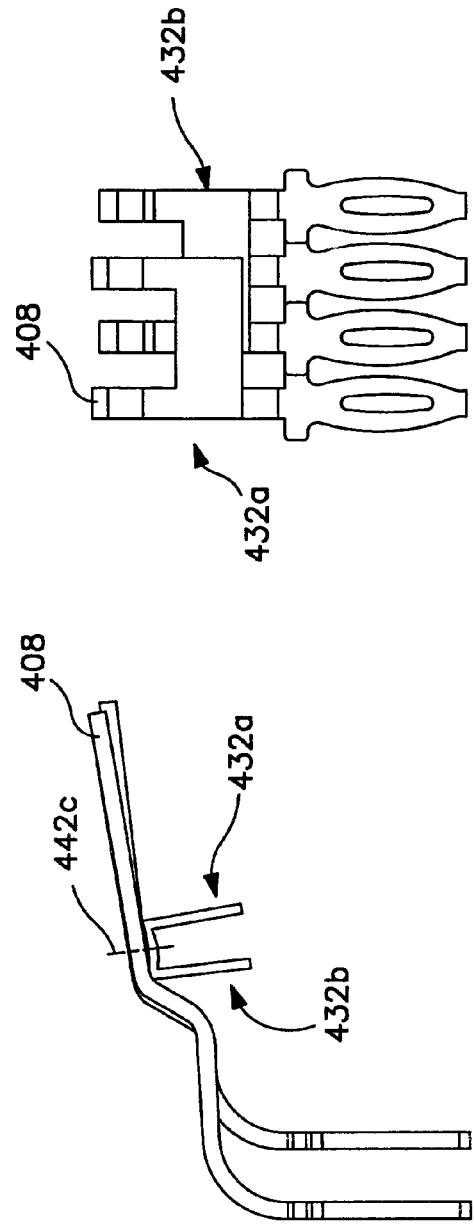
FIG. 49 is a side view of jack contact capacitors attached to jack contacts.
Figure 51:
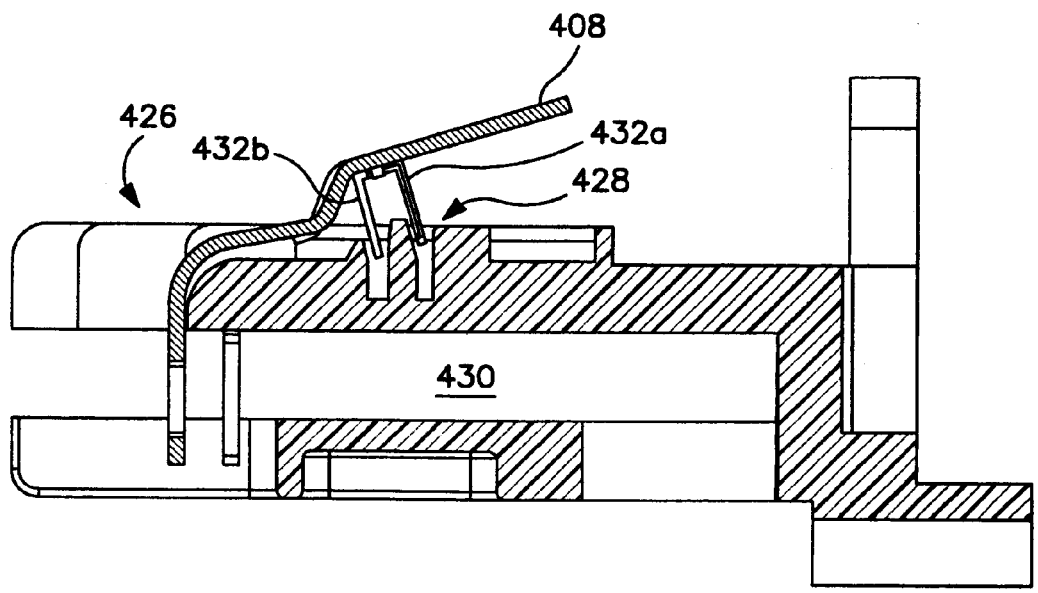
FIG. 51 is a side cutaway view of jack contact capacitors attached to jack contacts in a sled in an unmated position.
Figure 52:
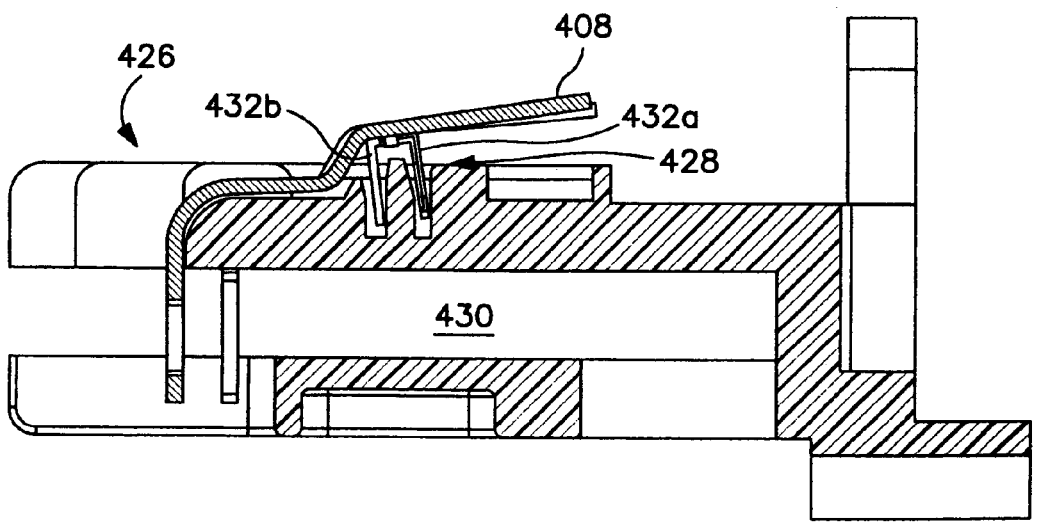
FIG. 52 is a side cutaway view of jack contact capacitors attached to jack contacts in a sled in a mated position.

FIGS. 48-50 show jack contact capacitors 432a and 432b attached to jack contacts 408. FIG. 48 is a top view of jack contacts 408 attached to jack contact capacitors 432a and 432b, and FIG. 49 is a side view of the assembly of FIG. 48 and FIG. 50 is a rear view of the assembly of FIG. 48. Contacts 3, 4, 5, and 6 of an eight-contact jack are shown. A centerline 442c of the welding between the jack contacts 408 and the jack contact capacitors 432a and 432b aligns with a plug/jack contact interface. The jack contact capacitors 432a and 432b are welded to the jack contacts 408 at a side opposite the plug/jack contact interface. Jack contact capacitors 432a and 432b can be attached to jack contacts 408 and mounted within a sled 426 as shown in FIGS. 51 and 52. FIG. 51 shows the position of jack contacts 408 when a plug is not mated to the jack contacts 408 and FIG. 52 shows the position of jack contacts mated with a plug. A printed circuit board 430 may be provided within the sled 426. Capacitor guides 428 are positioned to accept the jack contact capacitors 432a and 432b.

Another embodiment of a jack contact capacitor is shown in FIGS. 53a-56. According to this embodiment of the present invention, jack contact capacitors 444a and 444b are adhesively mounted to jack contacts 408. FIG. 53a shows jack contact capacitors 444a and 444b mounted to jack contacts 408. Jack contacts 3, 4, 5, and 6 of an eight-contact jack are shown. FIG. 53b shows the jack contact capacitors 444a and 444b separated from the jack contacts 408, and FIG. 54 is a detail view of the detail "P" of FIG. 53b. As shown in FIG. 54, adhesive areas 446 are provided on contact strips 416 of the jack contact capacitors 444a and 444b. The adhesive areas 446 allow for an adhesive connection to be made between the jack contact capacitors 444a and 444b and the jack contacts 408. The resulting assembly can be mounted on a sled 426 as shown in FIG. 55, with capacitor guides 428 accepting the jack contact capacitors 444a and 444b. The adhesive areas 446 are located directly beneath a plug/jack contact interface. FIG. 56 is a rear view of a jack-and-capacitor assembly according to this embodiment of the invention.

Figure 57:
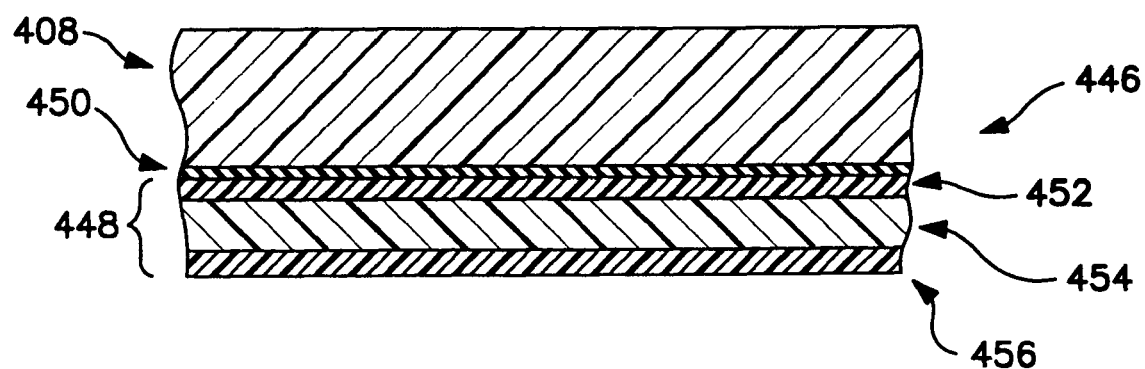
FIG. 57 is a side cutaway view of an adhesive area of a jack contact capacitor connected to a jack contact.
Figure 58:
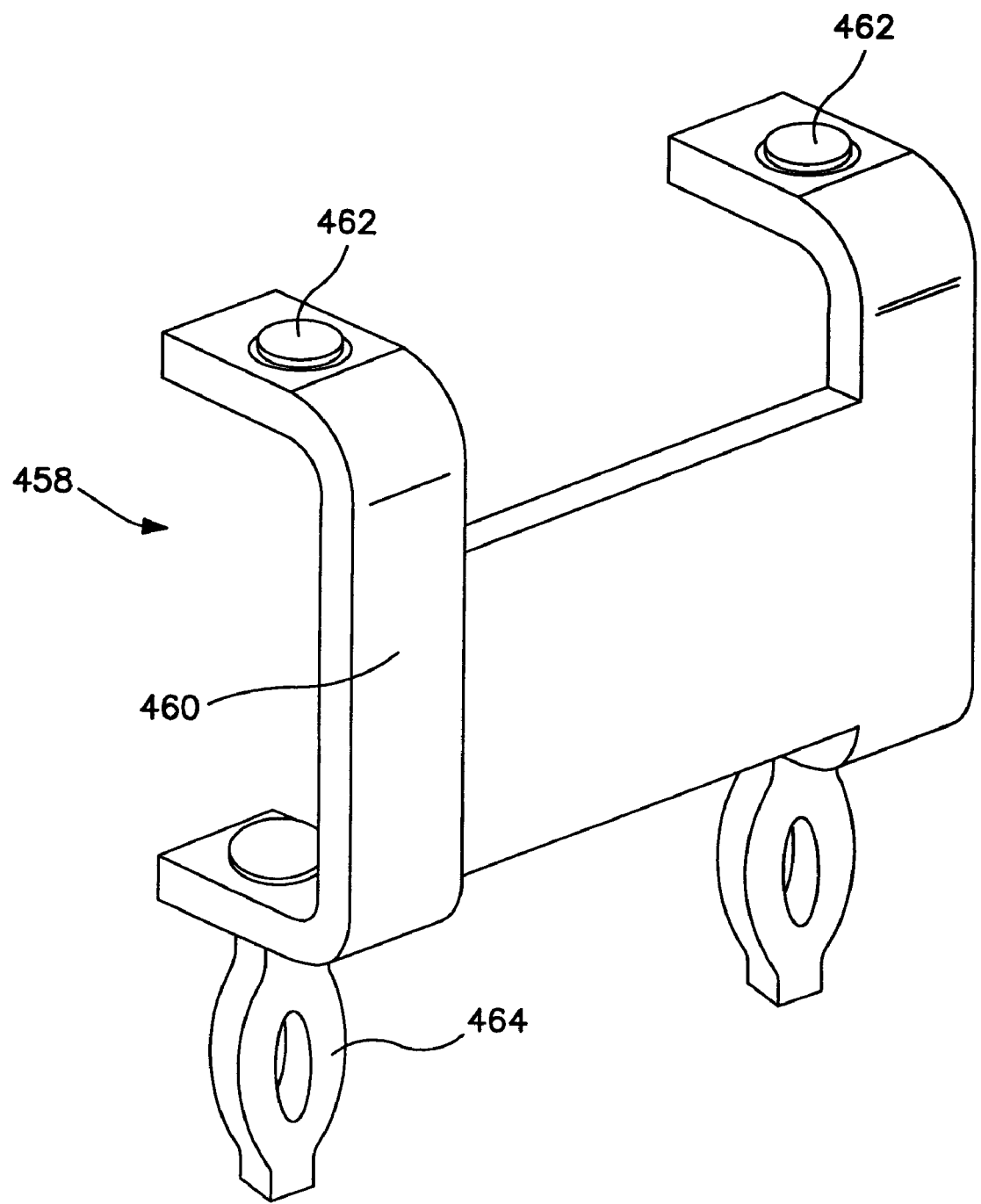
FIG. 58 is a perspective view of a flexible circuit according to one embodiment of the present invention.

According to one embodiment, the jack contact capacitors 444a and 444b are formed with flexible printed circuits 448, as shown in FIG. 54. FIG. 57 shows a side cutaway view of an adhesive area 446 of a jack contact capacitor 444 connected to a jack contact 408. Adhesive 450 is placed between a first dielectric layer 452, such as a layer of MYLAR® PET film manufactured by DuPont, and a jack contact 408. A conductor pattern 454 is layered between the first dielectric layer 452 and a second dielectric layer 456. The conductor pattern 454 is layered between the first and second dielectric layers 452 and 456 in a flexible printed circuit 448. The jack contact capacitors 444a and 444b are adhesively bonded to alternate jack contacts. For example, jack contact capacitor 444a may be bonded to jack contact pair 3-5 and jack contact capacitor 444b may be bonded to jack contact pair 4-6. This construction creates a capacitor by means of the conductor material 454 in the laminate form and the contact 408 itself. Two contacts are then coupled by two capacitors in series. Total capacitance between contacts is ½ the value of each capacitor. The thickness and dielectric constant of the adhesive are included in the calculations.

FIGS. 58-61 show a NEXT compensation zone and flexible circuit contact shunt according to one embodiment of the present invention. A flexible NEXT compensation circuit 458 comprises a capacitor flexible circuit 460 adapted to connect to jack contacts via contact weld rivets 462 and further adapted to make electrical contact with a printed circuit board via printed-circuit-board compliant pins 464. In the embodiment shown in FIG. 58, capacitive coupling between two contacts may be accomplished within a capacitor flexible circuit 460. Turning to FIG. 59, a flexible shunt 466 is shown. The flexible shunt 466 is provided with rivets 462 on flexible members 463 for connection to jack contacts and with PCB-compliant pins 464 for connection to a printed circuit board. A side view of the flexible shunt 466 is shown in FIG. 60. FIG. 61 is a side view illustrating the placement of a flexible shunt 466 between jack contacts 468 and a printed circuit board 470. A segment of a plug 471 is shown, and the plug/jack contact interface 473 is directly above the location of attachment of the rivets 462 to the jack contacts 468. FIG. 62 is a cross-sectional view of the flexible shunt 466 along the line Q-Q of FIG. 59. A conductive trace 472, such as a copper trace, is surrounded by a dielectric 474 such as KAPTON® polyimide film manufactured by DuPont. The use of a flexible circuit shunt 466 shortens the current path from the plug 471 to the PCB 470. FIGS. 59-62 show a flexible shunt 466 providing electrical connection only, with no capacitor plates. The use of a flexible circuit shortens the current path from the plug 471 to the printed circuit board 470. For example, the signal length $x_2$ shown in FIG. 61 is less than the signal length $x_1$.

FIGS. 63-72 show an alternative flexible circuit capacitor 476 for implementing a NEXT compensation zone. FIG. 63 is a perspective view of two flexible circuit capacitors 476a and 476b having domed rivets 478 for attachment to first through eighth jack contacts as labeled in FIG. 63. FIG. 64 is a detail view of the detail "R" of FIG. 63 showing a domed rivet 478 adapted for welded attachment to a jack contact and a plated through hole 480 for establishing electrical connection between a jack contact and capacitive plates 482, shown as dotted lines in FIG. 63. FIG. 65 is a top view of the flexible circuit capacitor 476 more clearly showing the arrangement of the capacitive plates 482 and FIG. 65 is a side view of the flexible circuit capacitor 476, showing a 90° bend 475.

Figure 67:
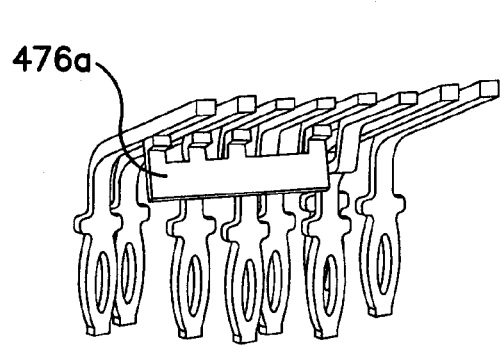
FIG. 67 is a perspective view of a flexible circuit capacitor of FIG. 63 attached to jack contacts.
Figure 68:
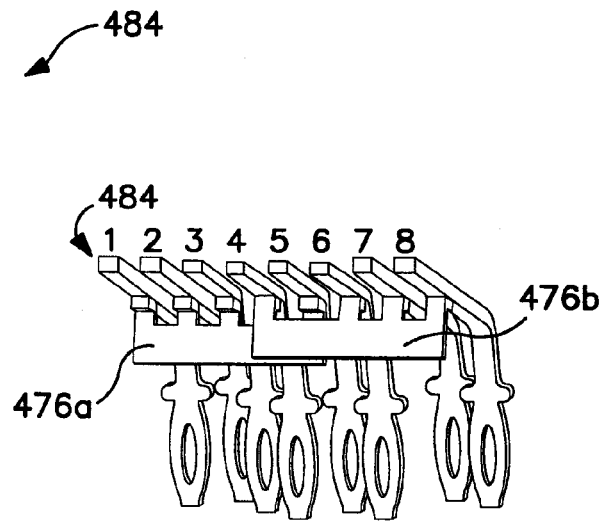
FIG. 68 is a perspective view of the flexible circuit capacitors of FIG. 63 attached to jack contacts.
Figure 69:
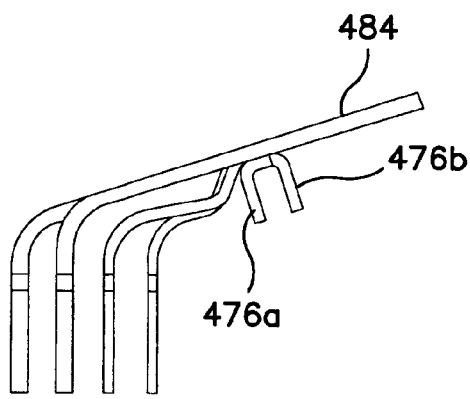
FIG. 69 is a side view of the flexible circuit capacitors of FIG. 63 attached to jack contacts.
Figure 70:
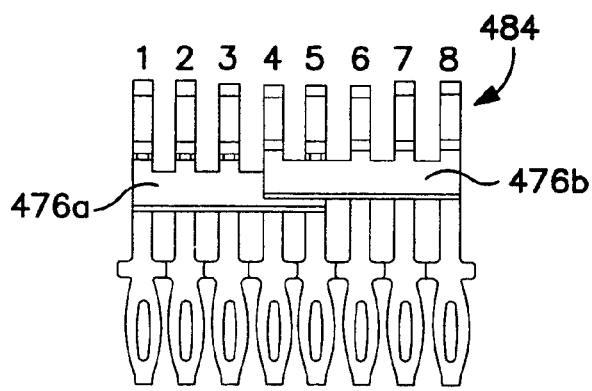
FIG. 70 is a rear view of the flexible circuit capacitors of FIG. 63 attached to jack contacts.

FIG. 67 is a perspective view showing a flexible circuit capacitor 476a attached to four jack contacts 484. FIG. 68 is another perspective view, showing an additional flexible circuit capacitor 476b attached to the other four jack contacts 484. The two flexible circuit capacitors 476a and 476b partially overlap each other. FIGS. 69 and 70 are respectively side and rear views showing the flexible circuit capacitors 476a and 476b attached to the jack contacts 484. A first flexible circuit capacitor 476a is attached to first, second, third, and fifth jack contacts 484, and a second flexible circuit capacitor 476b is attached to fourth, sixth, seventh, and eighth jack contacts 484 as shown in FIGS. 68 and 70.

Figure 71:
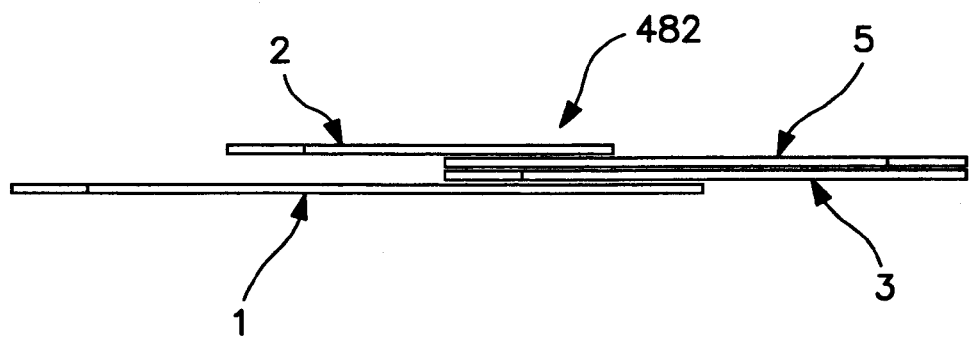
FIG. 71 is an end view showing the overlap of capacitive plates in a flexible circuit capacitor of FIG. 63.
Figure 72:
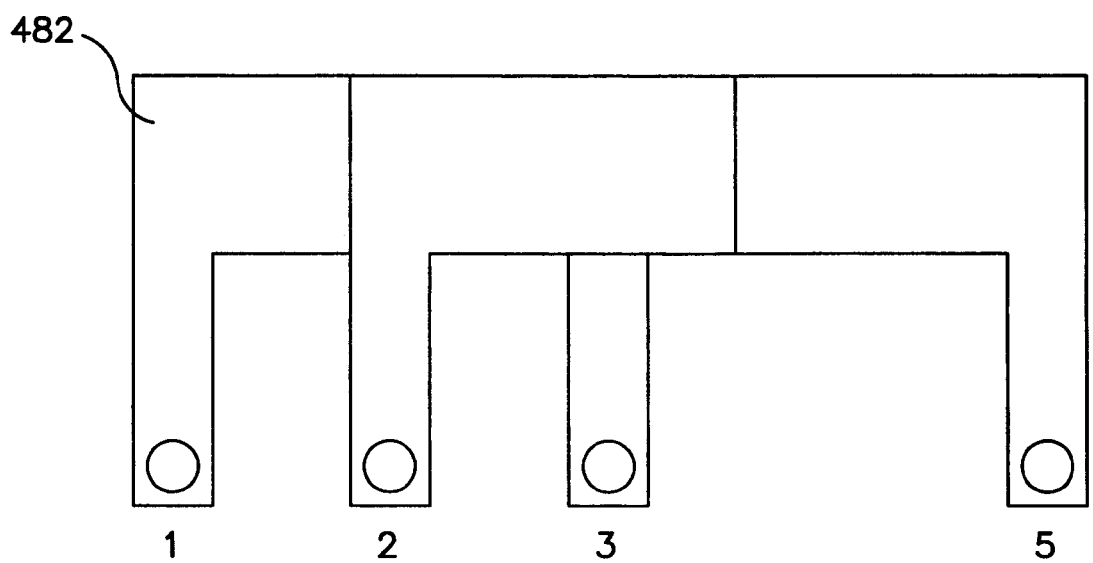
FIG. 72 is a plan view showing the overlap of capacitive plates in a flexible circuit capacitor of FIG. 63.

The overlap of capacitive plates within a flexible circuit capacitor 476 is shown in FIGS. 71 and 72. FIGS. 71 and 72 show the flexible circuit capacitor for connection to first, second, third, and fifth jack contacts; the capacitors connected to eighth, seventh, sixth, and fourth contacts are a mirror image of the illustrated capacitors. All pair combinations except for 1,2-7,8 are included. The flexible circuit capacitors 476a and 476b are welded to the bottom of jack contacts directly below the plug/jack contact interface.

Figure 74:
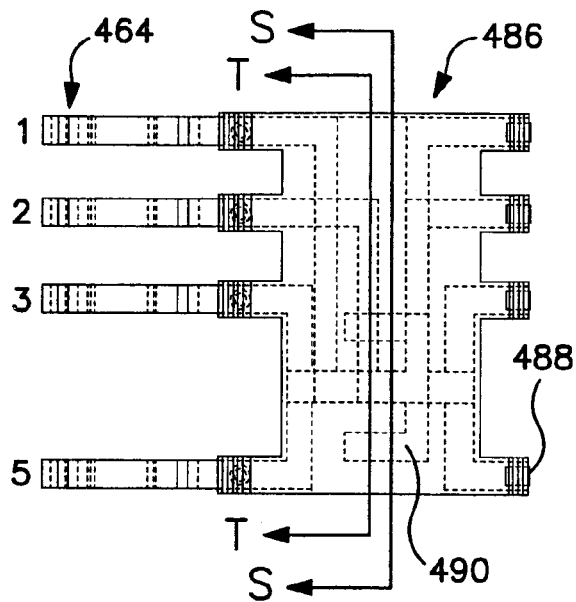
FIG. 74 is a plan view of the flexible printed circuit of FIG. 73.
Figure 73:
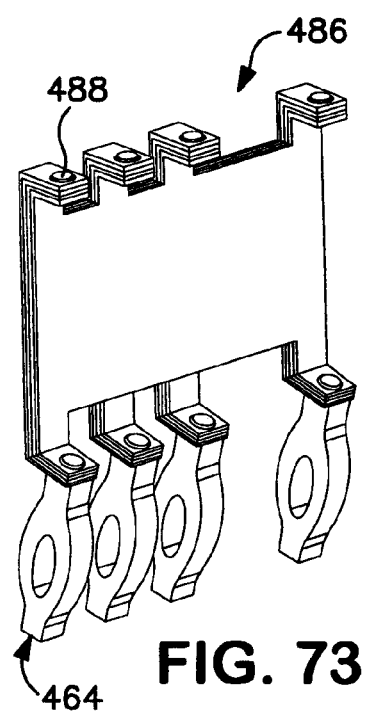
FIG. 73 is a perspective view of a flexible printed circuit according to one embodiment of the present invention.

Turning now to FIGS. 73-88, a flexible printed circuit 486 with a capacitive and inductive NEXT compensation zone is shown. FIG. 73 is a perspective view of a flexible printed circuit 486 with rivets 488 for connection to jack contacts and printed-circuit-board compliant pins 464 for connection to a printed circuit board. The flexible printed circuit 486 can flex between jack contacts and a printed circuit board when a plug is mated to jack contacts, and the rivets 488 are welded directly beneath a plug/jack contact interface. FIG. 74 is a plan view of a flexible printed circuit 486 showing conductive pathways 490 with dotted lines. A flexible printed circuit 486 for providing a NEXT compensation zone for conductors 1, 2, 3, and 5 is shown; a flexible printed circuit for providing a NEXT compensation zone for conductors 4, 6, 7, and 8 is a mirror image of the shown flexible printed circuit 486. Conductive pathways 490 are provided within the flexible printed circuit 486 such that the flexible printed circuit 486 provides both capacitive and inductive NEXT compensation on all conductor pairs except 1,2-7,8.

Figure 76:
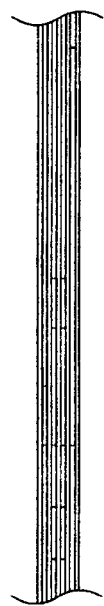
FIG. 76 is a sectional view taken along the line T-T of FIG. 74.
Figure 75:
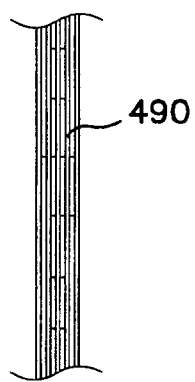
FIG. 75 is a sectional view taken along the line S-S of FIG. 74.
Figure 80:
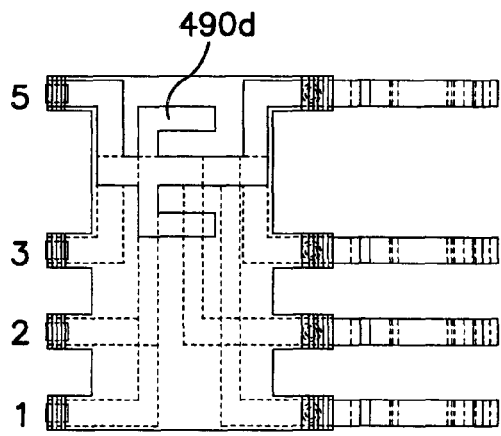
FIGS. 77-80 are plan views respectively showing conductive pathways associated with first, second, third, and fifth conductors of an eight-conductor jack.
Figure 79:
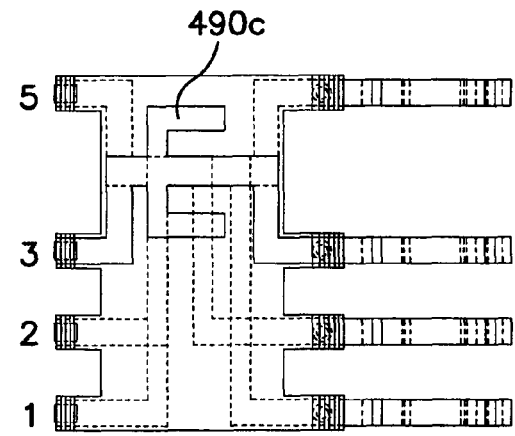
Figure 78:
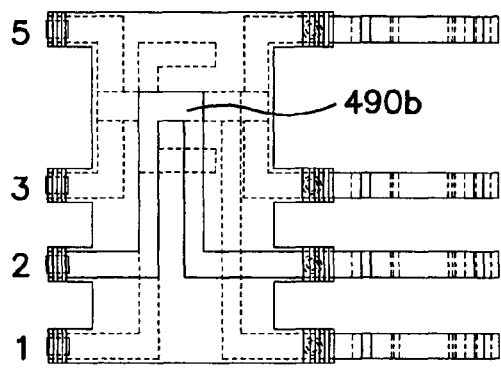
Figure 77:
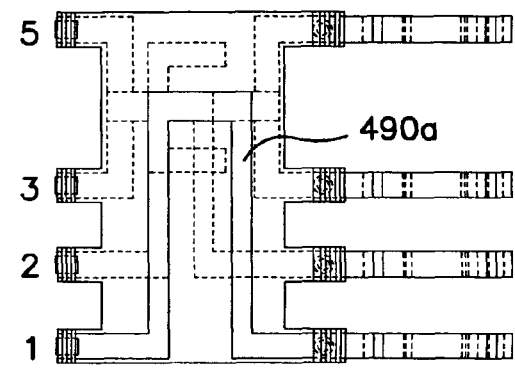

FIG. 75 is a cross-sectional view along the line S-S of FIG. 74 and FIG. 76 is a cross-sectional view along the line T-T of FIG. 74. These views show the positioning of conductive pathways 490 along first and second cross-sections of the flexible printed circuit 486.

FIGS. 77-80 are plan views respectively showing in solid lines the conductive pathways 490a-490d associated with first, second, third, and fifth conductors of an eight-conductor jack.

Figure 81:
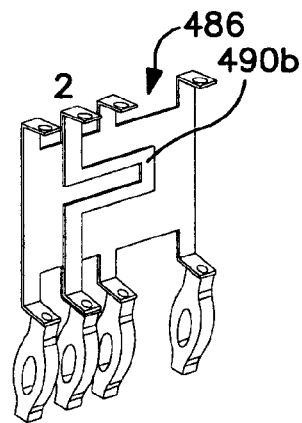
FIGS. 81-84 are perspective views progressively showing conductive pathways of the flexible printed circuit of FIG. 73.
Figure 82:
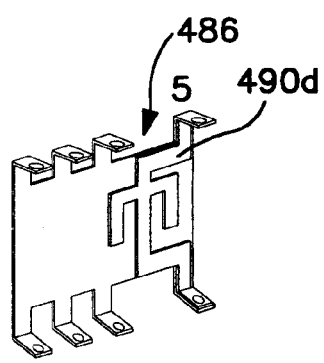
Figure 83:
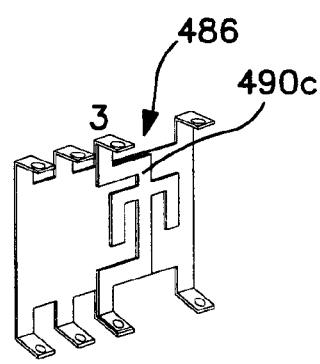
Figure 84:
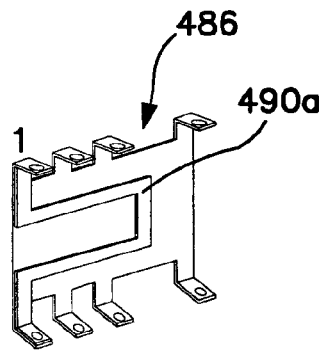
Figure 85:
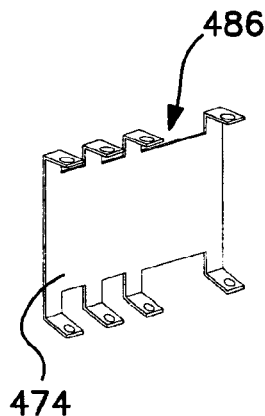
FIG. 85 is a perspective view showing a dielectric layer according to one embodiment of the present invention.

FIGS. 81-84 progressively show conductive pathways 490 of the flexible printed circuit 486 as printed on the flexible printed circuit 486 from the lowermost to the uppermost conductive pathway. FIG. 81 shows the lowermost conductive pathway 490b associated with the second conductor. FIG. 82 shows the second lowermost conductive pathway 490d associated with the fifth conductor. FIG. 83 shows the second uppermost conductive pathway 490c associated with the third conductor. FIG. 84 shows the uppermost conductive pathway 490a associated with the first conductor. FIG. 85 shows a dielectric layer 474 such as a layer of Kapton polyimide film manufactured by DuPont. The flexible circuit 486 is formed by overlapping these layers.

Figure 88:
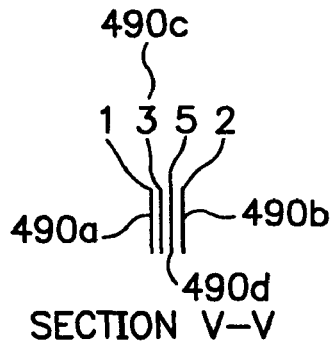
FIG. 88 is a sectional view taken along the line V-V of FIG. 86.
Figure 87:
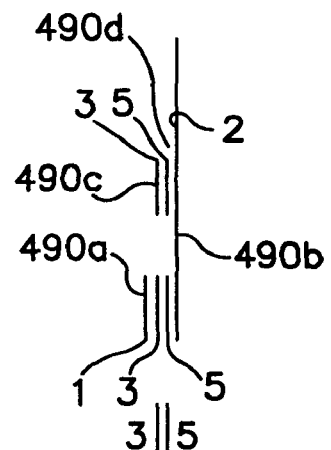
FIG. 87 is a sectional view taken along the line U-U of FIG. 86.
Figure 86:
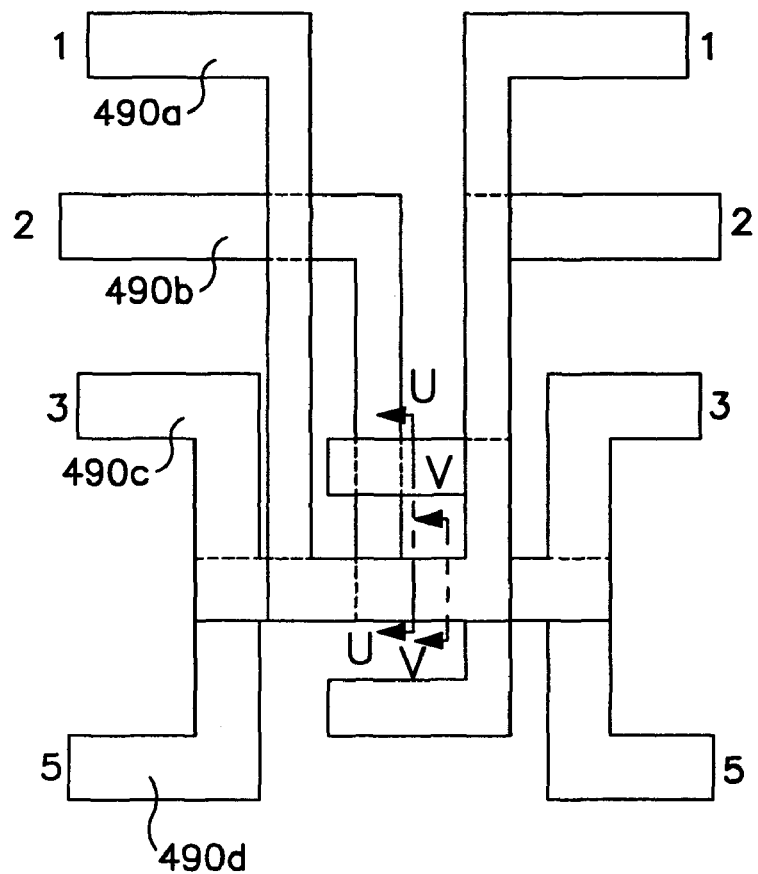
FIG. 86 is a plan view showing conductive pathways in the flexible printed circuit of FIG. 73.

FIG. 86 is another plan view of the conductive pathways 490a-490d, and FIGS. 87 and 88 are respectively cutaway views along the lines U-U and V-V of FIG. 86 showing the overlapping of the conductive pathways 490a-d. Capacitive plates for the first conductor adjacent capacitive plates for the third conductor and capacitive plates for the second conductor adjacent capacitive plates for the fifth conductor may be added as required.

Figure 89:
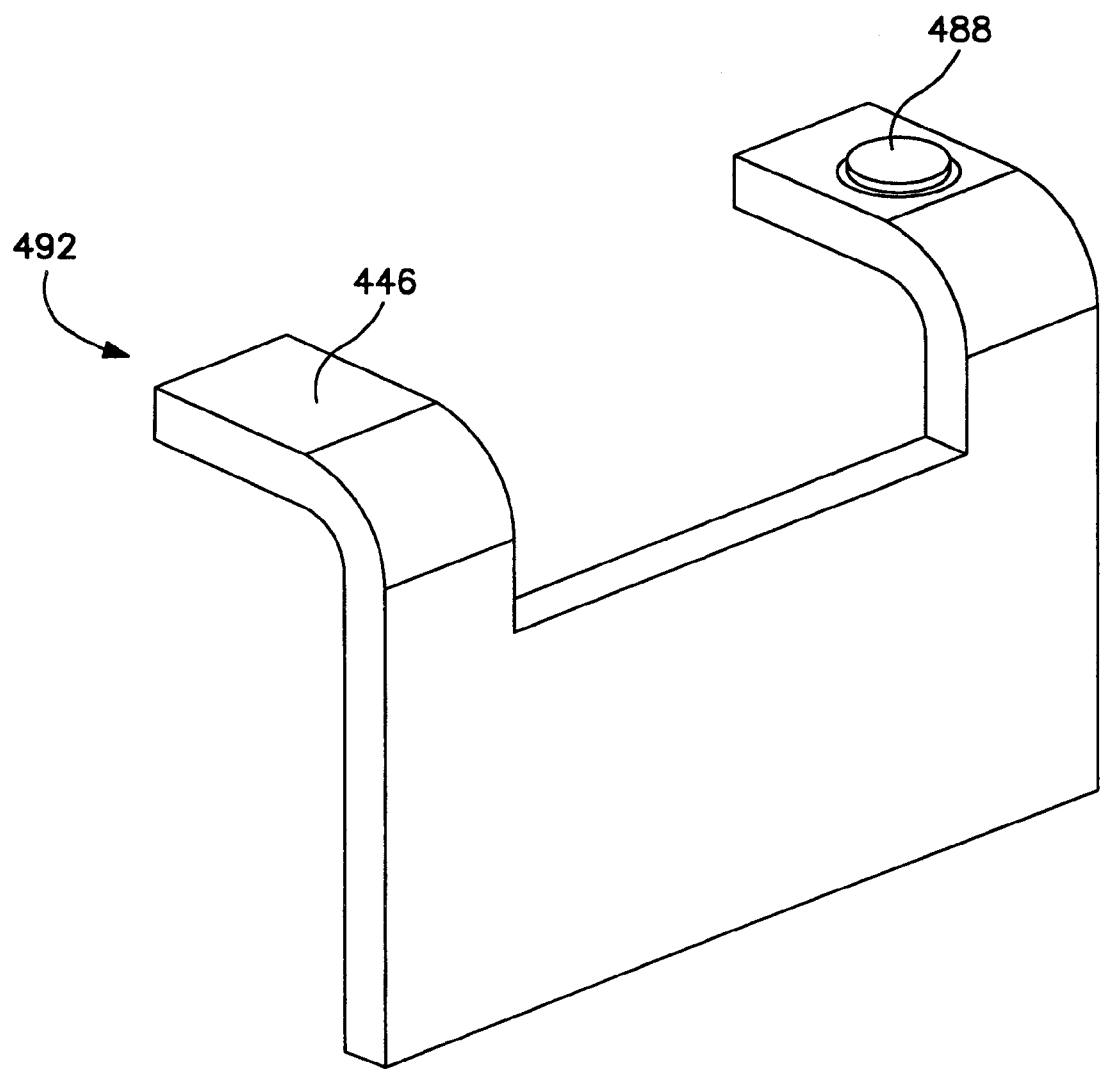
FIG. 89 is a perspective view of a flexible circuit capacitor according to one embodiment of the present invention.

Flexible circuit boards according to some embodiments of the present invention may be attached to jack contacts using more than one method of attachment. FIG. 89 is a perspective view of a flexible circuit capacitor 492 adapted for both welding and adhesive attachment to jack contacts. A rivet 488 is provided for attachment to one jack contact and an adhesive area 446 is provided for attachment to another jack contact.

Figure 90:
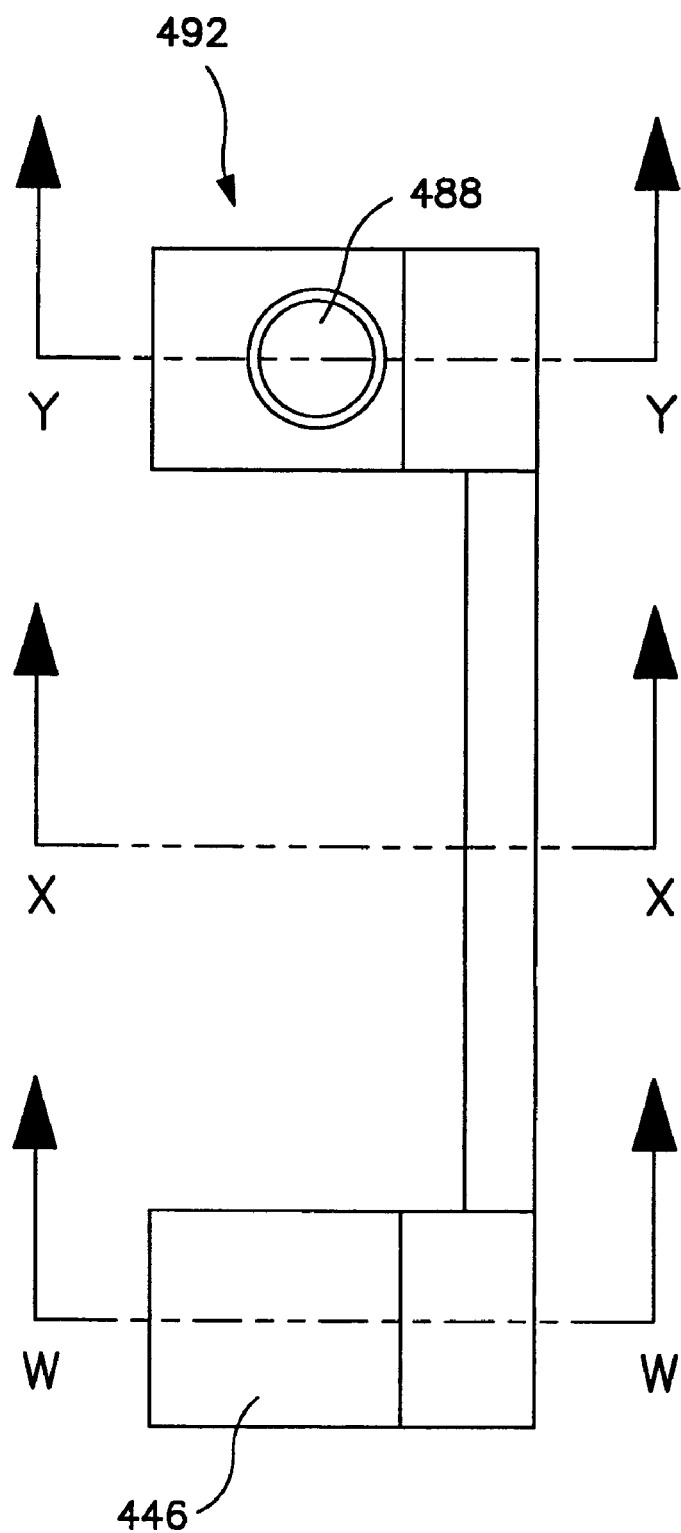
FIG. 90 is a top view of the flexible circuit capacitor of FIG. 89.
Figure 93:
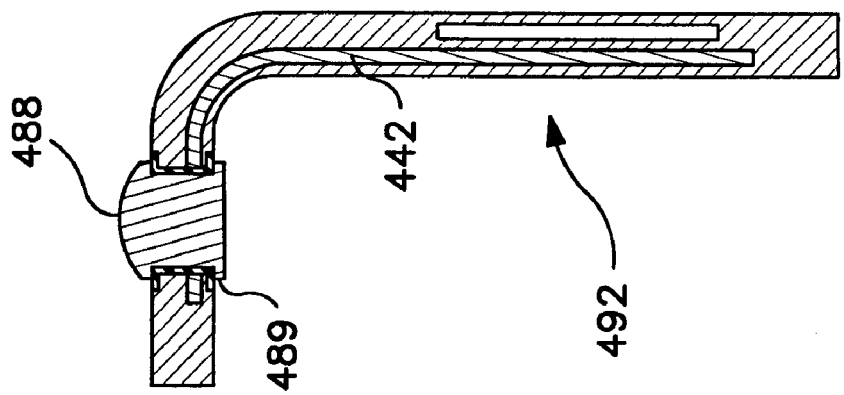
FIG. 93 is a sectional view taken along the line Y-Y of FIG. 90.
Figure 92:
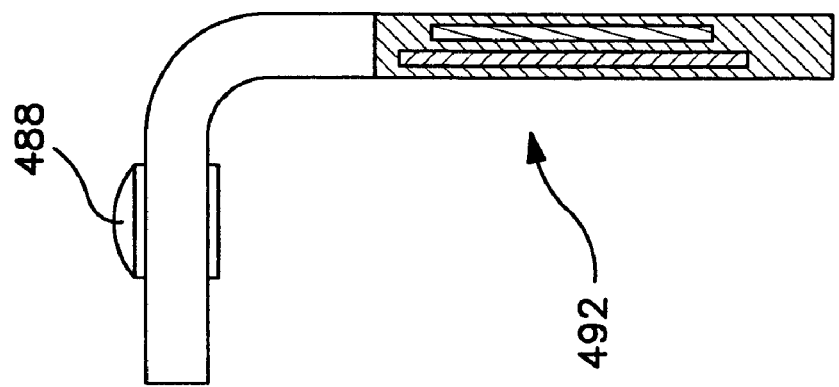
FIG. 92 is a sectional view taken along the line X-X of FIG. 90.
Figure 91:
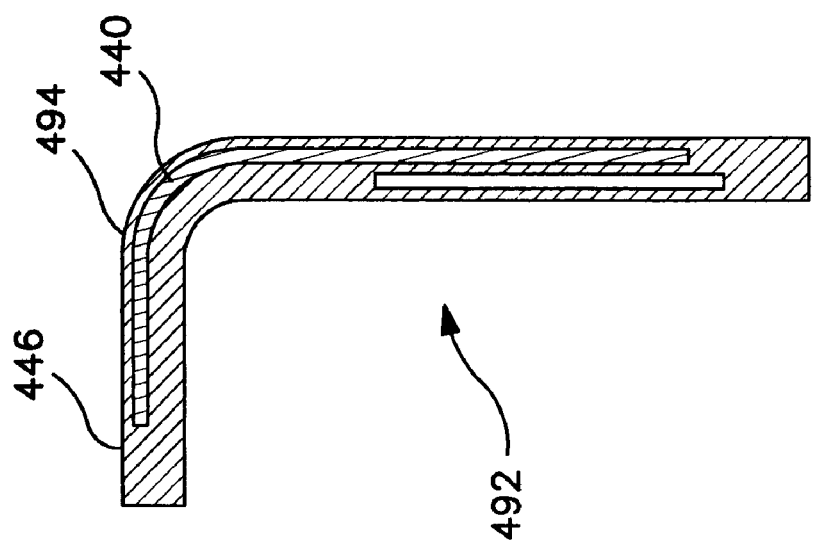
FIG. 91 is a sectional view taken along the line W-W of FIG. 90.

FIG. 90 is a top view of the flexible circuit capacitor 492, and FIGS. 91-93 are, respectively, cross-sectional views of the flexible circuit capacitor 492 taken along the lines W-W, X-X, and Y-Y of FIG. 90. A flexible dielectric material 494 overlays first and second conductive plates 440 and 442. The adhesive area 446 is shown in FIG. 91 and a rivet 488 extends through a plated through hole 489 as shown in FIG. 93. FIG. 94 is a side view showing the rivet 488 welded to a jack contact 408 and FIG. 95 is a side view of the adhesive area 446 bonded to a jack contact 408. As described above, capacitive coupling between the jack contact 408 and the flexible circuit capacitor 492 occurs at the adhesive bond area. Both the weld and the adhesive bond are placed directly beneath a plug/jack contact interface.

Figure 96:
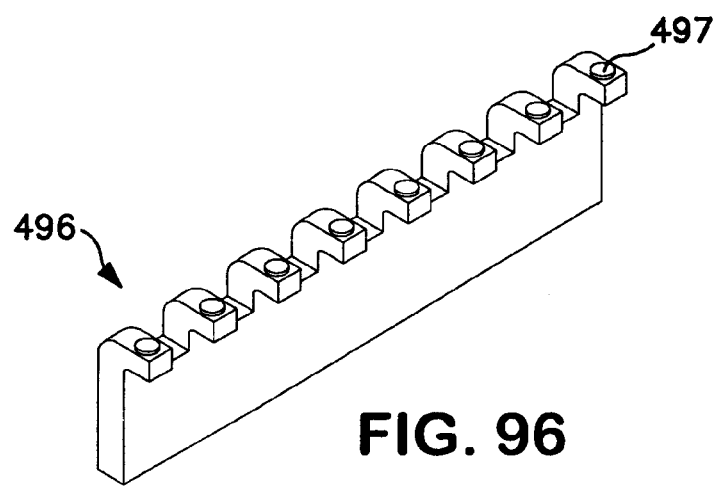
FIG. 96 is a perspective view of a NEXT compensation capacitor circuit according to one embodiment of the present invention.
Figure 103:
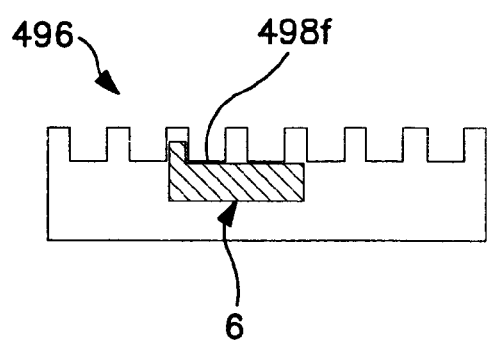
FIGS. 99-104 are plan views of the interior of the NEXT compensation capacitor circuit of FIG. 96 showing the shapes of conductive plates.
Figure 104:
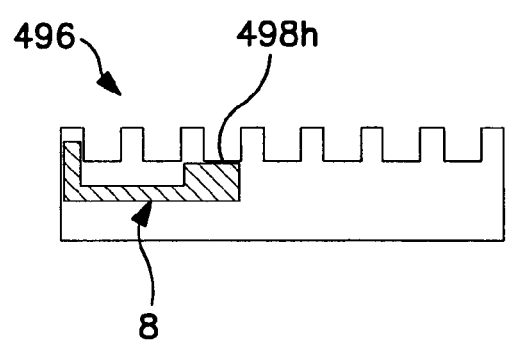
Figure 97:
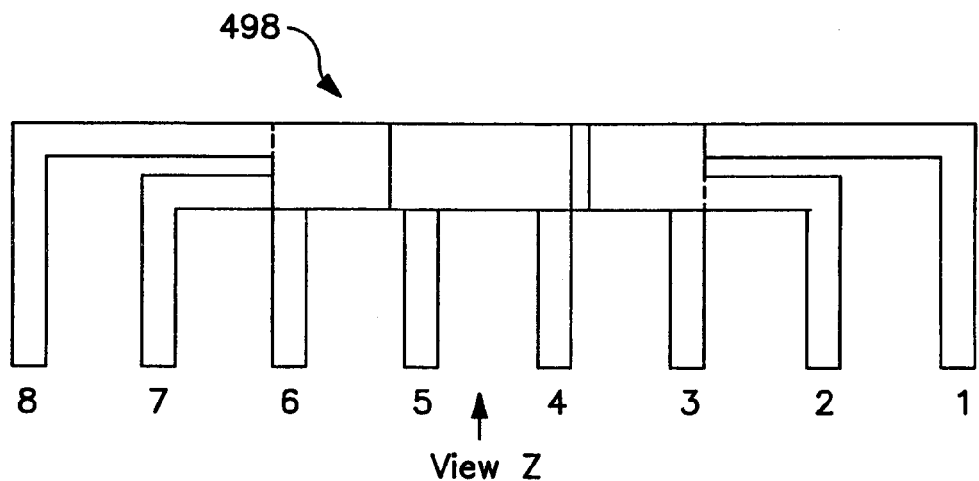
FIG. 97 is a plan view of conductive plates of the NEXT compensation capacitor circuit of FIG. 96.
Figure 98:
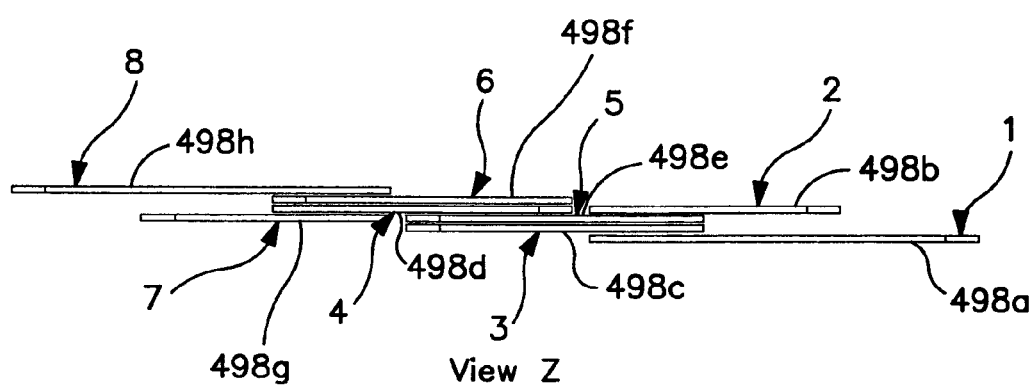
FIG. 98 is an end view along the view line "Z" of FIG. 97.
Figure 99:
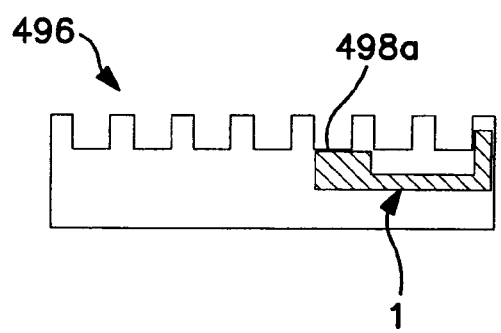
Figure 100:
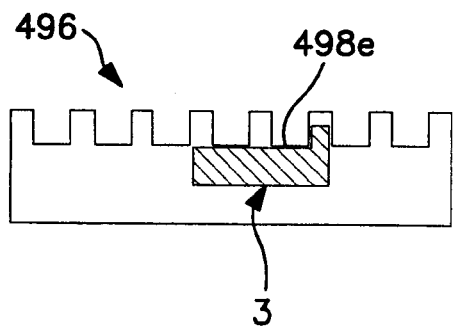
Figure 101:
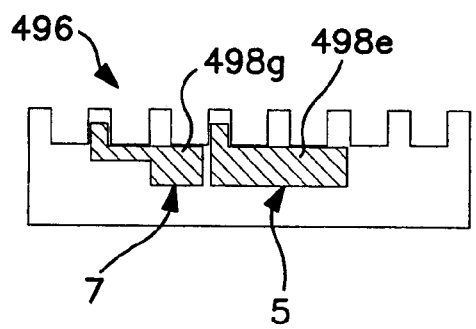
Figure 102:
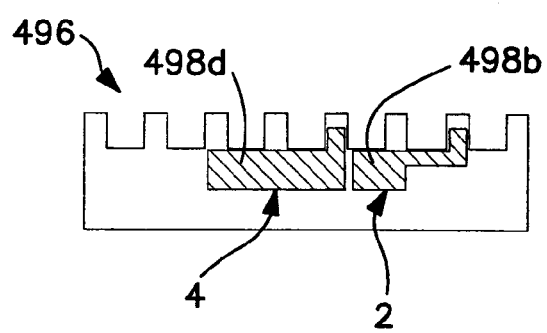

Turning now to FIGS. 96-104, a NEXT compensation capacitor circuit 496 for connection to all eight conductors of an eight-conductor jack is illustrated. The NEXT compensation capacitor circuit 496 is a flexible capacitor circuit. FIG. 96 is a perspective view of a NEXT compensation capacitor circuit 496. Rivets 497 are provided for welding to the bottoms of jack contacts at plug/jack contact interfaces. FIG. 97 is a plan view of conductive plates 498 associated with each of the eight contacts of a jack. The association between conductive plates 498a-498h with the respective first through eighth contacts is shown in FIG. 98, which is a side view along the view line Z of FIG. 97 showing the overlap of the conductive plates 498a-498h.

FIGS. 99-104 are plan views of the interior of the NEXT compensation capacitor circuit 496 showing the shapes of conductive plates 498a-498h. FIGS. 99-104 progress from FIG. 99 which shows the lowermost conductive plate 498a of FIG. 98 (associated with a first jack contact) to FIG. 104 which shows the uppermost conductive plate 498h of FIG. 98 (associated with an eighth jack contact).

Figure 105:
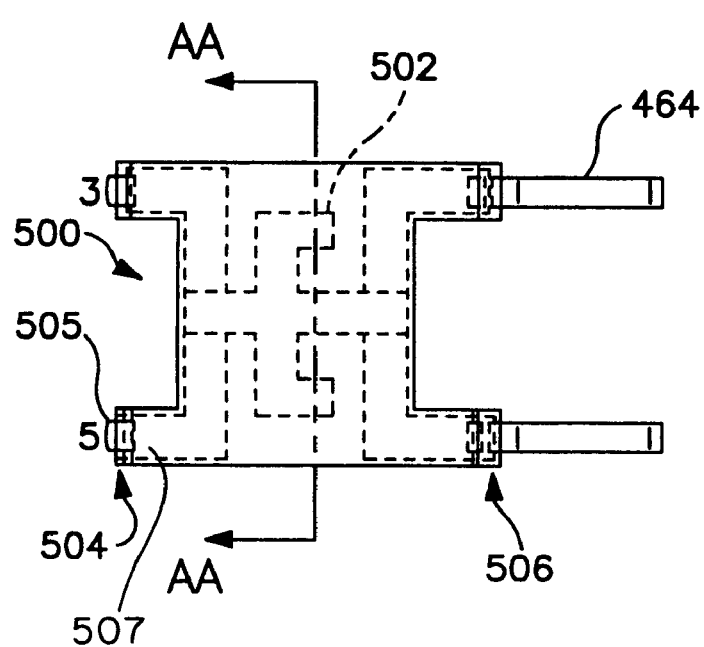
FIG. 105 is a plan view of a flexible printed circuit according to one embodiment of the present invention.
Figure 106:
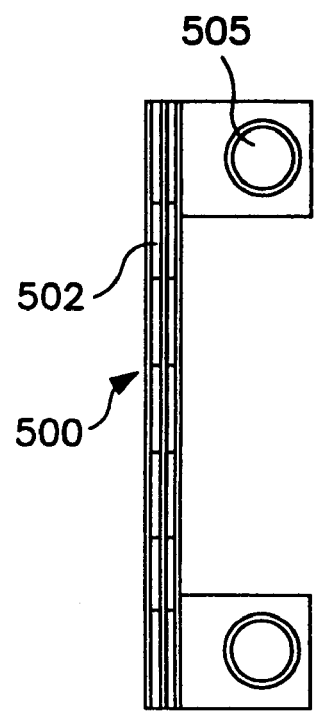
FIG. 106 is a sectional view taken along the line AA-AA of FIG. 105.

FIGS. 105-109 illustrate another flexible printed circuit 500 with capacitive and inductive NEXT compensation for attachment to contacts of a jack. FIG. 105 is a plan view of the flexible printed circuit 500 with dotted lines showing conductive pathways 502. A first end 504 of the flexible printed circuit 500 is attached to jack contacts via weld/solder pads 505 provided on flexible members 507 and a second end 506 is attached to a printed circuit board via PCB-compliant pins 464. The flexible printed circuit 500 is adapted for use with third and fifth contacts of an eight-contact jack; an identical flexible printed circuit 500 can also be used with fourth and sixth contacts.

FIGS. 107-109 show successive layers of the flexible printed circuit 500. FIG. 107 shows a first dielectric layer 508a and a first conductive pathway 502a associated with a third jack contact. FIG. 108 shows a second dielectric layer 508b and a second conductive pathway 502b associated with a fifth jack contact. FIG. 109 shows a third dielectric layer 508c. The dielectric layers 508a-c may be comprised of KAPTON®.

Figure 110:
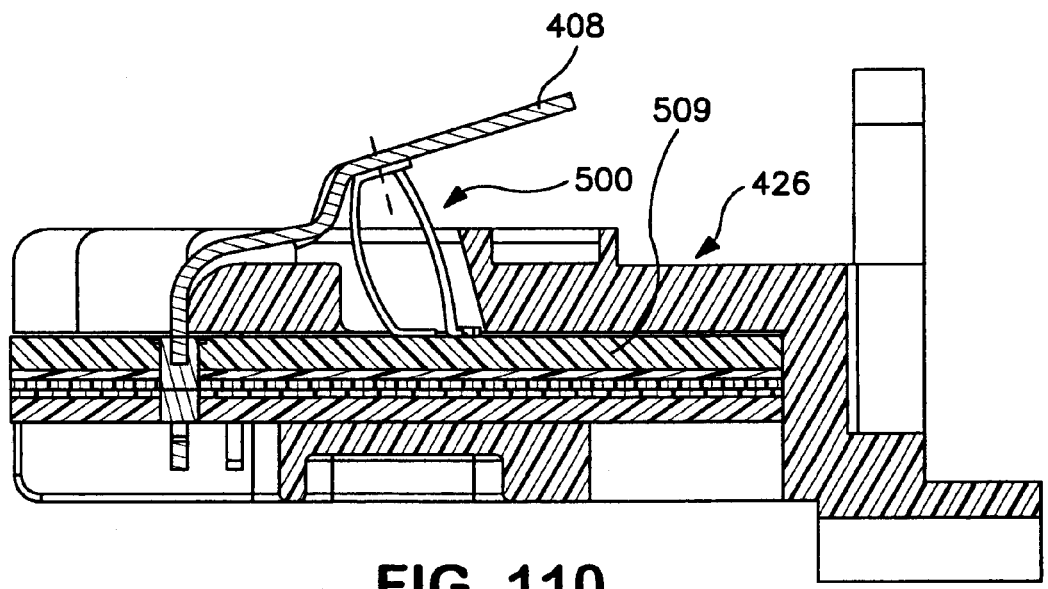
FIG. 110 is a side cutaway view showing flexible printed circuits of FIG. 105 installed within a jack with jack contacts in an unmated position.
Figure 111:
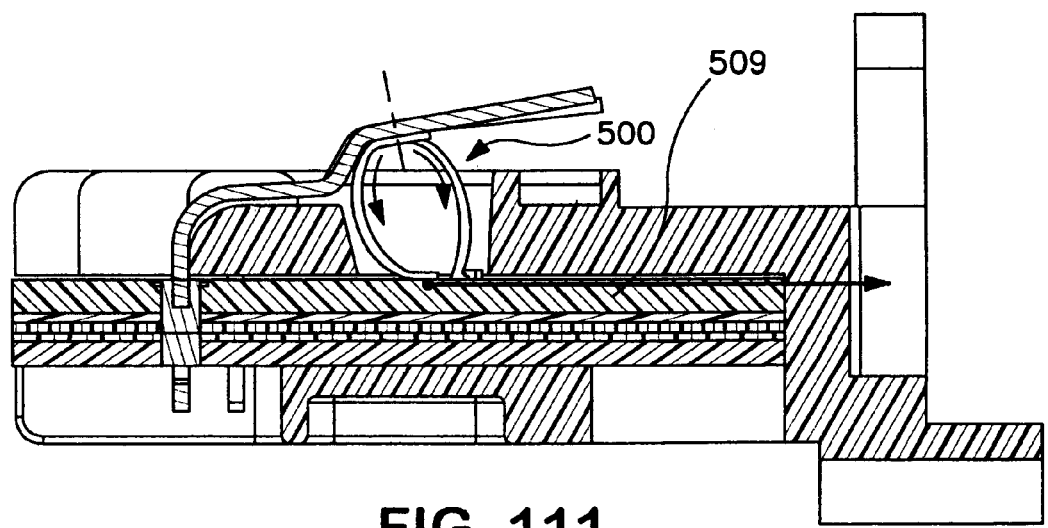
FIG. 111 is a side cutaway view showing flexible printed circuits of FIG. 105 installed within a jack with jack contacts in a mated position.

FIGS. 110 and 111 show flexible printed circuits 500 installed within a jack. Jack contacts 408 are mounted within a sled 426 and the flexible printed circuits 500 are welded to the jack contacts 408 beneath a plug/jack contact interface. The flexible printed circuits 500 are soldered to a PCB 509. FIG. 110 shows the jack contacts 408 in a position in which they are not mated to a plug and FIG. 111 shows the jack contacts 408 in a position in which they are mated to a plug. The flexible printed circuits 500 flex as the jack contacts 408 move between the two positions. The arrows of FIG. 111 show a current path through the jack including the paths through the flexible printed circuits 500.

Figure 112:
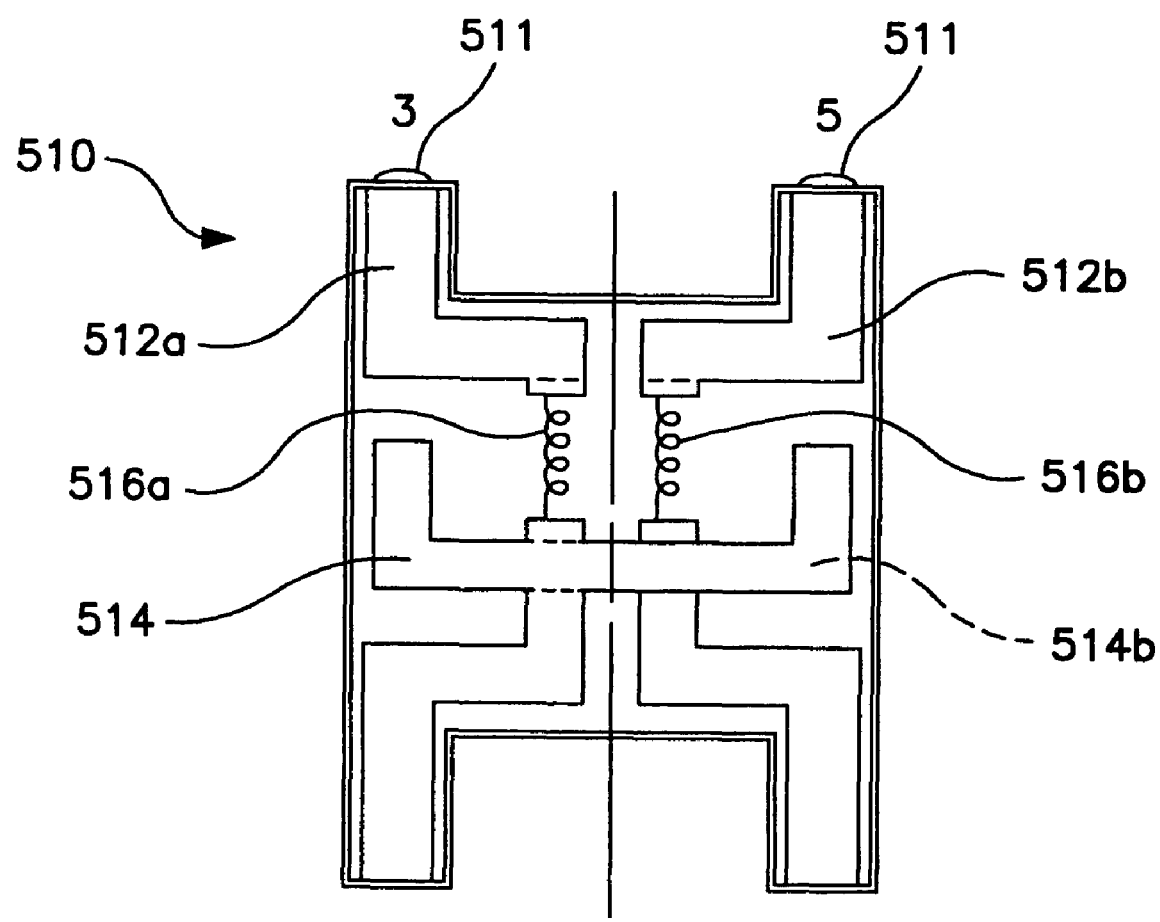
FIG. 112 is a plan view of a flexible printed circuit according to another embodiment of the present invention.

FIG. 112 is a plan view of another flexible printed circuit 510 for providing capacitive and inductive NEXT compensation. Rivets 511 are provided for attachment to jack contacts. The flexible printed circuit 510 of FIG. 112 is adapted for attachment to third and fifth jack contacts, but a substantially identical flexible printed circuit can be used for attachment to fourth and sixth jack contacts of an eight-contact jack. Conductive pathways 512a and 512b are provided within the flexible printed circuit 510, and capacitor plates 514a and 514b are attached to each of the conductive pathways 512a and 512b. The vertical runs of the conductive pathways 512a and 512b are parallel but not collinear. Inductive segments 516a and 516b make up a portion of the vertical runs. The inductive segments 516a and 516b are adjacent current carrying conductors and/or transformers providing inductive compensation coupling.

Figure 113:
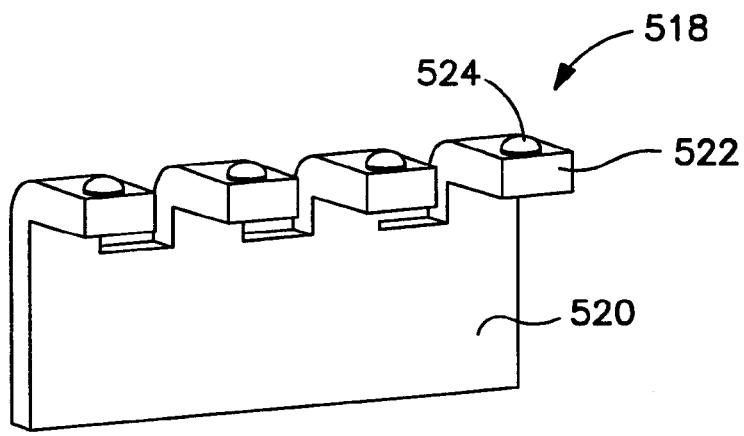
FIG. 113 is a perspective view of a flexible PCB according to one embodiment of the present invention.
Figure 114:
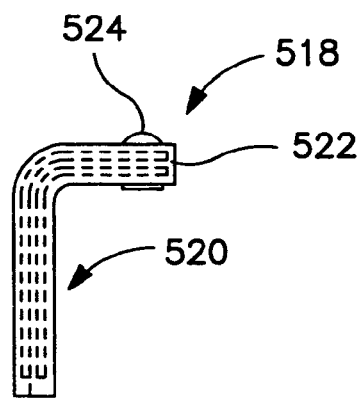
FIG. 114 is a side view of the flexible PCB of FIG. 113.
Figure 115:
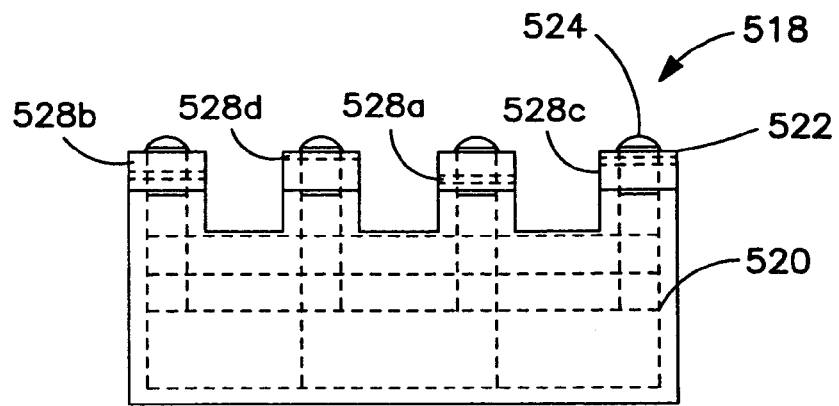
FIG. 115 is a front view of the flexible PCB of FIG. 113.

FIG. 113 is an upper right-side perspective view, FIG. 114 is a side view, and FIG. 115 is a front elevational view of one embodiment of a flexible PCB 518 that may be utilized in accordance with the present invention to provide crosstalk compensation. The PCB 518 includes a main portion 520 and attachment fingers, such as the finger 522. The main portion 520 supports a plurality of capacitive plates (in this case, four plates, corresponding to plug interface contacts 3-6) to provide capacitive coupling. As will be illustrated in FIGS. 116-121, the leads to the capacitive plates provide an inductive coupling component as well. The fingers 522 serve as an attachment mechanism for attaching the PCB 518 to the plug interface contacts. While any suitable attachment technique may be used, in the illustrated embodiment, a resistance weld rivet 524 is used. In addition to attaching the PCB 518 to the plug interface contacts (or another conductor connected to the plug interface contacts), the rivet 524 acts as a contact post for the capacitive plates and their leads. This is illustrated in FIGS. 114-121, which show four layers of capacitive plates 526 and leads (528a-d), through which the rivet 524 protrudes to make appropriate contact in the fingers 522.

Figure 116:
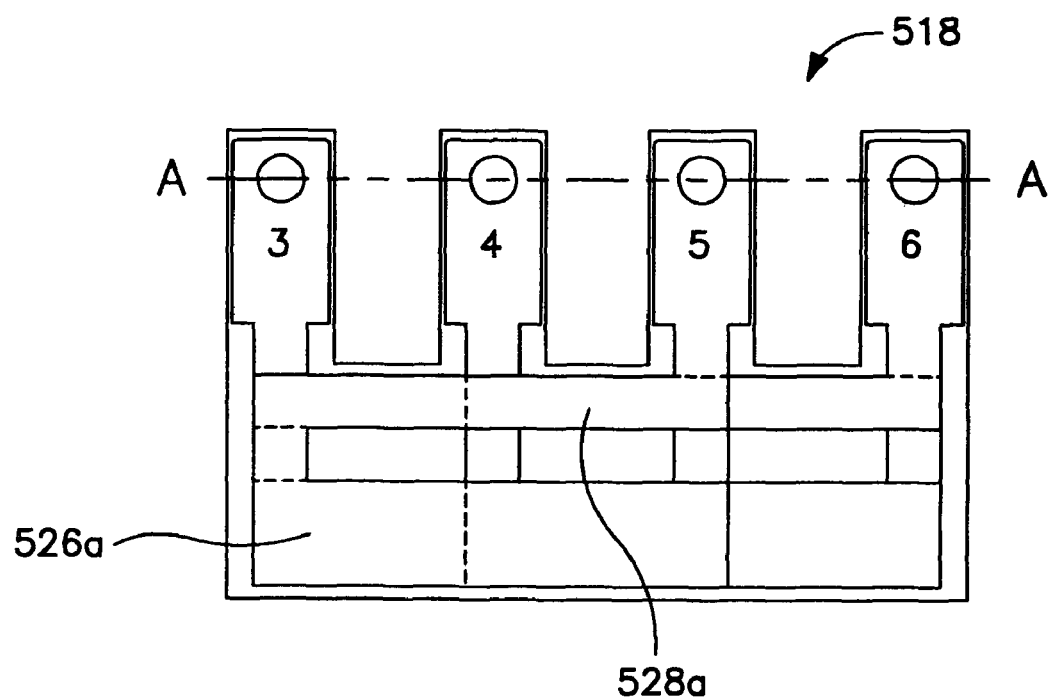
FIG. 116 is another front view of the flexible PCB of FIG. 113 showing conductive pathways.
Figure 117:
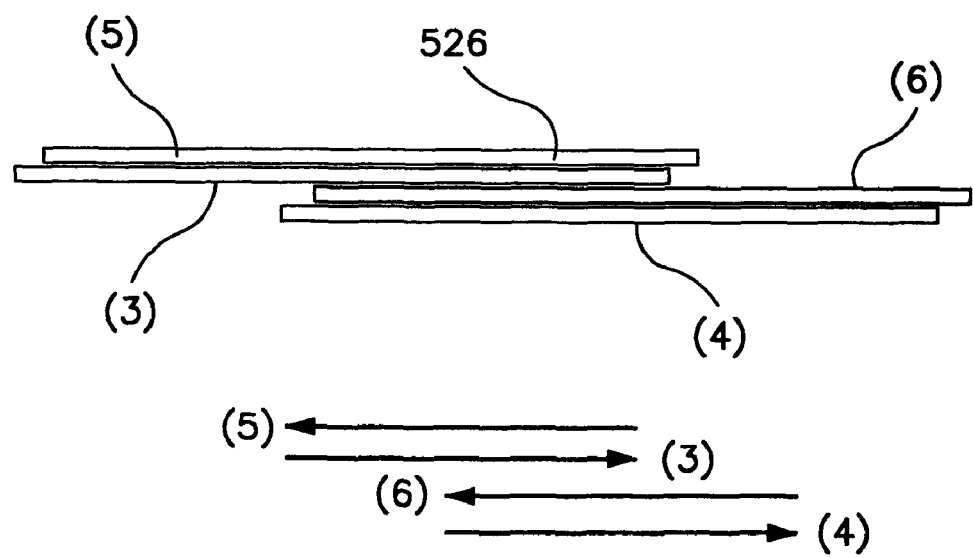
FIG. 117 is an end view toward the line A/A of FIG. 116.
Figure 118:
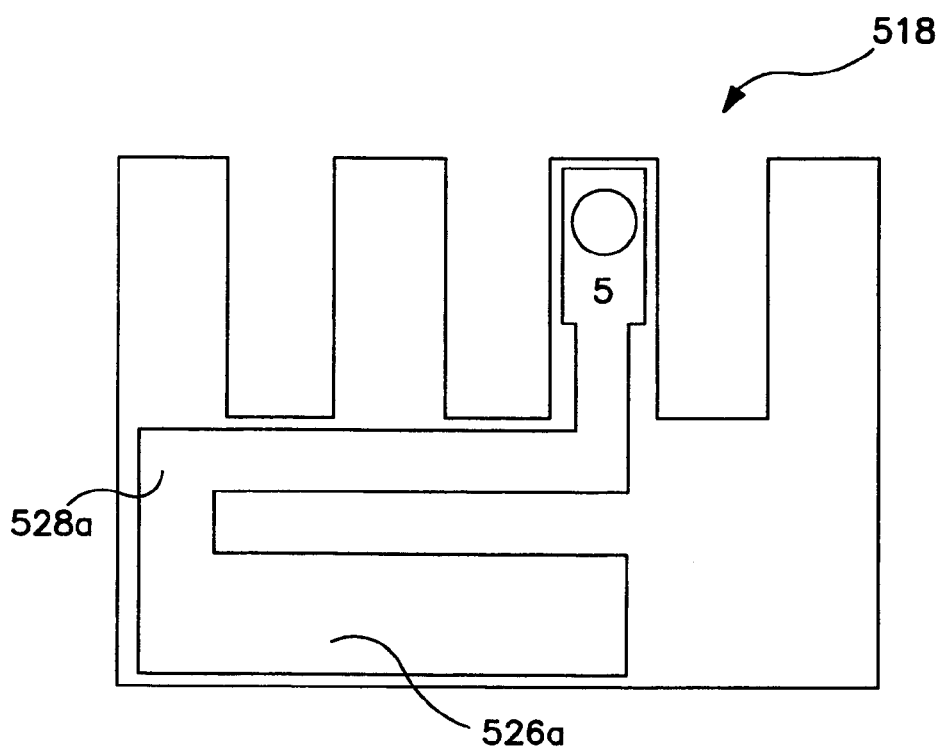
FIGS. 118-121 are front views of the flexible PCB of FIG. 113 showing, respectively, capacitive plates associated with fifth, third, sixth, and fourth conductors of an eight-conductor jack.
Figure 119:
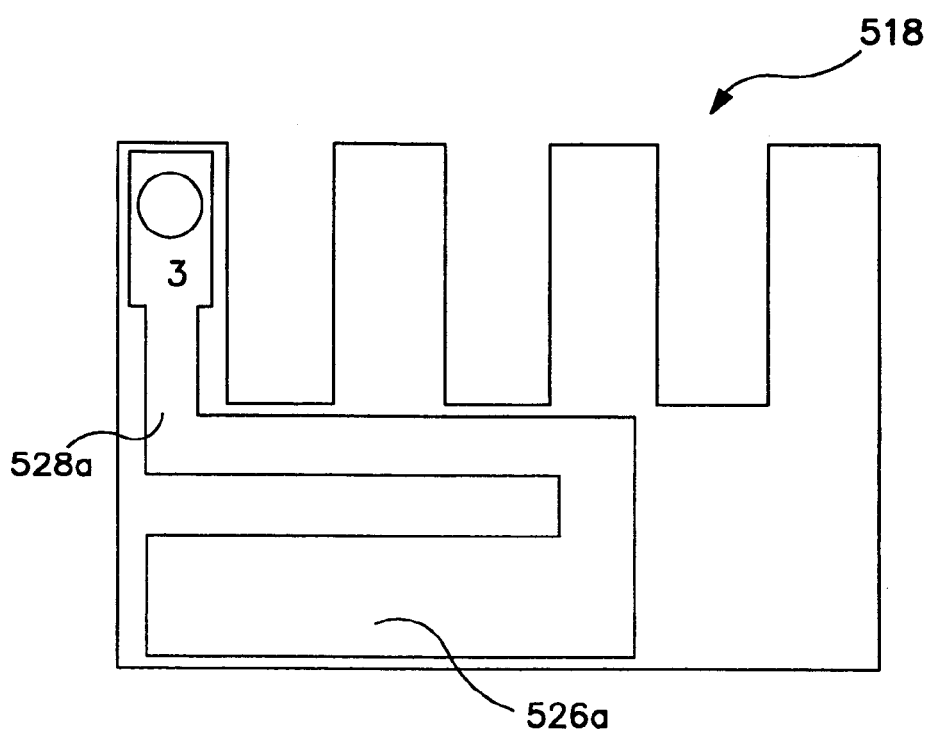
Figure 120:
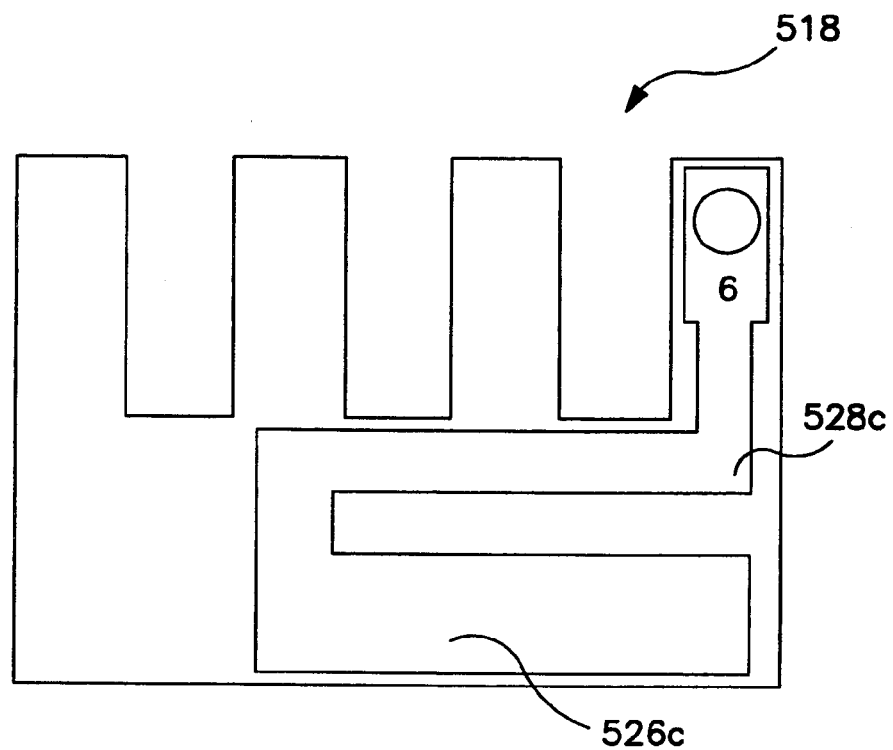

FIG. 116 is a front elevational view of the PCB 518 with the fingers in an unbent configuration, for ease of illustration. FIG. 117 is a cross-sectional view of the capacitive plates and leads as viewed upward from the bottom of the PCB 518 toward line A/A in FIG. 116. Note that FIG. 114 does not show portions of the PCB 518 that merely support the capacitive plates and leads or serve as a dielectric or insulator. FIGS. 116-121 show how the capacitive plates and leads are placed with respect to one another to result in a relatively high density of inductive coupling in a relatively short distance. For example, in FIG. 116, the capacitive plate 526a and lead 528a for conductor 5 is the topmost plate and lead shown, having a sideways "U" shape. The same "U" shape, but with varying orientation, is used for conductors 3, 4, and 6, as shown by the dashed and solid lines of FIG. 116. The physical placement and overlapping area of the capacitive plates determines the amount of capacitive coupling. Similarly, the separation of the leads from one another and the length of overlap determine the amount of inductive coupling. FIG. 117 also illustrates the relative direction of current flow due to inductive couplings in the respective leads, which provides a high density of inductive coupling. FIGS. 118-121 show, respectively, leads 528a-d and capacitive plates 526a-d associated with, respectively, fifth, third, sixth, and fourth conductors of an eight-conductor jack.

While the particular preferred embodiments of the present invention have been shown and described, it will be obvious to those skilled in the art that changes and modifications may be made without departing from the teachings of our invention. The matter set forth in the foregoing description and accompanying drawings is offered by way of illustration only and not as a limitation. The actual scope of the invention is intended to be defined in the following claims when viewed in their proper perspective based on the prior art.

What is claimed is:

1. A communication jack with circuitry for compensating for crosstalk comprising:
   a NEXT compensation zone;
   a NEXT crosstalk zone; and
   a symmetrical FEXT zone, wherein the symmetrical FEXT zone comprises primarily distributed inductive coupling and primarily distributed capacitive coupling, wherein the distributed capacitive coupling comprises partially overlapping traces widened to approximate distributed parallel plates.

2. The communication jack of claim 1 wherein the compensation zone comprises remote capacitive coupling attached to a plurality of contacts at a surface opposite of a jack/plug interface.

3. The communication jack of claim 2 wherein the crosstalk zone comprises remote capacitive coupling.

4. The communication jack of claim 1 wherein the distributed capacitive coupling is equal in magnitude and opposite in polarity to the distributed inductive coupling.

5. The communication jack of claim 4 wherein the phase angle displacement from a plug/jack interface to an effective center of the distributed inductive coupling is equal to the phase angle displacement from a plug/jack interface to an effective center of the distributed capacitive coupling.

* * * * *